United States Patent
Ueki et al.

(10) Patent No.: US 10,217,800 B2
(45) Date of Patent: Feb. 26, 2019

(54) RESISTANCE CHANGE MEMORY DEVICE

(71) Applicant: RENESAS ELECTRONICS CORPORATION, Tokyo (JP)

(72) Inventors: Makoto Ueki, Tokyo (JP); Takashi Hase, Tokyo (JP)

(73) Assignee: Renesas Electronics Corporation, Tokyo (JP)

(*) Notice: Subject to any disclaimer, the term of this patent is extended or adjusted under 35 U.S.C. 154(b) by 0 days.

(21) Appl. No.: 15/697,203

(22) Filed: Sep. 6, 2017

(65) Prior Publication Data

US 2018/0069051 A1  Mar. 8, 2018

(30) Foreign Application Priority Data

Sep. 7, 2016  (JP) .................................. 2016-174774

(51) Int. Cl.
*H01L 27/24* (2006.01)
*H01L 27/10* (2006.01)
(Continued)

(52) U.S. Cl.
CPC .......... *H01L 27/249* (2013.01); *H01L 27/101* (2013.01); *H01L 27/2436* (2013.01);
(Continued)

(58) Field of Classification Search
CPC . H01L 27/249; H01L 27/2436; H01L 27/101; H01L 45/1266; H01L 45/08;
(Continued)

(56) References Cited

U.S. PATENT DOCUMENTS

| 8,258,038 B2 | 9/2012 | Nozawa |
| 2011/0175048 A1* | 7/2011 | Sekine ................ H01L 27/2409 257/2 |
| 2012/0256152 A1 | 10/2012 | Kakegawa |

FOREIGN PATENT DOCUMENTS

| JP | 2012-222114 A | 11/2012 |
| WO | 2011/016196 A1 | 2/2011 |

OTHER PUBLICATIONS

Hong Sik Yoon et al., "Vertical Cross-point Resistance Change Memory for Ultra-High Density Non-volatile Memory Applications," 2009 Symposium on VLSI Technology Digest of Technical Papers, pp. 26-27 (2009).

* cited by examiner

*Primary Examiner* — Lex H Malsawma
*Assistant Examiner* — Gardner W. S. Swan
(74) *Attorney, Agent, or Firm* — McDermott Will & Emery LLP

(57) ABSTRACT

A resistance change element includes first and second electrodes spaced apart from each other, a metal material layer adjacent to the first electrode, an oxide layer adjacent to each of the metal material layer and the first electrode, and a resistance change layer disposed continuously between the second and first electrodes and between the second electrode and the oxide layer. The resistance change layer is made of a metal oxide. The metal material layer is made of a metal or a metal compound. The oxide layer is made of an oxide of the material forming the metal material layer. The first electrode is made of ruthenium, ruthenium oxide, iridium, iridium oxide, platinum, gold, or copper. A free energy of oxide formation of the oxide forming the oxide layer is higher than a free energy of oxide formation of the oxide forming the resistance change layer.

7 Claims, 27 Drawing Sheets

(51) Int. Cl.
*H01L 43/12* (2006.01)
*H01L 45/00* (2006.01)
(52) U.S. Cl.
CPC .............. *H01L 43/12* (2013.01); *H01L 45/08* (2013.01); *H01L 45/1266* (2013.01); *H01L 45/1273* (2013.01); *H01L 45/146* (2013.01); *H01L 45/1633* (2013.01)
(58) Field of Classification Search
CPC .............. H01L 45/1633; H01L 45/146; H01L 45/1273; H01L 43/12
See application file for complete search history.

RESISTANCE CHANGE MEMORY DEVICE

CROSS-REFERENCE TO RELATED APPLICATIONS

The disclosure of Japanese Patent Application No. 2016-174774 filed on Sep. 7, 2016 including the specification, drawings and abstract is incorporated herein by reference in its entirety.

BACKGROUND

The present invention relates to a semiconductor device and a manufacturing method thereof and can be used appropriately as, e.g., a semiconductor device including a resistance random access memory and a manufacturing method thereof.

A resistance random access memory (ReRAM) is a type of a nonvolatile memory element. For example, each of Japanese Unexamined Patent Publication No. 2012-222114 (Patent Document 1) and International Publication NO. WO 2011/016196 (Patent Document 2) describes a technique related to a semiconductor device having a ReRAM. Also, Non-Patent Document 1 describes a ReRAM having a three-dimensional structure.

RELATED ART DOCUMENTS

Patent Documents

[Patent Document 1] Japanese Unexamined Patent Publication No. 2012-222114
[Patent Document 2] International Publication No. WO 2011/016196

Non-Patent Document

[Non-Patent Document 1] Hong Sik Yoon, et al., "Vertical Cross-point Resistance Change Memory for Ultra-High Density Nonvolatile Memory Applications", 2009 Symposium on VLSI Technology Digest of Technical Papers, pp. 26-27 (2009)

SUMMARY

It is desired to improve the reliability of a semiconductor device including a resistance random access memory.

Other problems and novel features of the present invention will become apparent from a statement in the present specification and the accompanying drawings.

According to an embodiment, a semiconductor device includes first and second electrodes spaced apart from each other, a metal material layer adjacent to the first electrode, an oxide layer adjacent to each of the metal material layer and the first electrode, and a resistance change layer disposed continuously between the second and first electrodes and between the second electrode and the oxide layer. The resistance change layer is made of a metal oxide. The metal material layer is made of a metal or a metal compound. The oxide layer is made of an oxide of the material forming the metal material layer. The first electrode is made of ruthenium, ruthenium oxide, iridium, iridium oxide, platinum, gold, or copper. A free energy of oxide formation of the oxide forming the oxide layer is higher than a free energy of oxide formation of the oxide forming the resistance change layer.

According to another embodiment, a semiconductor device includes first and second electrodes spaced apart from each other, a metal material layer adjacent to the first electrode, an oxide layer adjacent to each of the metal material layer and the first electrode, and a resistance change layer disposed continuously between the second and first electrodes and between the second electrode and the oxide layer. The resistance change layer is made of a metal oxide. The metal material layer is made of a metal or a metal compound. The oxide layer is made of an oxide of the material forming the metal material layer. The first electrode is made of titanium nitride, tantalum nitride, tungsten, or a compound thereof. A free energy of oxide formation of the oxide forming the oxide layer is lower than a free energy of oxide formation of the oxide forming the resistance change layer.

According to the embodiment, a manufacturing process of the semiconductor device includes the steps of forming a multi-layer body including a metal material layer and a first electrode layer over the metal material layer, oxidizing a side surface of the metal material layer, which is included in a side surface of the multi-layer body, to form an oxide layer, and then forming a second electrode layer opposed to the side surface of the multi-layer body via a resistance change layer. The first electrode layer functions as one of electrodes of a resistance change element. The second electrode layer functions as the other electrode of the resistance change element. Between the second and first electrode layers and between the second electrode layer and the oxide layer, the resistance change layer is interposed. The resistance change layer is made of a metal oxide. The metal material layer is made of a metal or a metal compound. The oxide layer is made of an oxide of the material forming the metal material layer. The first electrode layer is made of ruthenium, ruthenium oxide, iridium, iridium oxide, platinum, gold, or copper. A free energy of oxide formation of the oxide forming the oxide layer is higher than a free energy of oxide formation of the oxide forming the resistance change layer.

According to the embodiment, it is possible to improve the reliability of the semiconductor device.

DETAILED DESCRIPTION

Figure 1:
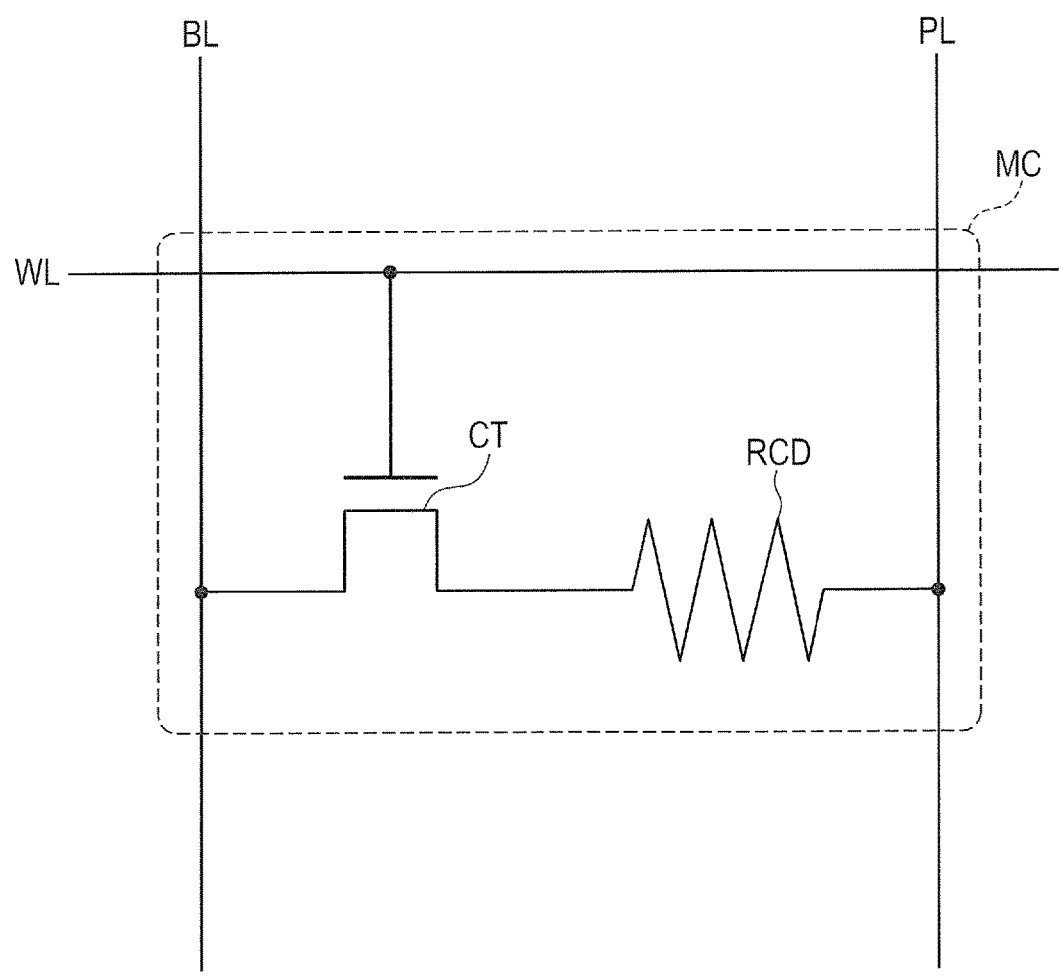
FIG. 1 is a circuit diagram showing a circuit configuration of a memory cell included in a resistance random access memory.

In the following embodiments, if necessary for the sake of convenience, each of the embodiments will be described by being divided into a plurality of sections or embodiments. However, they are by no means irrelevant to each other unless particularly explicitly described otherwise, but are in relations such that one of the sections or embodiments is a modification, details, supplementary explanation, and so forth of part or the whole of the others. Also, in the following embodiments, when the number and the like (including the number, numerical value, amount, range, and the like) of elements are referred to, they are not limited to specific numbers unless particularly explicitly described otherwise or unless they are obviously limited to specific numbers in principle. The number and the like of the elements may be not less than or not more than specific numbers. Also, in each of the following embodiments, it goes without saying that the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in each of the following embodiments, the shapes and the like are assumed to include those substantially proximate or similar thereto and the like unless particularly explicitly described otherwise or unless it can be considered that they obviously do not in principle. The same shall apply in regard to the foregoing numerical value and range.

The following will describe the embodiments in detail on the basis of the drawings. Note that, throughout all the drawings for illustrating the embodiments, members having the same functions are designated by the same reference numerals, and a repeated description thereof is omitted. In the following embodiments, a description of the same or like parts will not be repeated in principle unless particularly necessary.

In the drawings used in the embodiments, hatching may be omitted even in a cross section for improved clarity of illustration, while even a plan view may be hatched for improved clarity of illustration.

Embodiment 1

<Configuration of Memory Cell>

FIG. 1 is a circuit diagram showing a circuit configuration of a memory cell MC included in a resistance random access memory (ReRAM). As shown in FIG. 1, the memory cell MC has a cell transistor CT which functions as a selection portion (selection transistor) for selecting the memory cell MC and a resistance change element RCD which functions as a storage portion for storing information. The cell transistor CT and the resistance change element RCD are coupled in series to each other. The gate electrode of the cell transistor CT is electrically coupled to a word line WL. The cell transistor is electrically coupled to a bit line BL, while the resistance change element RCD is electrically coupled to a plate line PL. At each point of intersection of the bit line BL and the word line WL, the memory cell MC is disposed. By arranging a plurality of the memory cells MC in the form of an array, a memory cell array is formed.

<Basic Operation of Memory Cell>

Next, a description will be given of the operation of the memory cell. In the resistance random access memory, information is stored on the basis of the resistance state of the resistance change element (RCD or RCD101). Specifically, the resistance change element (RCD or RCD101) has a high-resistance state and a low-resistance state. For example, by associating the high-resistance state with "0" and associating the low-resistance state with "1", it is possible to allow the resistance change element (RCD or RCD101) to store information.

Figure 2:
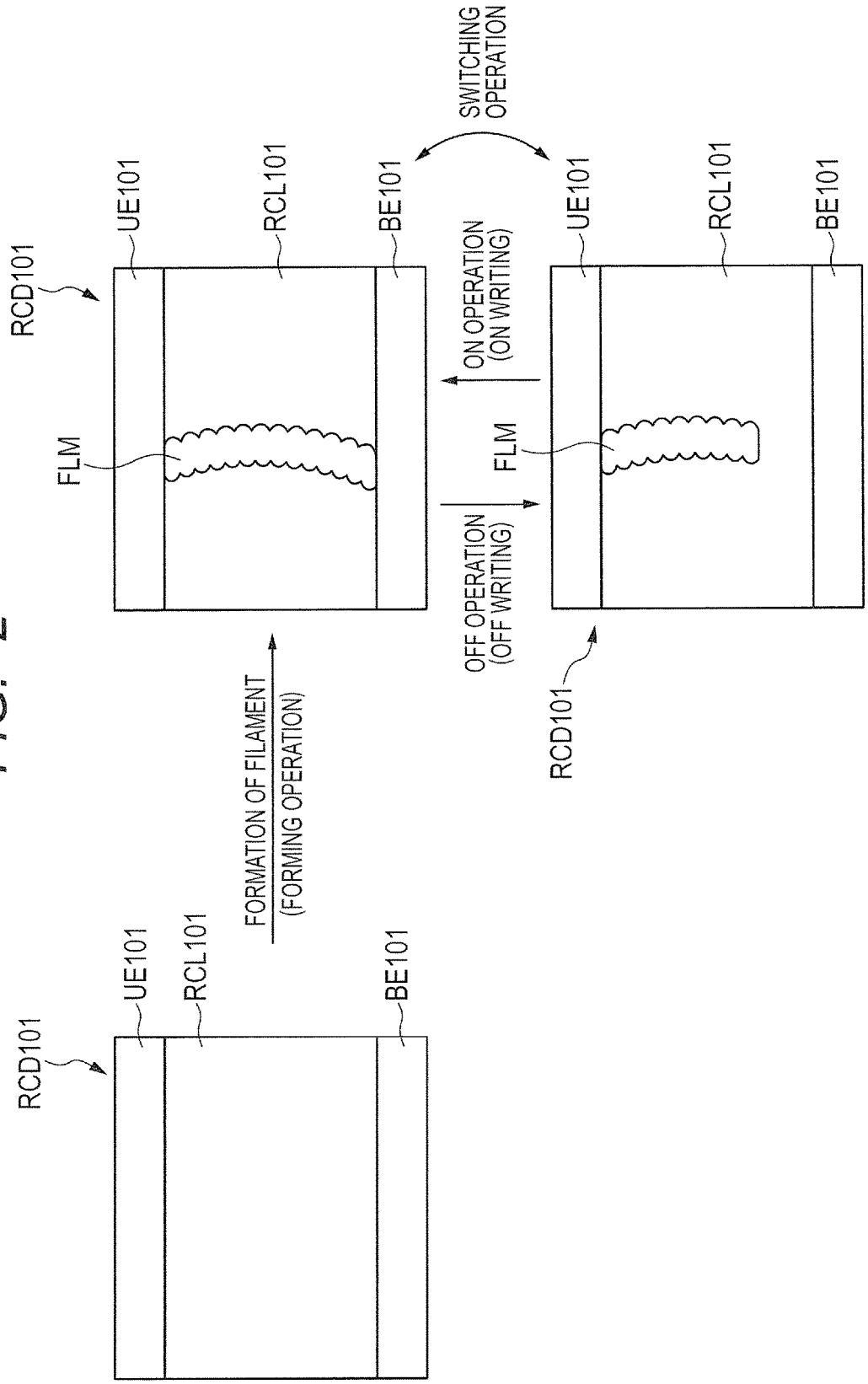
FIG. 2 is a cross-sectional view showing a resistance change element in a studied example.

Referring to FIG. 2, a description will be given of a mechanism which implements the high-resistance state and the low-resistance state in the resistance change element (RCD or RCD101). FIG. 2 is a cross-sectional view showing the resistance change element RCD101 in a studied example studied by the present inventors.

In FIG. 2, the resistance change element RCD101 has an electrode (upper electrode) UE101, an electrode (lower electrode) BE101, and a resistance change layer RCL101 and has a structure in which the resistance change layer RCL101 is interposed between the electrodes UE101 and BE101. The initial state of the resistance change element RCD101 is an initial resistance state as an insulated state which is neither the high-resistance state nor the low-resistance state. The resistance value of the resistance change element RCD101 in the initial resistance state is extremely high and higher than the resistance value thereof in the high-resistance state. Accordingly, it is necessary to first perform an operation of reducing the resistance value of the resistance change element RCD101 in the initial resistance state. To implement this operation, a forming operation is performed as an initializing operation.

Specifically, in FIG. 2, a high voltage is applied between the electrodes UE101 and BE101 to form a conductive path FLM101 made of a chain of oxygen defects in the resistance change layer RCL101 made of the metal oxide layer. For the voltage applied at this time, the electrode UE101 corresponds to a higher-voltage side and the electrode BE101 corresponds to a lower-voltage side. The conductive path FLM101 is referred to as a filament. As a result, in the resistance change layer RCL101, a current is allowed to flow via the conductive path FLM101 to establish the low-resistance state. That is, by performing the forming operation, the resistance change element RCD101 shifts from the initial resistance state to the low-resistance state. Thus, the initial resistance state of the resistance change element RCD101 is defined as a state where the conductive path FLM101 is not formed in the resistance change layer RCL101. On the other hand, the low-resistance state of the resistance change element RCD101 is defined as a state where the conductive path FLM101 connecting the electrodes UE101 and BE101 is formed in the resistance change layer RCL101.

Then, between the electrodes UE101 and BE101, a voltage having a polarity opposite to that of the voltage applied during the forming operation is applied. For the voltage applied at this time, the electrode BE101 corresponds to the higher-voltage side and the electrode UE101 corresponds to the lower-voltage side. That is, a voltage (positive voltage) higher than that in the electrode UE101 is applied to the electrode BE101. In this case, as shown in FIG. 2, in the metal oxide layer forming the resistance change layer RCL101, oxygen fills a part of the conductive path FLM101 made of a chain of oxygen defects. This means that a part of the conductive path FLM101 made of a chain of oxygen defects disappears, which increases the resistance value of the resistance change layer RCL101. The resulting state corresponds to the high-resistance state of the resistance change element RCD101. That is, the high-resistance state of the resistance change element RCD101 can be defined as a state where the conductive path FLM101 is basically formed in the resistance change layer RCL101, but a part of the conductive path FLM101 has disappeared. The state where a part of the conductive path FLM101 has disappeared can also be regarded as a state where the conductive path FLM101 is disconnected. In the present specification, such an operation of shifting the resistance change element RCD101 from the low-resistance state to the high-resistance state is referred to as an "OFF operation (OFF writing)". Also, the voltage applied during the OFF operation is referred to as an OFF voltage.

Subsequently, between the electrodes UE101 and BE101, a voltage having the same polarity as that of the voltage applied during the forming operation is applied. For the voltage applied at this time, the electrode UE101 corresponds to the higher-voltage side and the electrode BE101 corresponds to the lower-voltage side. In this case, as shown in FIG. 2, an oxygen defect is formed again in the part of the conductive path FLM101 that has disappeared in the metal oxide layer forming the resistance change layer RCL101. As a result, between the electrodes UE101 and BE101, the conductive path FLM101 made of a chain of oxygen defects is formed again. This reduces the resistance value of the resistance change layer RCL101. Thus, the low-resistance state of the resistance change element RCD101 is established again. In the present specification, such an operation of shifting the resistance change element RCD101 from the high-resistance state to the low-resistance state is referred to as an "ON operation (ON writing)". Also, the voltage applied during the ON operation is referred to as an ON voltage. By thus performing the forming operation and then repeating the OFF operation and the ON operation, information can be written in the resistance change element RCD101. That is, by repeating the OFF operation and the ON operation, information can be rewritten as many times as possible in the resistance change element RCD101. In the present specification, a combination of the OFF operation and the ON operation is referred to herein as a switching operation. By performing the switching operation, information can be written in the resistance change element RCD101.

Note that the description of the operation given herein is also applicable to a resistance change element RCD described later by replacing the electrode UE101 with an electrode UE, replacing the electrode BE101 with an electrode BE, replacing the resistance change layer RCL101 with a resistance change layer RCL, replacing the conductive path FLM101 with a conductive path FLM, and replacing the resistance change element RCD101 with a resistance change element RCD.

<Study>

As a result of conducting study, the present inventors have made the following findings.

In the resistance change element RCD101 shown in FIG. 2, a precious metal such as ruthenium (Ru) is used for the electrode BE101 and an oxide of a transition metal (preferably tantalum oxide) is used for the resistance change layer RCL101. During the OFF operation, a voltage higher than that in the electrode UE101 is applied to the electrode BE101. At this time, oxygen is diffused by Joule heat resulting from the current flowing in the conductive path FLM101 to react with an oxygen defect in the conductive path FLM101 so that a part of the conductive path FLM101 disappears. That is, the conductive path FLM101 is disconnected. This brings the resistance change element RCD101 into the high-resistance state. When the application of the high voltage (application of the OFF voltage) to the electrode BE101 is continued thereafter, oxygen ions are attracted from the resistance change layer RCL101 toward the electrode BE101 to which the high voltage is applied. Since a precious metal such as ruthenium (Ru) is unlikely to be oxidized, as the switching operation is repeated and the number of times the switching operation is performed increases, the oxygen ions are gradually stored in the region of the resistance change layer RCL101 which is in the vicinity of the electrode BE101 so that the number of the stored oxygen ions increases.

When a large number of oxygen ions are stored in the region of the resistance change layer RCL101 which is in the vicinity of the electrode BE101, the stored oxygen ions readily react with oxygen defects in the conductive path FLM101. As a result, even when the ON operation is performed to form the conductive path FLM101, the density of oxygen defects in the conductive path FLM101 decreases or the conductive path FLM101 is thinned. Accordingly, the resistance value of the resistance change element RCD101 in the low-resistance state increases to destabilize the low-resistance state. This degrades the reliability of the semiconductor device. For example, even when the ON operation is performed, a phenomenon occurs in which the resistance change element RCD101 cannot successfully shift from the high-resistance state to the low-resistance state, which may fix the resistance change element RCD101 to the high-resistance state. This consequently limits the number of times rewriting can be performed to the resistance change element RCD101 or degrades the reliability of retention of the low-resistance state of the resistance change element RCD101.

<Structure of Resistance Change Element>

Figure 3:
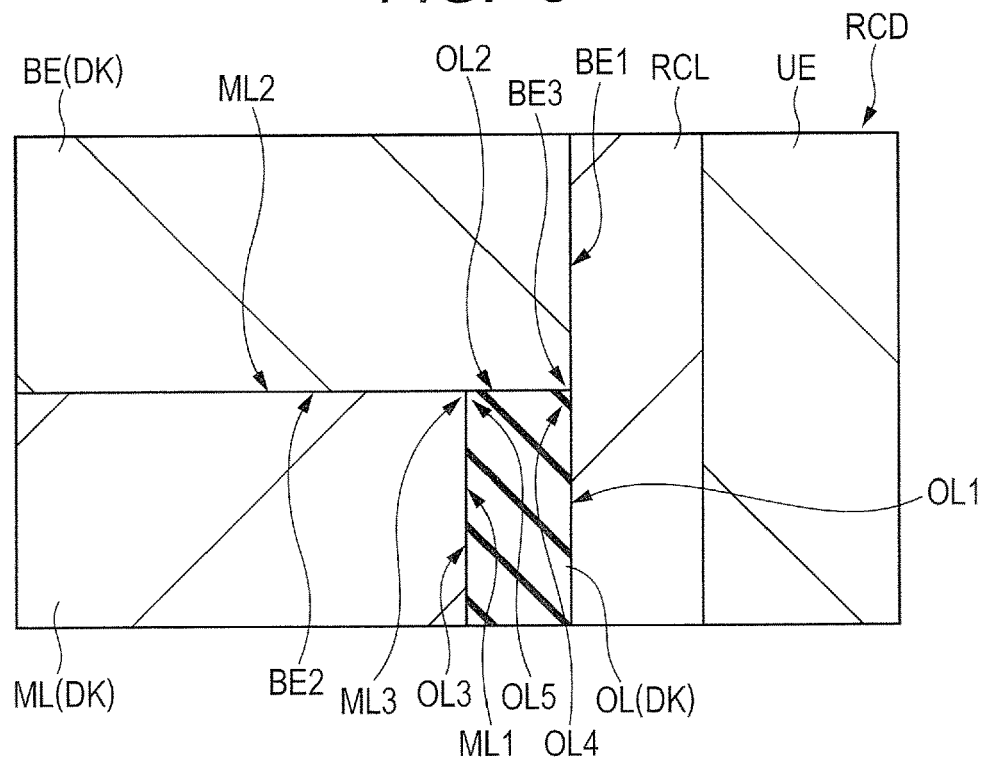
FIG. 3 is a cross-sectional view schematically showing a resistance change element included in a semiconductor device in an embodiment.
Figure 4:
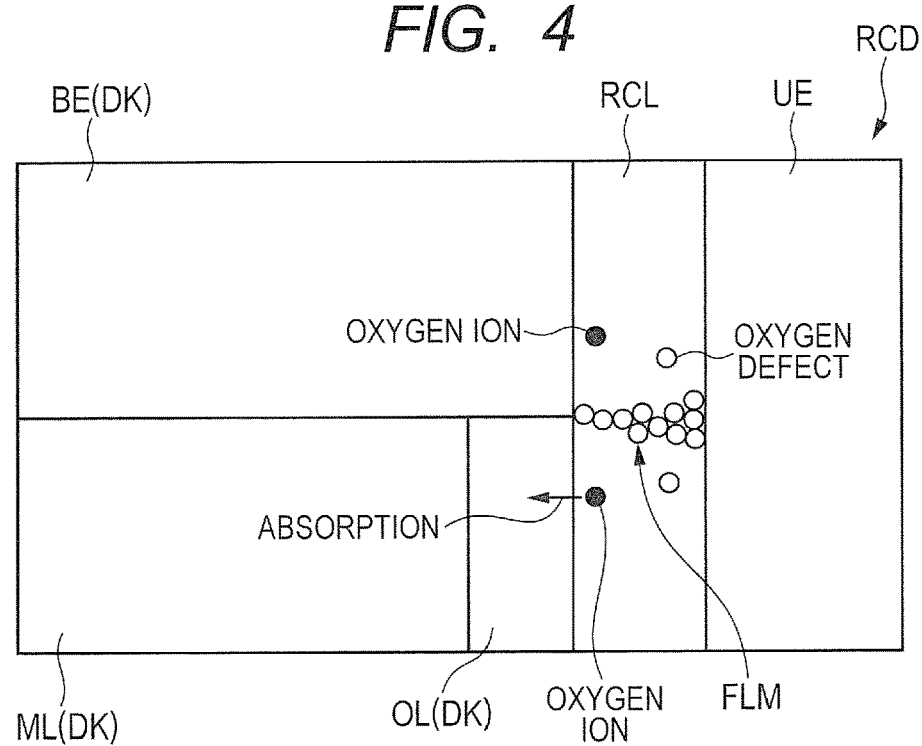
FIG. 4 is a cross-sectional view schematically showing the resistance change element included in the semiconductor device in the embodiment.

Next, referring to FIGS. 3 and 4, a description will be given of a structure of the resistance change element RCD in Embodiment 1. FIGS. 3 and 4 are cross-sectional views each schematically showing the resistance change element RCD included in the semiconductor device in Embodiment 1. Note that FIG. 4 shows the same cross-sectional region as shown in FIG. 3 and shows a state (low-resistance state) where the conductive path FLM made of a chain of oxygen defects is formed in the resistance change layer RCL. In FIG. 4, for easy recognition of oxygen defects and oxygen ions, the hatching shown in FIG. 3 is omitted. Note that, in FIG. 4, the oxygen defects in the resistance change layer RCL are schematically shown by blank circles and the oxygen ions in the resistance change layer RCL are schematically shown by the solid circles.

As shown in FIG. 3, the resistance change element RCD has the electrode (upper electrode, second electrode, or second electrode layer) UE, the resistance change layer RCL, the electrode (lower electrode, first electrode, or first electrode layer) BE, a metal material layer ML, and an oxide layer OL. The resistance change element RCD has a structure in which the resistance change layer RCL is interposed between the electrode UE and an electrode structure DK. A combination of the electrode BE, the metal material layer ML, and the oxide layer OL is hereinafter referred to as the electrode structure DK. The electrode UE is one of the electrodes of the resistance change element RCD, while the electrode BE is the other electrode of the resistance change element RCD. In the resistance change layer RCL, the conductive path FLM made of a chain of oxygen defects is formed.

Note that the description of the foregoing "Basic Operation of Memory Cell" section is also applicable to the resistance change element RCD in Embodiment 1 by replacing the electrode UE101 with the electrode UE, replacing the electrode BE101 with the electrode BE, replacing the resistance change layer RCL101 with the resistance change layer RCL, replacing the conductive path FLM101 with the conductive path FLM, and replacing the resistance change element RCD101 with the resistance change element RCD.

The electrode UE is made of a conductive material (metal or conductive metal compound). The electrode UE is made of a multi-layer film including, e.g., a tantalum (Ta) layer and a tungsten (W) layer, though the material of the electrode UE is not particularly limited. When the electrode UE is made of the multi-layer film including the tantalum (Ta) layer and the tungsten (W) layer, the tantalum (Ta) layer is in contact with the resistance change layer RCL, while the tungsten (W) layer is adjacent to the resistance change layer RCL via the tantalum (Ta) layer.

The resistance change layer RCL is made of a metal oxide (oxidized metal). Specifically, the resistance change layer RCL is made of an oxide of a transition metal. For example, tantalum oxide ($TaO_x$), hafnium oxide ($HfO_x$), or aluminum oxide ($AlO_x$) can be used appropriately as the material of the resistance change layer RCL. The use of tantalum oxide ($TaO_x$) as the material of the resistance change layer RCL is particularly preferred.

The electrode BE is made of a conductive material (metal or conductive metal compound). Specifically, the electrode BE is made of ruthenium (Ru), ruthenium oxide ($RuO_x$), iridium (Ir), iridium oxide ($IrO_x$), platinum (Pt), gold (Au), or copper (Cu). Ruthenium (Ru) is particularly preferred as the material of the electrode BE.

The metal material layer ML is made of a metal or a conductive metal compound. For example, tantalum nitride (TaN), titanium nitride (TiN), tungsten (W), or a compound thereof (a compound of tantalum (Ta), titanium (Ti), and nitrogen (N), a compound of titanium (Ti), tungsten (W), and nitrogen (N), or a compound of tantalum (Ta), tungsten (W), and nitrogen (N)) can be used appropriately as the material of the metal material layer ML.

The oxide layer OL is made of an oxide of the material forming the metal material layer ML. This is because the oxide layer OL is formed through the oxidation of a portion of the metal material layer ML. For example, when the metal material layer ML is made of tantalum nitride (TaN), the oxide layer OL is made of tantalum oxynitride (TaON). When the metal material layer ML is made of titanium nitride (TiN), the oxide layer OL is made of titanium oxynitride (TiON). When the metal material layer ML is made of tungsten (W), the oxide layer OL is made of tungsten oxide ($WO_x$).

The electrode UE and the electrode structure DK are spaced apart from each other. The electrode BE, the metal material layer ML, and the oxide layer OL which are included in the electrode structure DK are adjacent to each other. That is, the electrodes UE and BE are spaced apart from each other, the electrode UE and the metal material layer ML are spaced apart from each other, and the electrode UE and the oxide layer OL are spaced apart from each other. On the other hand, the electrode BE and the metal material layer ML are adjacent to each other, the metal material layer ML and the oxide layer OL are adjacent to each other, and the electrode BE and the oxide layer OL are adjacent to each other.

The electrode UE is adjacent to the resistance change layer RCL, but is not adjacent to the electrode structure DK. That is, the electrode UE is adjacent to neither the electrode BE, the metal material ML, nor the oxide layer OL and, between the electrode UE and the electrode structure DK, the resistance change layer RCL is interposed. Specifically, between the electrodes UE and BE, the resistance change layer RCL is interposed and, between the electrode UE and the oxide layer OL, the resistance change layer RCL is interposed.

The resistance change layer RCL is interposed between the electrode UE and the electrode structure DK to extend continuously between the electrodes UE and BE and between the electrode UE and the oxide layer OL. That is, between the electrodes UE and BE and between the electrode UE and the oxide layer OL, the resistance change layer RCL is continuously disposed. Note that, among the electrode BE, the metal material layer ML, and the oxide layer OL, the electrode BE and the oxide layer OL are adjacent to the resistance change layer RCL, but the metal material layer ML is not adjacent to the resistance change layer RCL. Between the metal material layer ML and the resistance change layer RCL, the oxide layer OL is interposed. Between the electrodes UE and BE and between the electrode UE and the oxide layer OL, the resistance change layer RCL is continuously disposed. Accordingly, the area of the portion of the electrode UE which is in contact with the resistance change layer RCL is larger than the area of the portion of the electrode BE which is in contact with the resistance change layer RCL.

Among the electrode UE, the resistance change layer RCL, the electrode BE, the metal material layer ML, and the oxide layer OL which are included in the resistance change element RCD, the electrodes UE and BE and the metal material layer ML are conductive. Preferably, each of the electrodes UE and BE and the metal material layer ML shows metal conduction.

When the conductive path (filament) FLM made of a chain of oxygen defects is formed in the resistance change layer RCL, conduction is achieved between the electrodes UE and BE through the conductive path FLM. Accordingly, the resistance change layer RCL needs to have a high resistivity except for the region thereof where the conductive path FLM is formed. For this reason, the resistance change layer RCL is made of a metal oxide (oxidized metal), but the metal oxide forming the resistance change layer RCL is not a conductive metal oxide.

The metal oxide layer OL does not function as an electrode or a conductive path, but functions to take in oxygen (oxygen ions) from the resistance change layer RCL, which will be described later in detail. The respective free energies of oxide formation of each of the resistance change layer RCL and the oxide layer OL are set so as to allow the oxide layer OL to have this function. That is, the free energy of oxide formation (standard free energy of formation) of the oxide forming the oxide layer OL is higher than the free energy of oxide formation (standard free energy of formation) of the oxide forming the resistance change layer RCL.

In the resistance change layer RCL, the conductive path FLM made of a chain of oxide defects is formed between the electrodes UE and BE. Conduction is achieved between the electrodes UE and BE through the conductive path FLM, while conduction is not achieved between the electrode UE and the oxide layer OL through the conductive path FLM. Accordingly, the oxide forming the oxide layer OL is not a conductive oxide.

The electrode BE has a surface BE1 in contact with the resistance change layer RCL, a surface BE2 in contact with each of the metal material layer ML and the oxide layer OL, and a corner portion (projecting portion or protruding portion) BE3 formed by the surfaces BE1 and BE2. The oxide layer OL has a surface OL1 in contact with the resistance change layer RCL, a surface OL2 in contact with the electrode BE, a surface OL3 in contact with the metal material layer ML, a corner portion OL4 formed by the surfaces OL1 and OL2, and a corner portion OL5 formed by the surfaces OL2 and OL3. In the oxide layer OL, the surfaces OL1 and OL2 are opposite to each other, while the surface OL3 intersects each of the surfaces OL1 and OL2. The metal material layer ML has a surface ML1 in contact with the oxide layer OL, a surface ML2 in contact with the electrode BE, and a corner portion ML3 formed by the surfaces ML1 and ML2. The surface BE1 of the electrode BE and the surface OL1 of the oxide layer OL are in contact with the resistance change layer RCL. The surface OL2 of the oxide layer OL and the surface ML2 of the metal material layer ML are in contact with the surface BE2 of the electrode BE. The surface OL3 of the oxide layer OL is in contact with the surface ML1 of the metal material layer ML. The corner portion BE3 of the electrode BE and the corner portion OL4 of the oxide layer OL are adjacent to each other. The corner portion OL5 of the oxide layer OL and the corner portion ML3 of the metal material layer ML are adjacent to each other.

In the resistance change layer RCL, the conductive path FLM made of a chain of oxygen defects is formed between the corner portion BE3 of the electrode BE and the electrode UE. This is because, when a voltage is applied between the electrodes UE and BE, an electric field is concentrated on the corner portion BE3 of the electrode BE.

<Configuration of Semiconductor Device>

Figure 5:
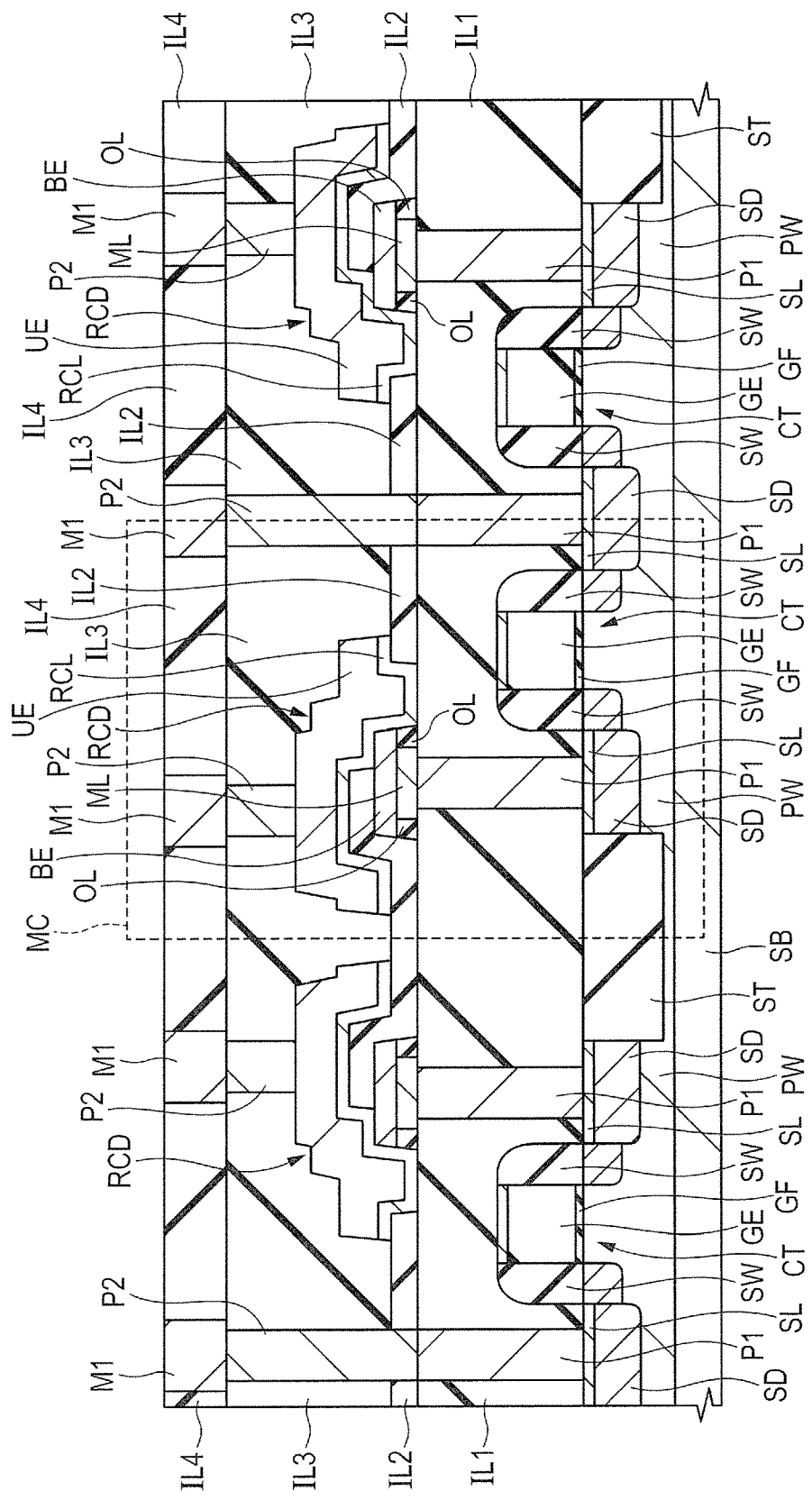
FIG. 5 is a main-portion cross-sectional view showing the semiconductor device in the embodiment.

Referring to FIG. 5, a description will be given of a configuration of the semiconductor device including the resistance change element RCD in Embodiment 1. FIG. 5 is a main-portion cross-sectional view showing the semiconductor device including the resistance change element RCD in Embodiment 1.

The memory cell MC has the cell transistor CT as the selection transistor and the resistance change element RCD. The cell transistor CT includes a gate electrode GE formed over a semiconductor substrate SB (p-type well PW) via a gate insulating film GF and source/drain regions SD provided on both sides of the gate electrode GE in the semiconductor substrate SB (p-type well PW). Over the side walls of the gate electrode GE, sidewall spacers SW are formed. Each of the source/drain regions SD has a so-called LDD (Lightly doped Drain) structure.

The electrode UE of the resistance change element RCD is electrically coupled to a wire M1 (plate line) via a conductive plug P2 disposed over the electrode UE. The metal material layer ML of the resistance change element RCD is electrically coupled to one of the source/drain regions SD of the cell transistor CT via a conducive plug P1 disposed under the metal material layer ML. Since the metal material layer ML and the electrode BE are in contact with and electrically coupled to each other, the electrode BE of the resistance change element RCD is electrically coupled to one of the source/drain regions SD of the cell transistor CT via the metal material layer ML and the plug P1. The other source/drain region SD of the cell transistor CT is electrically coupled to the wire M1 (bit line) via the conductive plugs P1 and P2 disposed over the source/drain region SD. The gate electrode GE of the cell transistor CT is electrically coupled to the wire M1 (word line) via the conductive plugs P1 and P2, though not shown. The plugs P1 are formed in an interlayer insulating film IL1 formed over the semiconductor substrate SB. The plugs P2 are formed in an insulating film (interlayer insulating film) IL3 formed over the interlayer insulating film IL1. The cell transistor CT and the resistance change element RCD form one memory cell MC.

In Embodiment 1, the description is given of the case where the resistance change element RCD is provided between the wiring layer in which the wires M1 are formed and the semiconductor substrate SB. In another form, it is also possible that, in a multi-layer wiring structure formed over the semiconductor substrate, the resistance change element RCD is provided between any of wiring layers and the wiring layer located immediately thereabove. Alternatively, it is also possible to provide the resistance change element RCD over wires.

<Manufacturing Process of Semiconductor Device>

Next, referring to FIGS. 6 to 18, a description will be given of the manufacturing process of the semiconductor device including the resistance change element RCD in Embodiment 1. FIGS. 6 to 18 are main-portion cross-sectional views of the semiconductor device in Embodiment 1 during the manufacturing process thereof. In each of FIGS. 6 to 18, of the cross-sectional region of FIG. 5, a cross-sectional region where one of the memory cells MC is formed.

Figure 6:
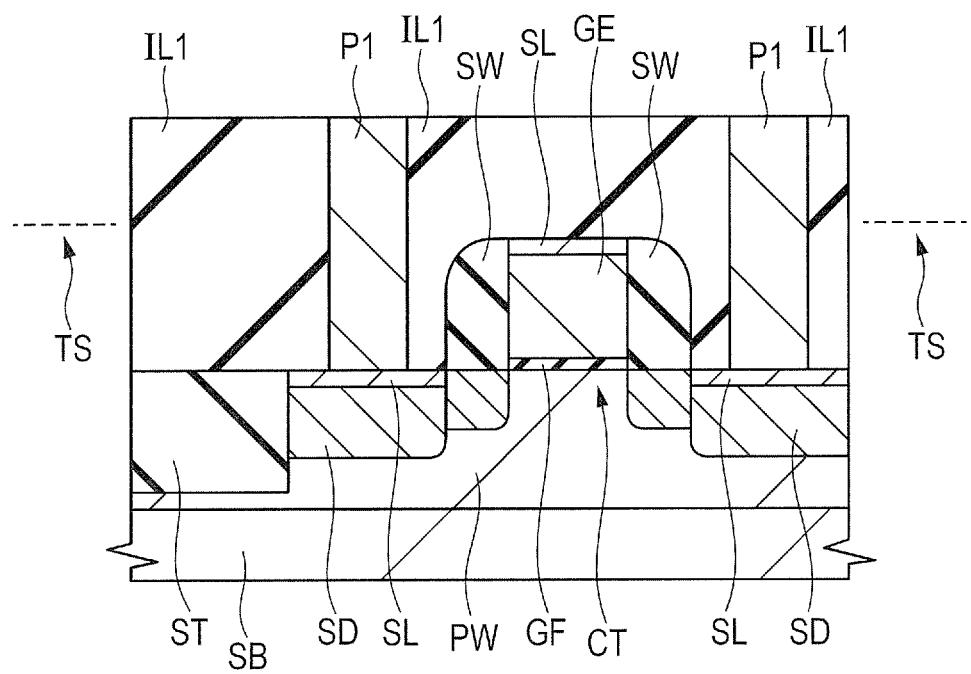
FIG. 6 is a main-portion cross-sectional view of the semiconductor device in the embodiment during the manufacturing process thereof.

First, as shown in FIG. 6, over the main surface of the semiconductor substrate SB, a semiconductor element such as the foregoing cell transistor CT is formed. Then, over the main surface of the semiconductor substrate SB, the interlayer insulating film IL1 is formed so as to cover a semiconductor element such as the cell transistor CT. For example, the cell transistor CT can be formed as follows.

That is, first, the semiconductor substrate SB is provided. As the semiconductor substrate SB, a semiconductor substrate made of p-type monocrystalline silicon having a specific resistance of, e.g., about 1 to 10 Ωcm or the like can be used.

Next, in the main surface of the semiconductor substrate SB, an isolation region ST is formed. The isolation region ST can be formed by, e.g., a STI (Shallow Trench Isolation) method or the like.

In the semiconductor substrate SB, an active region is defined by the isolation region ST. In the active region, a semiconductor element such as the cell transistor CT is formed. Note that, by way of example, an n-channel MISFET is described herein as the cell transistor CT. However, in a region where, e.g., a peripheral circuit for driving the memory cell array is formed, a p-channel MISFET having a conductivity type opposite to that of the n-channel MISFET may also be formed as a semiconductor element for the peripheral circuit. It may also be possible to form both of an n-channel MISFET and a p-channel MISFET.

Next, in the active region of the semiconductor substrate SB, a p-type well PW is formed. The p-type well PW can be formed by, e.g., ion-implanting a p-type impurity into the semiconductor substrate SB.

Next, over the main surface of the semiconductor substrate SB (P-type well PW), the gate electrode GE is formed via the gate insulating film GF. For example, over the main surface of the semiconductor substrate SB, the gate insulating film GF made of a silicon dioxide film or the like is formed using a thermal oxidation method or the like. Then, over the gate insulating film GF, a conductive film made of a polycrystalline silicon film or the like is formed using a CVD (Chemical Vapor Deposition) method or the like. By patterning the conductive film using a photolithographic technique and an etching technique, the gate electrode GE can be formed.

Next, in the areas of the semiconductor substrate SB (p-type well PW) which are located on both sides of the gate electrode GE, the source/drain regions SD are formed. Specifically, first, by ion implantation using the gate electrode GE as a mask (ion implantation stopping mask), lower-impurity-concentration n⁻-type semiconductor regions are formed in the semiconductor substrate SB (p-type well PW). Then, over the semiconductor substrate SB, an insulating film for the sidewall spacers SW is formed so as to cover the gate electrode GE. Then, the insulating film is etched back using an anisotropic etching technique to form the sidewall spacers SW over both side walls of the gate electrode GE. Then, by ion implantation using the gate electrode GE and the sidewall spacers SW as a mask, higher-impurity-concentration n⁺-type semiconductor regions are formed in the semiconductor substrate SB (p-type well PW). Thus, it is possible to form the source/drain regions SD each having an LDD structure including the lower-impurity-concentration n⁻-type semiconductor region and the n⁺-type semiconductor region having an impurity concentration lower than that of the n⁻-type semiconductor region and a junction depth deeper than that thereof.

Next, anneal treatment (heat treatment) is performed to activate the impurities introduced by the previous ion implantation.

By the foregoing process, in the main surface of the semiconductor substrate SB, the cell transistor CT can be formed.

Next, using a salicide (Self Aligned Silicide) technique, in the respective upper portions of the n⁺-type semiconductor regions included in the source/drain regions SD and the gate electrode GE, metal silicide layer SL are formed. For example, after a metal film is formed over the semiconductor substrate SB so as to cover the gate electrode GE and the sidewall spacers SW, heat treatment is performed to cause the respective upper portions of the n+-type semiconductor regions and the gate electrode GE to react with the metal film. Thus, the metal silicide layers SL can be formed. Subsequently, the unreacted metal film is removed. Each of the metal silicide layers SL is made of, e.g., a cobalt silicide layer, a nickel silicide layer, or a platinum-added nickel silicide layer.

Next, over the main surface of the semiconductor substrate SB, the interlayer insulating film IL1 is formed so as to cover the gate electrode GE and the sidewall spacers SW. As the interlayer insulating film IL1, a single-layer insulating film or a multi-layer insulating film can be used. The interlayer insulating film IL1 can be formed using a CVD method or the like. The multi-layer insulating film mentioned herein corresponds to an insulating film in which a plurality of insulating films are stacked. After the formation of the interlayer insulating film IL1, the upper surface of the interlayer insulating film IL1 is planarized as necessary using a CMP (Chemical Mechanical Polishing) method or the like.

Figure 7:
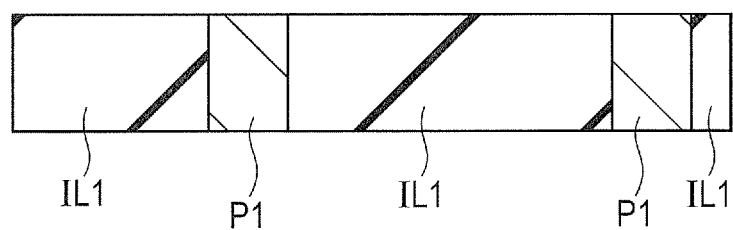
FIG. 7 is a main-portion cross-sectional view of the semiconductor device during the manufacturing process thereof, which is similar to FIG. 6.

Next, in the interlayer insulating film IL1, the conductive plugs (coupling portions) P1 are formed. Specifically, first, using a photoresist pattern (not shown) formed over the interlayer insulating film IL1 using a photolithographic technique as an etching mask, the interlayer insulating film IL1 is dry-etched to be formed with contact holes (through holes). Then, over the interlayer insulating film IL1 including the bottom surfaces and side walls of the contact holes, a barrier conductor film is formed. Then, over the barrier conductor film, a main conductor film made of a tungsten film or the like is formed so as to be embedded in the contact holes. Then, the unneeded main conductor film and the unneeded barrier conductor film which are located outside the contact holes are removed by a CMP method, an etch-back method, or the like. Thus, the plugs P1 embedded in the contact holes can be formed. By the process steps performed heretofore, the structure shown in FIG. 6 can be obtained. FIG. 7 is a cross-sectional view at the same process stage as in FIG. 6, but the illustration of the structure located below the height position shown by the dotted line TS in FIG. 6 is omitted. In FIGS. 8 to 18 also, in the same manner as in FIG. 7, the illustration of the structure located below the height position shown by the dotted line TS in FIG. 6 is omitted.

After the structure shown in FIG. 6, i.e., the structure shown in FIG. 7 is obtained, over the plugs P1, the resistance change elements RCD are formed. Each of the resistance change elements RCD can be formed as follows.

Figure 8:
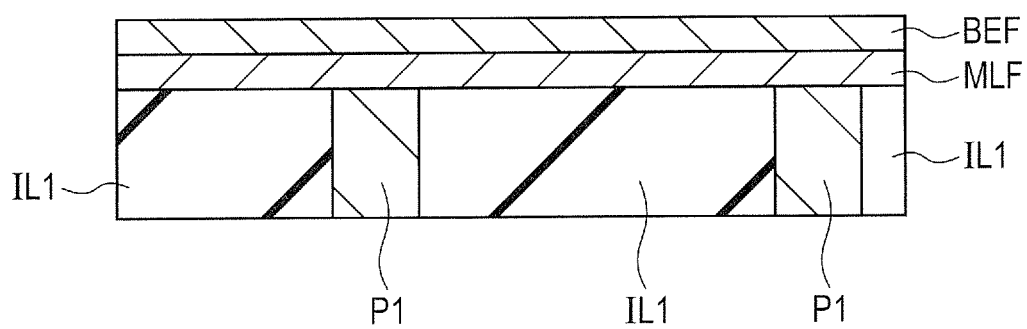
FIG. 8 is a main-portion cross-sectional view of the semiconductor device during the manufacturing process thereof, which is subsequent to FIG. 7.

That is, first, the top surfaces of the plugs P1 and the interlayer insulating film IL1 are etched using an argon (Ar) plasma. This can remove an oxide film from the top surface of each of the plugs P1 and establish an excellent coupling state between the plug P1 and the resistance change element RCD. Then, as shown in FIG. 8, over the interlayer insulating film IL1 in which the plugs P1 are embedded, a metal material film (metal material layer) MLF is formed. Then, over the metal material film MLF, an electrode film (electrode material film or electrode layer) BEF is formed. As a result, over the interlayer insulating film IL1 in which the plugs P1 are embedded, a multi-layer film including the metal material film MLF and the electrode film BEF over the metal material film MLF is formed. The metal material film MLF and the electrode film BEF can be formed by, e.g., a sputtering method or a CVD method. At this time, it is preferable to form the metal material film MLF and then continuously deposit the electrode film BEF, while keeping the metal material film MLF from contact with ambient air and maintaining a vacuum state.

The metal material film LF is a film for forming the foregoing metal material layer ML. The electrode film BEF is a film for forming the foregoing electrode BE. Accordingly, as the material of the metal material film MLF, the material described as the material of the foregoing metal material layer ML is used and, as the material of the electrode film BEF, the material described as the material of the foregoing electrode BE is used.

Figure 9:
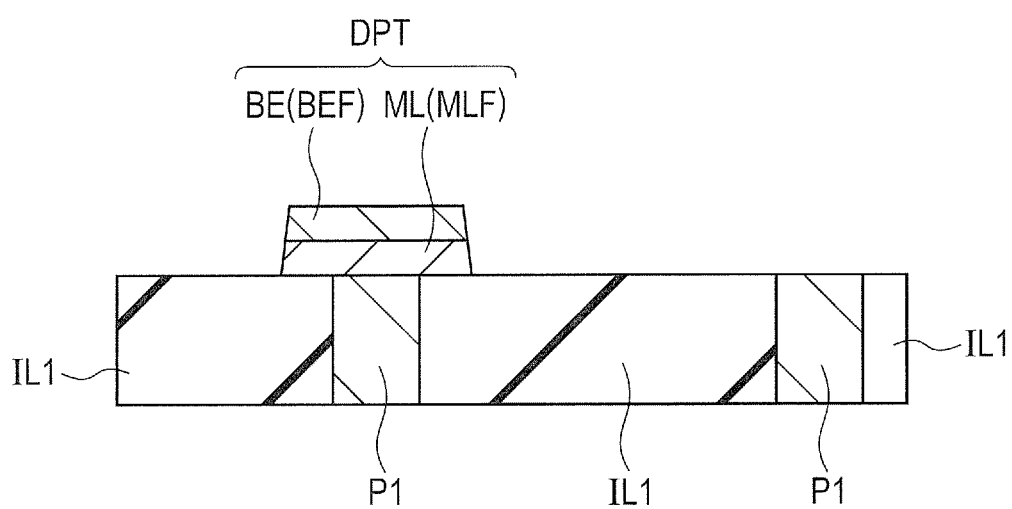
FIG. 9 is a main-portion cross-sectional view of the semiconductor device during the manufacturing process thereof, which is subsequent to FIG. 8.

Next, as shown in FIG. 9, the multi-layer film including the metal material film MLF and the electrode film BEF is patterned to form an electrode pattern (multi-layer body) DPT.

This patterning step can be performed as follows. That is, after a photoresist pattern is formed over the electrode film BEF using a photolithographic technique, using the photoresist film as an etching mask, the electrode film BEF and the metal material film MLF are patterned by dry etching to be able to form the electrode pattern DPT. Alternatively, after an insulating film (a silicon dioxide film, a silicon nitride film, or a multi-layer film thereof) for a hard mask is formed over the electrode film BEF, a photoresist pattern is formed over the insulating film using a photolithographic technique. Then, using the photoresist pattern as an etching mask, the insulating film for the hard mask is dry-etched to form the hard mask made of the insulating film. Then, after the photoresist pattern is removed, using the hard mask made of the insulating film as an etching mask, the electrode film BEF and the metal material film MLF are patterned by dry etching to be able to form the electrode pattern DPT.

The electrode pattern DPT includes the metal material layer ML and the electrode BE over the metal material layer ML. Note that the metal material layer ML is made of the patterned metal material film MLF, and the electrode BE is made of the patterned electrode film BEF. At this process stage, the foregoing oxide layer OL has not been formed yet. In plan view, the electrode pattern DPT overlaps the plug P1. More preferably, the electrode pattern DPT includes the plug P1. The plug P1 disposed under the electrode pattern DPT is in contact with and electrically coupled to the metal material layer ML of the electrode pattern DPT. In the electrode pattern DPT, the two-dimensional shape of the metal material layer ML is substantially the same as the two-dimensional shape of the electrode BE, but the side surfaces of the electrode pattern DPT may also be tapered. When the side surfaces of the electrode pattern DPT are tapered, the angles formed between the side surfaces of the electrode pattern DPT and the lower surface of the electrode pattern DPT are smaller than 90°.

Figure 10:
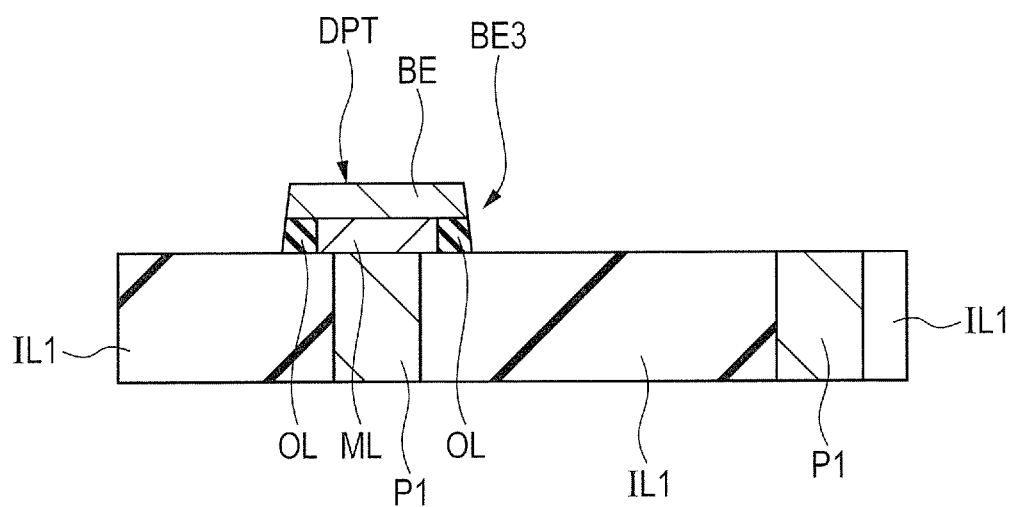
FIG. 10 is a main-portion cross-sectional view of the semiconductor device during the manufacturing process thereof, which is subsequent to FIG. 9.

Next, plasma treatment (oxygen plasma treatment) is performed in an oxygen atmosphere. During the plasma treatment, due to the oxygen affinity difference (difference in Gibbs free energy of oxidation) between the metal material layer ML and the electrode BE, the exposed surface of the metal material layer ML is oxidized, while the exposed surface of the electrode BE is scarcely oxidized. That is, the Gibbs free energy of oxidation is lower (smaller) in the material forming the metal material layer ML than in the material forming the electrode BE, and the metal material layer ML has a higher oxygen affinity than the electrode BE. Accordingly, the metal material layer ML is more likely to be oxidized than the electrode BE. Consequently, the exposed surface of the metal material layer ML is oxidized, while the exposed surface of the electrode BE, which is less likely to be oxidized, is scarcely oxidized. As a result, when the plasma treatment is performed, as shown in FIG. 10, the exposed side surfaces of the metal material layer ML included in the electrode pattern DPT are selectively oxidized to form the oxide layer OL. At each of the side surfaces of the electrode pattern DPT, the corner portion (projecting portion) BE3 of the electrode BE adjacent to the oxide layer OL is formed. The corner portion BE3 of the electrode BE is formed by the lower and side surfaces of the electrode BE included in the electrode pattern DPT.

Note that, at the process stage where the electrode pattern DPT is formed, the metal material layer ML included in the electrode pattern DPT has the upper surface covered with the electrode BE, the lower surface covered with each of the plug P1 and the interlayer insulating film IL1, and the exposed side surfaces. Accordingly, when the plasma treatment is performed, each of the side surfaces of the metal material layer ML is selectively oxidized to form the oxide layer OL, while the upper and lower surfaces of the metal material layer ML are not oxidized. The oxide layer OL is formed in each of the side surfaces of the metal material layer ML and adjacent to the metal material layer ML in a horizontal direction. The horizontal direction mentioned herein is generally parallel with the upper surface of the interlayer insulating film IL1 and therefore generally parallel with the main surface of the semiconductor substrate SB.

The oxide layer OL is formed through the oxidation of a portion (region in the vicinity of each of the side surfaces) of the metal material layer ML included in the electrode pattern DPT. Accordingly, the oxide layer OL is made of an oxide of the material forming the metal material layer ML. When the metal material film MLF is made of, e.g., tantalum nitride (TaN), the metal material layer ML is also made of tantalum nitride (TaN), and the oxide layer OL is made of tantalum oxynitride (TaON) resulting from the oxidation of tantalum nitride (TaN). Since the electrode BE is formed of a material less likely to be oxidized than the metal material layer ML, even when the plasma treatment is performed, the electrode BE is kept from being oxidized. After the plasma treatment is performed, the electrode pattern DPT includes the metal material layer ML, the oxide layer OL adjacent to the metal material layer ML, and the electrode BE located over each of the metal material layer ML and the oxide layer OL.

Figure 11:
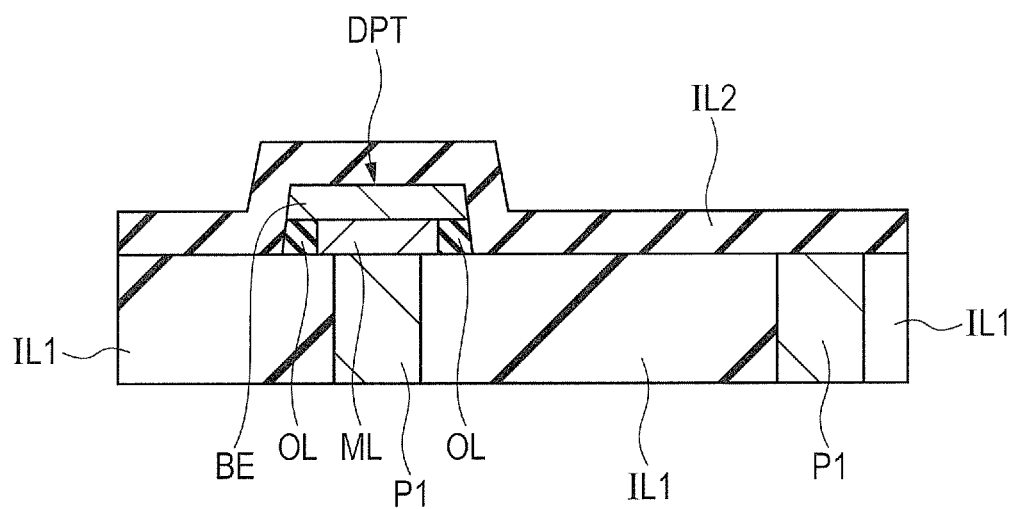
FIG. 11 is a main-portion cross-sectional view of the semiconductor device during the manufacturing process thereof, which is subsequent to FIG. 10.

Next, as shown in FIG. 11, over the interlayer insulating film IL1, an insulating film IL2 is formed so as to cover the electrode pattern DPT. As the insulating film IL2, e.g., a silicon nitride film, a silicon oxynitride film, a silicon dioxide film, a silicon carbonitride film, or the like can be used.

Figure 12:
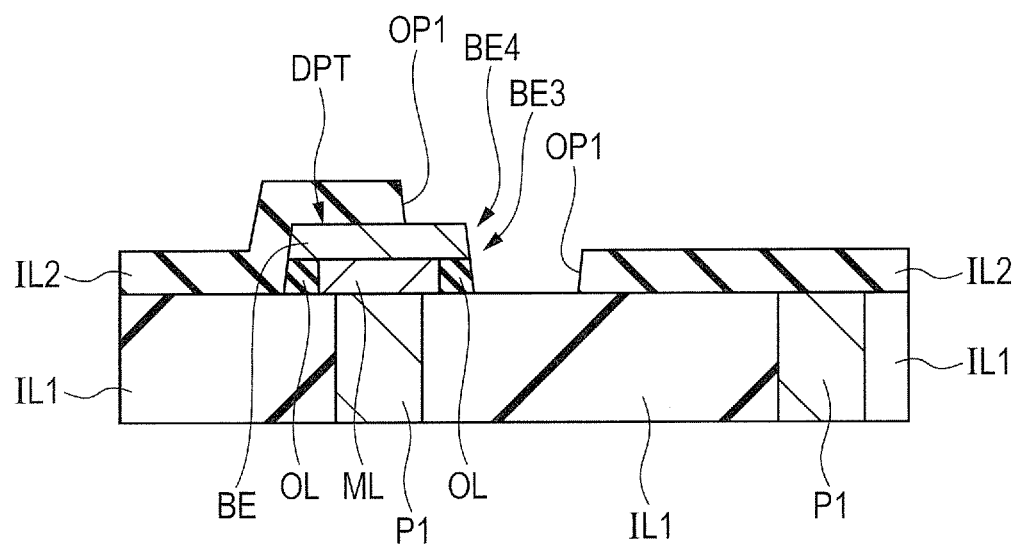
FIG. 12 is a main-portion cross-sectional view of the semiconductor device during the manufacturing process thereof, which is subsequent to FIG. 11.

Next, over the insulating film IL2, a photoresist pattern (not shown) is formed using a photolithographic technique. Then, using the photoresist pattern as an etching mask, the insulating film IL2 is etched (dry-etched) to be formed with an opening OP1, as shown in FIG. 12. The opening OP1 partially overlaps the electrode pattern DPT in plan view, and one of the side surfaces (side walls) of the electrode pattern DPT is exposed from the opening OP1. That is, the opening OP1 is formed in the insulating film IL2 so as to expose one of the side surfaces of the electrode pattern DPT and a portion of the upper surface thereof.

In the dry etching for forming opening OP1, by adjusting plasma conditions, it is possible to adjust the taper angle of a corner portion BE4 formed by the upper surface and each of the side surfaces of the electrode BE included in the electrode pattern DPT. For example, in the dry etching for forming the opening OP1, the corner portion BE4 formed by the upper surface and each of the side surfaces of the electrode BE included in the electrode pattern DPT can also be rounded. Alternatively, the corner portion BE can also have an obtuse angle. This allows the corner portion (corresponding to the foregoing corner portion BE3) of the electrode BE which is adjacent to the oxide layer OL to provide a structure in which electric field concentration is more likely to occur.

Figure 13:
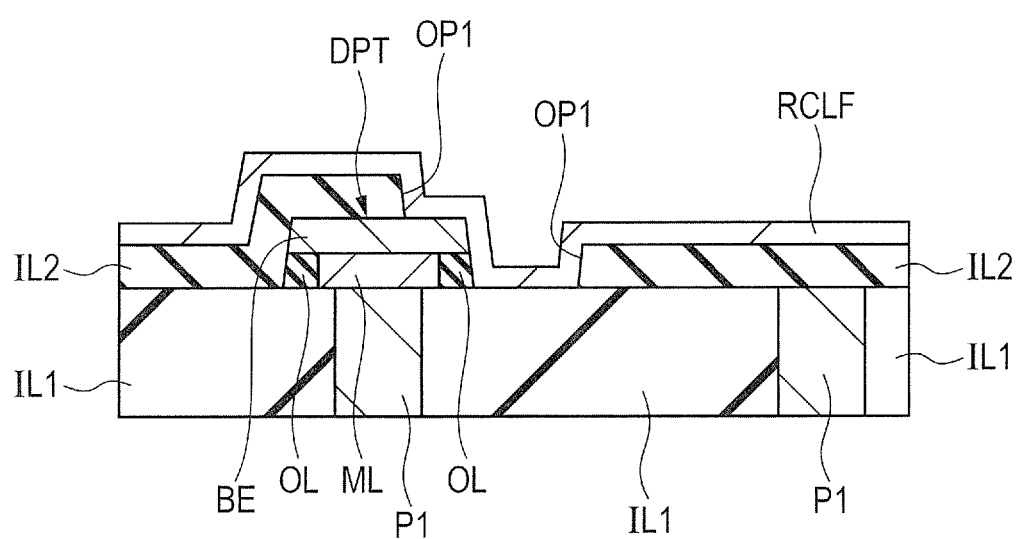
FIG. 13 is a main-portion cross-sectional view of the semiconductor device during the manufacturing process thereof, which is subsequent to FIG. 12.

Next, as shown in FIG. 13, over the insulating film IL2 including the inner portion of the opening OP1, a resistance change film (resistance change layer) RCLF is formed. The resistance change film RCLF is a film for forming the foregoing resistance change layer RCL. Accordingly, as the material of the resistance change film RCLF, the material described as the material of the foregoing resistance change layer RCL is used.

For example, the step of forming the resistance change film RCLF can be performed as follows. Note that in the case described herein, the resistance change film RCLF is a tantalum oxide ($TaO_x$) film. That is, first, over the insulating film IL2 including the inner portion of the opening OP1, a tantalum (Ta) film is deposited by a sputtering method. Then, by performing plasma oxidation treatment using an oxidizing gas, the tantalum (Ta) film is plasma-oxidized to form the tantalum oxide ($TaO_x$) film. In another form, the tantalum oxide ($TaO_x$) film may also be deposited using a reactive sputtering method. Alternatively, the tantalum oxide ($TaO_x$) film may also be deposited by a MOCVD (Metal Organic Chemical Vapor Deposition) method. Thus, the resistance change film RCLF made of the tantalum oxide ($TaO_x$) film can be formed.

Figure 14:
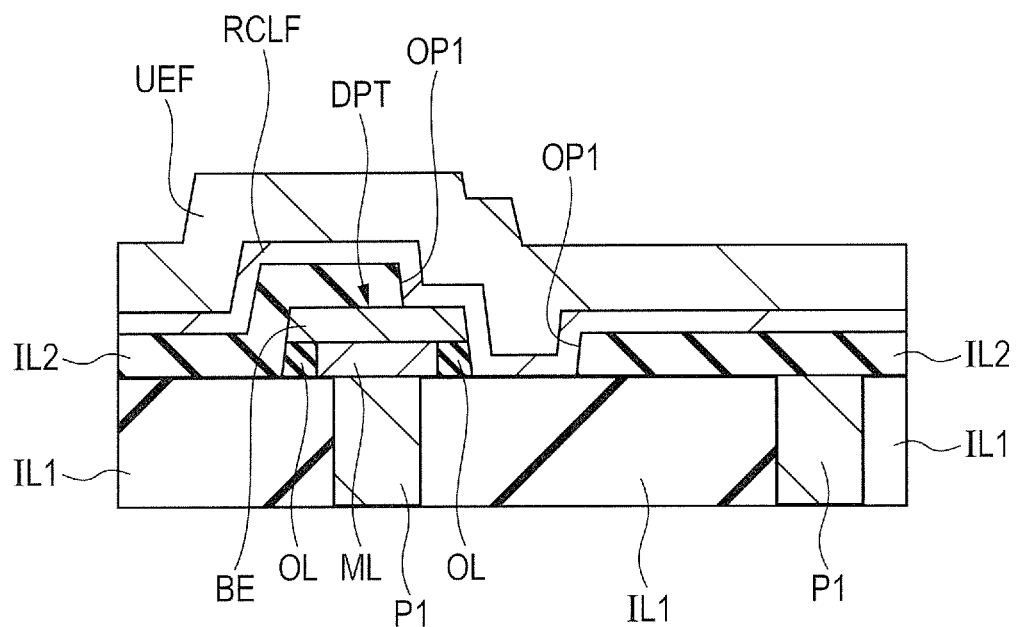
FIG. 14 is a main-portion cross-sectional view of the semiconductor device during the manufacturing process thereof, which is subsequent to FIG. 13.

Next, as shown in FIG. 14, over the resistance change film RCLF, an electrode film (electrode layer) UEF is formed. The electrode film UEF is a film for forming the foregoing electrode UE. Accordingly, as the material of the electrode film UEF, the material described as the material of the foregoing electrode UE is used. Note that a multi-layer film including an oxygen extraction layer, an oxidation prevention layer, and a main electrode layer is shown herein as the electrode film UEF.

For example, over the tantalum oxide film (resistance change film RCLF), a tantalum (Ta) film is deposited as the oxygen extraction layer by a sputtering method. The tantalum (Ta) film is formed so as to introduce oxygen defects into the tantalum oxide ($TaO_x$) film. By this oxygen extraction layer (tantalum film), oxygen is extracted from the lower-layer resistance change film RCLF (tantalum oxide film) so that oxygen defects are introduced into the resistance change film RCLF (tantalum oxide film). Then, over the tantalum film (oxygen extraction layer), as the oxidation prevention layer, a tantalum nitride (TaN) film is formed by a sputtering method. At this time, it is preferable to use, e.g., a multi-chamber device and continuously form the tantalum nitride film as the oxidation prevention layer, while keeping the tantalum film as the oxygen extraction layer from contact with ambient air and maintaining a vacuum state. The oxidation prevention layer (tantalum nitride film) can prevent natural oxidation of the top surface of the oxygen extraction layer (tantalum film). This can assist efficient introduction of oxygen defects into the tantalum oxide ($TaO_x$) film. Also, it is possible to reduce a parasitic resistance resulting from a natural oxide film and stabilize device characteristics. Then, over the oxidation prevention layer (tantalum nitride film), a tungsten (W) film is formed as a main electrode layer by a sputtering method or a CVD method. Thus, the electrode film UEF made of the multi-layer film including the oxygen extraction layer (tantalum film), the oxidation prevention layer (tantalum nitride film), and the main electrode layer (tungsten film) is formed over the resistance change film RCLF.

Note that, when oxygen defects are introduced into the resistance change film RCLF (tantalum oxide film) during the formation of the resistance change film RCLF, it is also possible to omit the formation of the oxygen extraction layer (tantalum film) and the oxidation prevention layer (tantalum nitride film) after the formation of the resistance change film RCLF (tantalum oxide film) and form the main electrode layer (tungsten film) over the resistance change film RCLF (tantalum oxide film). In this case, the electrode film UEF has neither the oxygen extraction layer (tantalum film) nor the oxidation prevention layer (tantalum nitride film) and is formed of the main electrode layer (tungsten film).

Figure 15:
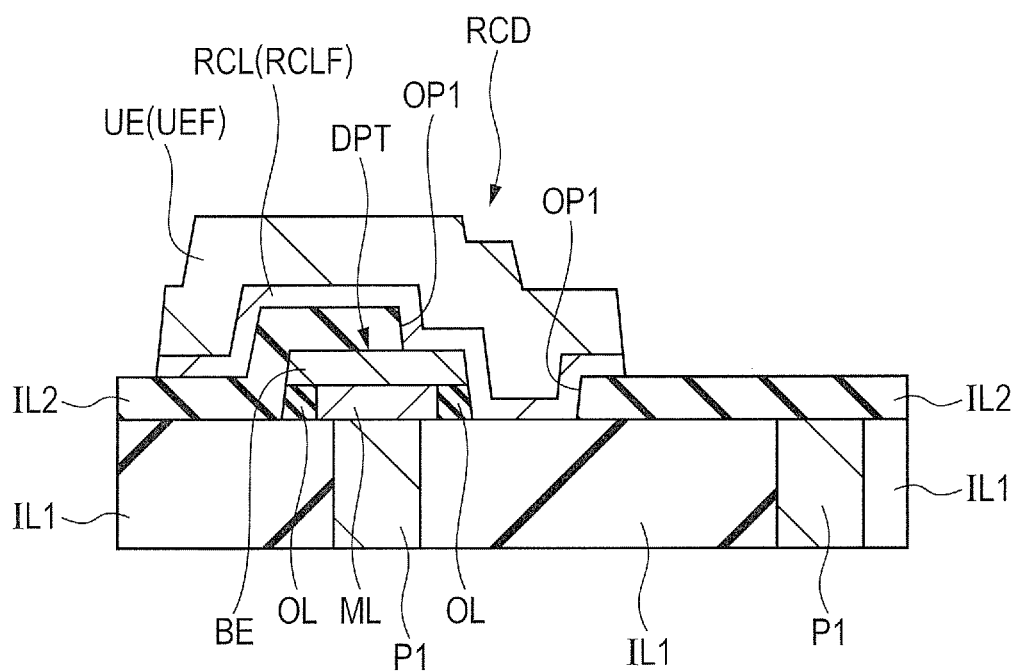
FIG. 15 is a main-portion cross-sectional view of the semiconductor device during the manufacturing process thereof, which is subsequent to FIG. 14.

Next, over the electrode film UEF, using a photolithographic technique, a photoresist pattern (not shown) is formed. Then, using the photoresist pattern as an etching mask, the electrode film UEF and the resistance change film RCLF are etched (by dry etching). As a result, as shown in FIG. 15, a multi-layer film including the electrode film UEF and the resistance change film RCLF is patterned to form the resistance change layer RCL made of the patterned resistance change film RCLF as well as the electrode UE made of the patterned electrode film UEF. Thus, the electrode film UEF and the resistance change film RCLF are simultaneously processed. The two-dimensional shape of the resistance change layer RCL made of the patterned resistance change film RCLF is substantially the same as the two-dimensional shape of the electrode UE made of the patterned electrode film UEF. However, the respective side surfaces of the electrode UE and the resistance change layer RCL may also be tapered. The side surface of the electrode pattern DPT is opposed to the electrode UE via the resistance change layer RCL.

Thus, the resistance change element RCD is formed.

Figure 16:
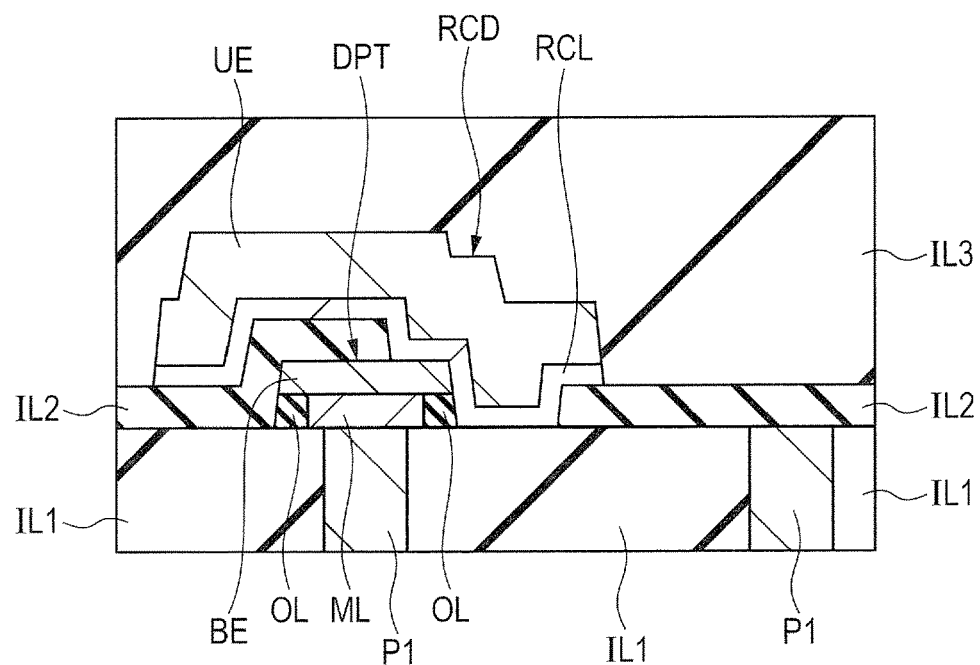
FIG. 16 is a main-portion cross-sectional view of the semiconductor device during the manufacturing process thereof, which is subsequent to FIG. 15.

Next, as shown in FIG. 16, over the insulating film IL2, the insulating film (interlayer insulating film) IL3 is formed so as to cover the resistance change element RCD (electrode UE). As the insulating film IL3, a single-layer insulating film or a multi-layer insulating film can be used. The insulating film IL3 can be formed using a CVD method or the like. For example, a multi-layer film including a silicon nitride film (cover insulating film) and a silicon dioxide film (interlayer insulating film) located thereover can be used as the insulating film IL3. After the formation of the insulating film IL3, as necessary, the upper surface of the insulating film IL3 is planarized using a CMP method or the like.

Figure 17:
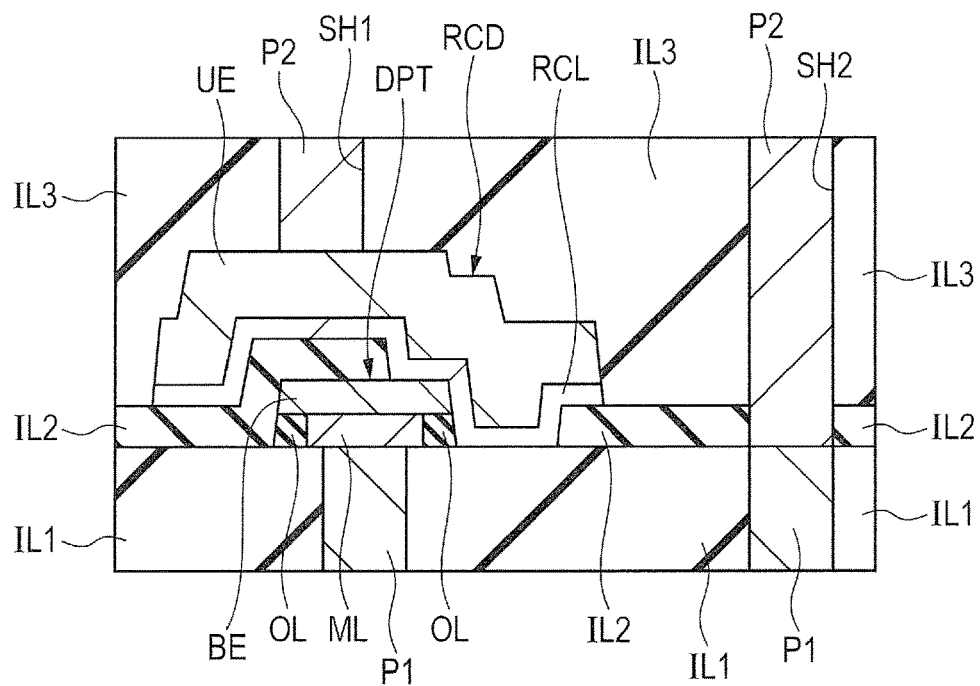
FIG. 17 is a main-portion cross-sectional view of the semiconductor device during the manufacturing process thereof, which is subsequent to FIG. 16.

Next, as shown in FIG. 17, in the insulating film IL3, the conductive plugs (coupling portions) P2 are formed.

Specifically, first, using a photoresist pattern (not shown) over the insulating film IL3 using a photolithographic technique as an etching mask, the insulating film IL3 is dry-etched to be formed with through holes (penetration holes) SH1 and SH2. The through hole SH1 is formed over the electrode UE. From the bottom surface of the through hole SH1, the electrode UE of the resistance change element RCD is exposed. The through hole SH2 is formed over the plug P1 at a two-dimensional position different from that of the plug P1 for the resistance change element RCD. From the bottom surface of the through hole SH2, the upper surface of the plug P1 is exposed. Then, over the insulating film IL3 including the respective bottom surfaces and side walls of the through holes SH1 and SH2, a barrier conductor film is formed. Then, over the barrier conductor film, a main conductor film made of a tungsten film or the like is formed so as to be embedded in the through holes SH1 and SH2. Then, by removing the unneeded main conductor film and the unneeded barrier conductor film which are located outside the through holes SH1 and SH2 by a CMP method, an etch-back method, or the like, the plugs P2 embedded in the through holes SH1 and SH2 can be formed. In plan view, the electrode UE overlaps the plug P2 and, more preferably, the electrode UE includes the plug P2. The plug P2 disposed over the electrode UE, i.e., the plug P2 formed in the through hole SH1 is in contact with and electrically coupled to the electrode UE.

Figure 18:
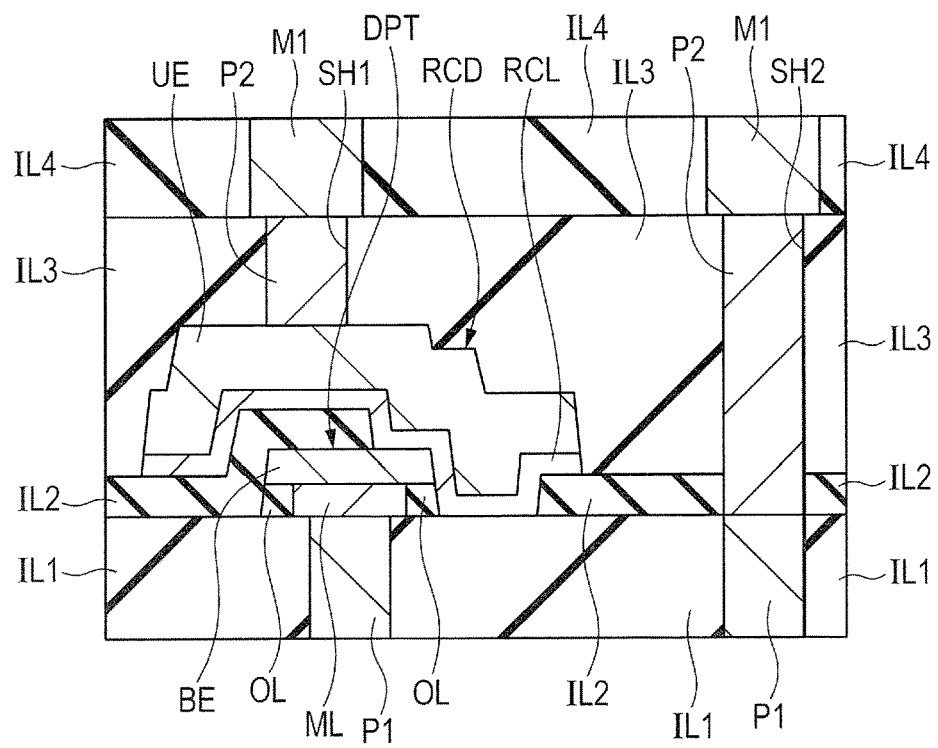
FIG. 18 is a main-portion cross-sectional view of the semiconductor device during the manufacturing process thereof, which is subsequent to FIG. 17.

Next, as shown in FIG. 18, the wires M1 are formed over the insulating film IL3 in which the plugs P2 are embedded. For example, the wires M1 are formed using a damascene technique (which is a single damascene technique herein). Specifically, the wires M1 can be formed by forming an insulating film IL4 over the insulating film IL3 in which the plugs P2 are embedded, forming wire trenches in the insulating film IL4, and then embedding a conductive film in the wire trenches.

Then, second- and subsequent-layer wires are formed by a dual damascene method or the like, but the illustration and description thereof is omitted herein. The wires M1 and the wires in the layers located thereabove are not limited to damascene wires and can also be formed by patterning a conductive film for wires. As the conductive film forming the wires, a metal film containing any of W (tungsten), Al (aluminum), and Cu (copper) as a main component can be used.

In this manner, the semiconductor device including the resistance change element RCD can be manufactured.

The electrode UE of the resistance change element RCD is electrically coupled to the wires M1 via the plug P2 disposed over the electrode UE. The metal material layer ML of the resistance change element RCD is electrically coupled to one of the source/drain regions SD of the cell transistor CT via the plug P1 disposed under the metal material layer ML. Since the metal material layer ML and the electrode BE are in contact with and electrically coupled to each other, the electrode BE of the resistance change element RCD is electrically coupled to one of the source/drain regions SD of the cell transistor CT via the metal material layer ML and the plug P1.

In the resistance change element RCD shown in FIG. 18 described above, over the interlayer insulating film IL1 in which the plugs P1 are embedded, the electrode pattern DPT as the multi-layer body including the metal material layer ML, the oxide layer OL adjacent to the metal material layer ML, and the electrode BE located over each of the metal material layer ML and the oxide layer OL is formed. The electrode pattern DPT corresponds to the foregoing electrode structure DK described with reference to FIGS. 3 and 4 described above. Over the interlayer insulating film IL1, the insulating film IL2 is formed so as to cover the electrode pattern DPT. From the opening OP1 of the insulating film IL2, a portion of the upper surface of the electrode pattern DPT (i.e., a portion of the upper surface of the electrode BE) and the side surface of the electrode pattern DPT (i.e., the respective side surfaces of the electrode BE and the oxide layer OL) are exposed. Over the insulating film IL2 including the inner portion of the opening OP1, the multi-layer body including the resistance change layer RCL and the electrode UE over the resistance change layer RCL is formed. Accordingly, in the opening OP1, the multi-layer body including the resistance change layer RCL and the electrode UE over the resistance change layer RCL is formed so as to cover the electrode pattern DPT. Consequently, the surfaces of the electrode BE (i.e., the portion of the upper surface and the side surface thereof) which are exposed from the opening OP1 and the surface of the oxide layer OL (side surface thereof) which is exposed from the opening OP1 are in contact with the resistance change layer RCL to be opposed to the electrode UE with the resistance change layer RCL being interposed therebetween. Between the portion of the electrode BE which is covered with the insulating film IL2 and the electrode UE, not only the resistance change layer RCL, but also the insulating film IL2 is interposed. Between the metal material layer ML and the resistance change layer RCL, the oxide layer OL is interposed so that the metal material layer ML is not in contact with the resistance change layer RCL. Since the oxide layer OL is not conductive and has an insulating property, the oxide layer OL does not function as the electrode of the resistance change element RCD. In the electrode pattern DPT, a conductor in contact with the resistance change layer RCL is the electrode BE (the portion of the upper surface and the side surface thereof). The electrode BE functions as one of the electrodes of the resistance change element RCD, while the electrode UE functions as the other electrode of the resistance change element RCD. In the resistance change layer RCL, the foregoing conductor path FLM made of a chain of oxygen defects is formed between the corner portion (corresponding to the corner portion BE3 shown in FIG. 12), which is formed by the lower surface and each of the side surfaces of the electrode BE, and the electrode UE opposed to the corner portion (BE3) with the resistance change layer RCL being interposed therebetween in the region included in the opening OP1 in plan view.

Note that, in FIG. 18, the surface BE1 of the electrode BE shown in each of FIG. 3 described above and FIG. 23 described later is a side surface of the electrode BE, and the surface BE2 of the electrode BE shown in each of FIG. 3 described above and FIG. 23 described later is the lower surface of the electrode BE. On the other hand, in FIG. 18, the surface OL1 of the oxide layer OL shown in each of FIG. 3 described above and FIG. 23 described later is the side surface of the oxide layer OL (side surface thereof in contact with the resistance change layer RCL) and the surface ML2 of the metal material layer ML shown in each of FIG. 3 described above and FIG. 23 described later is the upper surface of the metal material layer ML.

<Main Characteristic Features and Effects>

The semiconductor device in Embodiment 1 includes the electrodes UE and BE spaced apart from each other, the metal material layer ML adjacent to the electrode BE, the oxide layer OL adjacent to each of the metal material layer ML and the electrode BE, and the resistance change layer RCL disposed continuously between the electrodes UE and BE and between the electrode UE and the oxide layer OL. The resistance change layer RCL is made of a metal oxide. The metal material layer ML is made of a metal or a metal compound. The oxide layer OL is made of an oxide of the material forming the metal material layer ML. The electrode BE is made of ruthenium, ruthenium oxide, iridium, iridium oxide, platinum, gold, or copper. The free energy of oxide formation of the oxide forming the oxide layer OL is higher than the free energy of oxide formation of the oxide forming the resistance change layer RCL.

One of the main characteristic features of the semiconductor device in Embodiment 1 is that the resistance change element RCD has the oxide layer OL adjacent to the electrode BE, and the resistance change layer RCL is disposed continuously between the electrodes UE and BE and between the electrode UE and the oxide layer OL. The free energy of oxide formation of the oxide forming the oxide layer OL is higher than the free energy of oxide formation of the oxide forming the resistance change layer RCL.

As described above in the foregoing "Study" section, when a metal or a metal compound which is unlikely to be oxidized is used as the material of the electrode BE101 in the resistance change element RCD101 in FIG. 2 described above, as the switching operation is repeated and the number of times the switching operation is performed increases, oxygen ions are gradually stored in the region of the resistance change layer RCL101 which is in the vicinity of the electrode BE101 so that the number of the stored oxygen ions increases. This phenomenon leads to a reduction in the density of oxygen defects in the conductive path FLM101 or the thinning of the conductive path FLM101 when the ON operation is performed. As a result, the low-resistance state of the resistance change element RCD101 is destabilized to degrade the reliability of the semiconductor device.

By contrast, in the present embodiment, the oxide layer OL adjacent to the electrode BE is provided and the resistance change layer RCL is disposed continuously between the electrodes UE and BE and between the electrode UE and the oxide layer OL. Since the free energy of oxide formation of the oxide forming the oxide layer OL is higher than the free energy of oxide formation of the oxide forming the resistance change layer RCL, the oxide layer OL can function to take in (absorb) oxygen (oxygen ions) from the resistance change layer RCL.

As a result, even when oxygen ions are gradually stored in the region of the resistance change layer RCL which is in the vicinity of the electrode BE as the switching operation is repeated and the number of times the switching operation is performed increases, the oxygen ions are taken in (absorbed) by the oxide layer OL. This can limit (reduce) the number of the oxygen ions stored in the vicinity of the electrode BE. That is, the oxide layer OL has the function of adjusting the number of the oxygen ions in the resistance change layer RCL and can limit (reduce) the number of the oxygen ions stored in the vicinity of the electrode BE. Accordingly, when the switching operation is repeated and the number of times the switching operation is performed increases, it is possible to limit (reduce) the number of the oxygen ions stored in the region of the resistance change layer RCL which is in the vicinity of the electrode BE. This can suppress or prevent a problem resulting from an increase in the number of the oxygen ions stored in the region of the resistance change layer RCL which is in the vicinity of the electrode BE. For example, a phenomenon can be suppressed or prevented in which, since the stored oxygen ions readily react with oxygen defects in the conductive path FLM in the resistance change layer RCL, even when the ON operation is performed to form the conductive path FLM, the density of oxygen defects in the conductive path FLM decreases or the conductive path FLM is thinned. This can stabilize the low-resistance state of the resistance change element RCD and improve the reliability of the semiconductor device. This can also increase the number of times the resistance change element RCD can be rewritten and improve the reliability of the retention of the low-resistance state in the resistance change element RCD.

In Embodiment 1, the electrode BE is made of ruthenium, ruthenium oxide, iridium, iridium oxide, platinum, gold, or copper. As the material of the resistance change layer RCL, tantalum oxide, hafnium oxide, or aluminum oxide can be used appropriately. As the material of the metal material layer ML, tantalum nitride, titanium nitride, tungsten, or a compound thereof can be used appropriately. The oxide layer OL is made of an oxide of the material forming the metal material layer ML. When such a material is selected, oxygen ions are not taken in from the resistance change layer RCL by the electrode BE. When the switching operation is repeated, oxygen ions are stored in the region of the resistance change layer RCL which is in the vicinity of the electrode BE. However, since the oxide layer OL takes in (absorbs) the oxygen ions from the resistance change layer RCL, even when the number of times the switching operation is performed increases, the switching operation (especially the ON operation) can reliably be performed. As a result, it is possible to reliably obtain the effect of improving the reliability of the semiconductor device. As a case which is particularly preferable in terms of the combination of the materials, a case can be shown where the electrode BE is made of ruthenium, the resistance change layer RCL is made of tantalum oxide, the metal material layer ML is made of tantalum nitride, and the oxide layer OL is made of tantalum oxynitride.

The oxide layer OL is made of an oxide of the material forming the metal material layer ML. This is because the oxide layer OL is formed through the oxidation of a portion of the metal material layer ML. That is, by oxidizing the metal material layer ML, the oxide layer OL can be formed by self-alignment. Specifically, the oxide layer OL can be formed by forming the multi-layer body (electrode pattern DPT) including the metal material layer ML and the electrode BE over the metal material layer ML and then oxidizing the side surfaces of the metal material layer ML which are included in the side surfaces of the multi-layer body (electrode pattern DPT). When the electrode BE is formed of a material which is less likely to be oxidized than the metal material layer ML, it is possible to selectively oxidize the metal material layer ML and self-alignedly form the oxide layer OL, while preventing the electrode BE from being oxidized. This allows the resistance change element RCD having the oxide layer OL to be formed easily and reliably.

The metal material layer ML is conductive. Accordingly, not only the electrodes UE and BE, but also the metal material layer ML can be used as a conductive path for the resistance change element RCD. For example, by coupling the plug P1 not to the electrode BE, but to the metal material layer ML, it is possible to electrically couple the electrode BE to the plug P1 via the metal material layer ML. This allows a resistance random access memory (ReRAM) to be easily formed using the resistance change element RCD.

The electrode BE has the surface BE1 (first surface) in contact with the resistance change layer RCL, the surface BE2 (second surface) in contact with each of the metal material layer ML and the oxide layer OL, and the corner portion BE3 (first corner portion) formed by the surfaces BE1 and BE2. In the resistance change layer RCL, between the corner portion BE3 of the electrode BE and the electrode UE, the conductive path FLM is formed. That is, the corner portion BE3 of the electrode BE serves as the starting point of the conductive path FLM which is located at the electrode BE.

Since the metal material layer ML and the oxide layer OL are disposed adjacent to the electrode BE (surface BE2) and the resistance change layer RCL is disposed continuously between the electrode UE and the electrode BE (surface BE1) and between the electrode UE and the oxide layer OL (surface OL1), the electrode BE is formed with the corner portion BE3. As a result, when a voltage is applied between the electrodes UE and BE, it is possible to concentrate an electric field on the corner portion BE3 of the electrode BE. This allows the conductive path FLM to be formed between the corner portion BE3 of the electrode BE and the electrode UE using the corner portion BE3 of the electrode BE on which the electric field is concentrated as a starting point (starting point located at the electrode BE). As a result, in any of the memory cells MC, the conductive path FLM can be formed between the corner portion BE3 of the electrode BE and the electrode UE and therefore, in each of the memory cells MC, the conductive path FLM can be formed at the same position in the resistance change layer RCL. This can suppress or prevent variations in low-resistance state in the individual memory cells MC and consequently improve the reliability of the semiconductor device.

As described above, the oxide layer OL functions to take in oxygen ions from the resistance change layer RCL and is likely to take in oxygen ions from the region of the resistance change layer RCL which is relatively close to the oxide layer OL. To prevent the phenomenon in which the oxygen ions stored in the region of the resistance change layer RCL which is in the vicinity of the electrode BE readily react with oxygen defects in the conductive path FLM, it is particularly effective to suppress the storage of oxygen ions at a position close to the starting point of the conductive path FLM which is located at the electrode BE (corner portion BE3 of the electrode BE). This is because, when the number of the oxygen ions stored at the position in the resistance change layer RCL which is close to the starting point of the conductive path FLM (corner portion BE3 of the electrode BE) located at the electrode BE is small, the phenomenon in which the stored oxygen ions readily react with oxygen defects in the conductive path FLM is less likely to occur. Accordingly, it is desirable that the oxide layer OL is disposed close to the starting point of the conductive path FLM which is located at the electrode BE. By thus disposing the oxide layer OL, it is possible to reduce the number of the oxygen ions stored at the position close to the starting point of the conductive path FLM which is located at the electrode BE and more reliably suppress or prevent the phenomenon in which the stored oxygen ions readily react with oxygen defects in the conductive path FLM.

In Embodiment 1, the metal material layer ML and the oxide layer OL are disposed adjacent to the electrode BE (surface BE2) and the resistance change layer RCL is disposed continuously between the electrode UE and the electrode BE (surface BE1) and between the electrode UE and the oxide layer OL (surface OL1). Accordingly, the oxide layer OL is proximate to the corner portion BE3 of the electrode BE. Consequently, the oxide layer OL is disposed close to the corner portion BE3 of the electrode BE serving as the starting point of the conductive path FLM which is located at the electrode BE. As a result, it is possible to reduce the number of the oxygen ions stored at a position close to the starting point of the conductive path FLM which is located at the electrode BE. This can more reliably suppress or prevent the phenomenon in which the stored oxygen ions readily react with oxygen defects in the conductive path FLM. Therefore, it is possible to more efficiently improve the reliability of the semiconductor device.

<Modifications>

Next, a description will be given of modifications of the resistance change element RCD in Embodiment 1. Note that each of the modifications described herein is applicable not only to Embodiment 1, but also to Embodiments 2 to 5 described later.

Figure 19:
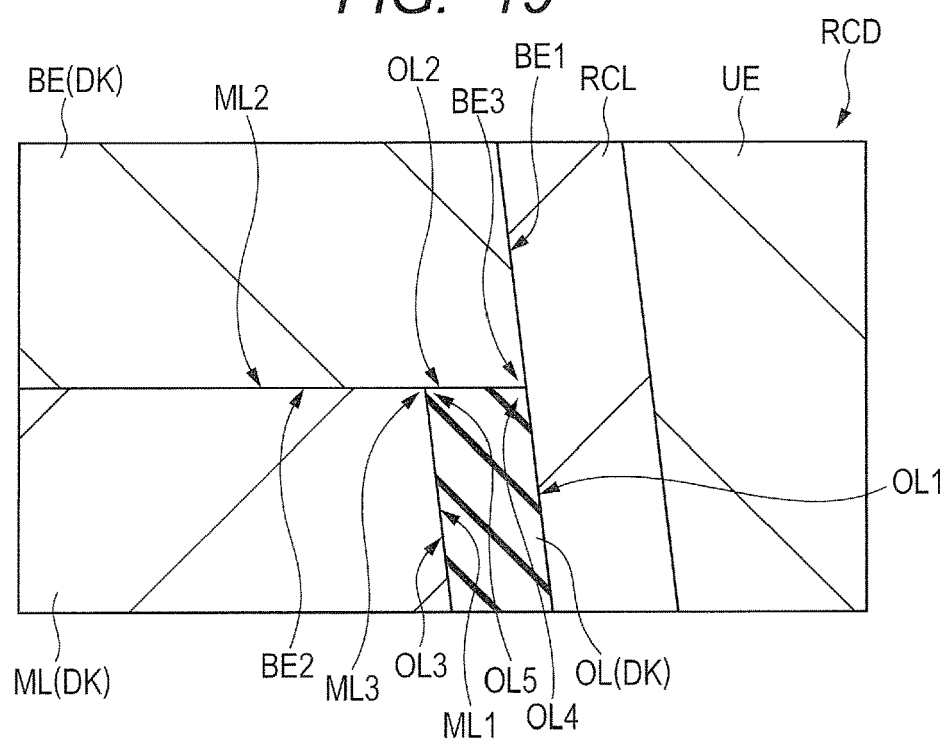
FIG. 19 is a cross-sectional view schematically showing a resistance change element in a first modification.

FIG. 19 is a cross-sectional view schematically showing the resistance change element RCD in the first modification, which is equivalent to FIG. 3 described above.

In the case in FIG. 3 described above, the angle formed between the surface BE1 (surface BE1 in contact with the resistance change layer RCL) of the electrode BE and the surface BE2 (surface in contact with each of the metal material layer ML and the oxide layer OL) of the electrode BE, i.e., the angle of the corner portion BE3 is approximately 90°.

By contrast, in the case in the first modification shown in FIG. 19, the angle formed between the surface BE1 (surface BE1 in contact with the resistance change layer RCL) of the electrode BE and the surface BE2 (surface in contact with each of the metal material layer ML and the oxide layer OL) of the electrode BE, i.e., the angle of the corner portion BE3 is less than 90°. That is, the corner portion BE3 of the electrode BE has an acute angle. In other words, the surface BE1 of the electrode BE is inclined at a predetermined angle from a surface perpendicular to the surface BE2 of the electrode BE. Note that, to achieve this, when the electrode pattern DPT is formed by patterning the multi-layer film including the electrode film BEF and the metal material film MLF in the step shown in FIG. 9 described above, etching may appropriately be performed so as to taper the side surfaces of the electrode pattern DPT.

Alternatively, when an electrode pattern DPT2 is formed by patterning the multi-layer film including a metal material film MLF2, the electrode film BEF, and the metal material film MLF in the step shown in FIG. 26 described later, etching may appropriately be performed so as to taper the side surfaces of the electrode pattern DPT2. Still alternatively, when through holes SH3 are formed in the step shown in FIG. 36 described later, etching may appropriately be performed so as to taper the side surfaces of the through holes SH3. Since the angle of the corner portion BE3 of the electrode BE is less than 90°, the angle formed between the surfaces OL1 and OL2 of the oxide layer OL, i.e., the angle of the corner portion OL4 is larger than 90°.

As described above, when a voltage is applied between the electrodes BE and UE, an electric field is concentrated on the corner portion BE3 of the electrode BE. Accordingly, the conductive path FLM can be formed between the corner portion BE3 of the electrode BE and the electrode UE using the corner portion BE3 of the electrode BE on which the electric field is concentrated as a starting point (starting point located at the electrode BE). As a result, in each of the memory cells MC, the conductive path FLM can be formed at the same position in the resistance change layer RCL. This can suppress or prevent variations in low-resistance state in the individual memory cells MC and thus improve the reliability of the semiconductor device.

In the case in the first modification shown in FIG. 19, the angle formed between the surfaces BE1 and BE2 of the electrode BE, i.e., the angle of the corner portion BE3 is set to be less than 90°. Accordingly, when a voltage is applied between the electrodes BE and UE, it is possible to more densely concentrate an electric field on the corner portion BE3 of the electrode BE. As a result, the conductive path FLM can more reliably be formed between the corner portion BE3 of the electrode BE and the electrode UE. This can reliably suppress or prevent variations in low-resistance state in the individual memory cells MC and thus further improve the reliability of the semiconductor device. In the case in the first modification shown in FIG. 19, the angle formed between the surfaces BE1 and BE2 of the electrode BE, i.e., the angle of the corner portion BE3 is set to be less than 90°. More preferably, the angle of the corner portion B3 is set to be less than 80°.

Figure 20:
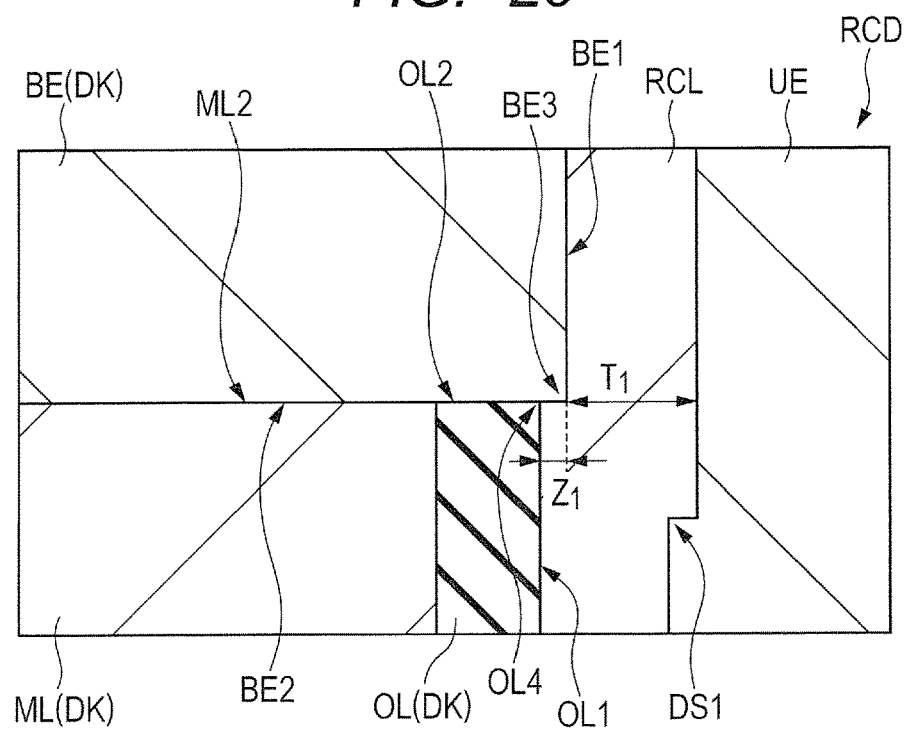
FIG. 20 is a cross-sectional view schematically showing a resistance change element in a second modification.

FIG. 20 is a cross-sectional view schematically showing the resistance change element RCD in the second modification, which is equivalent to FIG. 3 described above.

In the case in FIG. 3 described above, the surface BE1 (surface BE1 in contact with the resistance change layer RCL) of the electrode BE is hardly misaligned with the surface OL1 (surface OL1 in contact with the resistance change layer RCL) of the oxide layer OL. Between the surface BE1 of the electrode BE and the surface OL1 of the oxide layer OL, substantially no step is formed. That is, the surface BE1 of the electrode BE is aligned with (matches) the surface OL1 of the oxide layer OL. As a result, the corner portion BE3 of the electrode BE is adjacent to the corner portion OL4 of the oxide layer OL. The distance (shortest distance) from the corner portion BE3 of the electrode BE to the electrode UE via the resistance change layer RCL is substantially equal to the distance (shortest distance) from the corner portion OL4 of the oxide layer OL to the electrode UE via the resistance change layer RCL.

By contrast, in the case in the second modification shown in FIG. 20, the surface BE1 (surface BE1 in contact with the resistance change layer RCL) of the electrode BE is misaligned with the surface OL1 (surface OL1 in contact with the resistance change layer RCL) of the oxide layer OL. That is, the surface OL1 of the oxide layer OL is set back from the surface BE1 of the electrode BE in a direction away from the electrode UE. Consequently, between the surface BE1 of the electrode BE and the surface OL1 of the oxide layer OL, a step is formed. The step is formed of a portion of the surface BE2 of the electrode BE. The corner portion OL4 of the oxide layer OL is set back from the corner portion BE3 of the electrode BE in the direction away from the electrode UE. The distance (shortest distance) from the corner portion BE3 of the electrode BE to the electrode UE via the resistance change layer RCL is smaller than the distance (shortest distance) from the corner portion OL4 of the oxide layer OL to the electrode UE via the resistance change layer RCL.

An amount of misalignment $Z_1$ between the surface BE of the electrode BE and the surface OL1 of the oxide layer OL is shown in FIG. 20. The amount of misalignment $Z_1$ can also be regarded as an amount of misalignment between the corner portion BE3 of the electrode BE and the corner portion OL4 of the oxide layer OL. Note that the amount of misalignment $Z_1$ corresponds to an amount of misalignment when viewed in a direction generally parallel with the thickness direction of the resistance change layer RCL between the electrodes BE and UE. Since the conductive path FLM may be formed in a shortest path extending from the corner portion BE3 of the electrode BE to the electrode UE via the resistance change layer RCL, the amount of misalignment $Z_1$ can also be regarded as an amount of misalignment when viewed in a direction along the conductive path FLM.

As the oxide layer OL is provided closer to the starting point (corner portion BE3 of the electrode BE) of the conductive path FLM which is located at the electrode BE, the effect resulting from the provision of the oxide layer OL is greater. As a result, when the amount of misalignment $Z_1$ increases, the oxide layer OL is further away from the starting point (corner portion BE3 of the electrode BE) of the conductive path FLM which is located at the electrode BE so that the effect resulting from the provision of the oxide layers OL decreases. From this viewpoint, the amount of misalignment $Z_1$ between the surface BE1 of the electrode BE and the surface OL1 of the oxide layer OL is preferably not more than 20% of a thickness $T_1$ of the resistance change layer RCL between the corner portion BE3 of the electrode BE and the electrode UE. That is, $Z_1 \leq T_1 \times 0.2$ is preferably satisfied. This brings the oxide layer OL rather closer to the starting point (corner portion BE3 of the electrode BE) of the conductive path FLM which is located at the electrode BE and thus allows the effect resulting from the provision of the oxide layer OL to be reliably obtained. Note that the thickness $T_1$ of the resistance change layer RCL between the corner portion BE3 of the electrode BE and the electrode UE is equal to the distance (shortest distance) from the corner portion BE3 of the electrode BE to the electrode UE via the resistance change layer RCL. Since the conductive path FLM may be formed in the shortest path extending from the corner portion BE3 of the electrode BE to the electrode UE via the resistance change layer RCL, the thickness $T_1$ can also be regarded as the thickness of the resistance change layer RCL in a direction along the conductive path FLM.

To enhance the effect resulting from the provision of the oxide layer OL, the case shown in FIG. 3 described above and the case in the first modification shown in FIG. 19 described above in each of which the oxide layer OL can easily be brought closer to the corner portion BE3 of the electrode BE are advantageous over the case in the second modification shown in FIG. 20.

Figure 21:
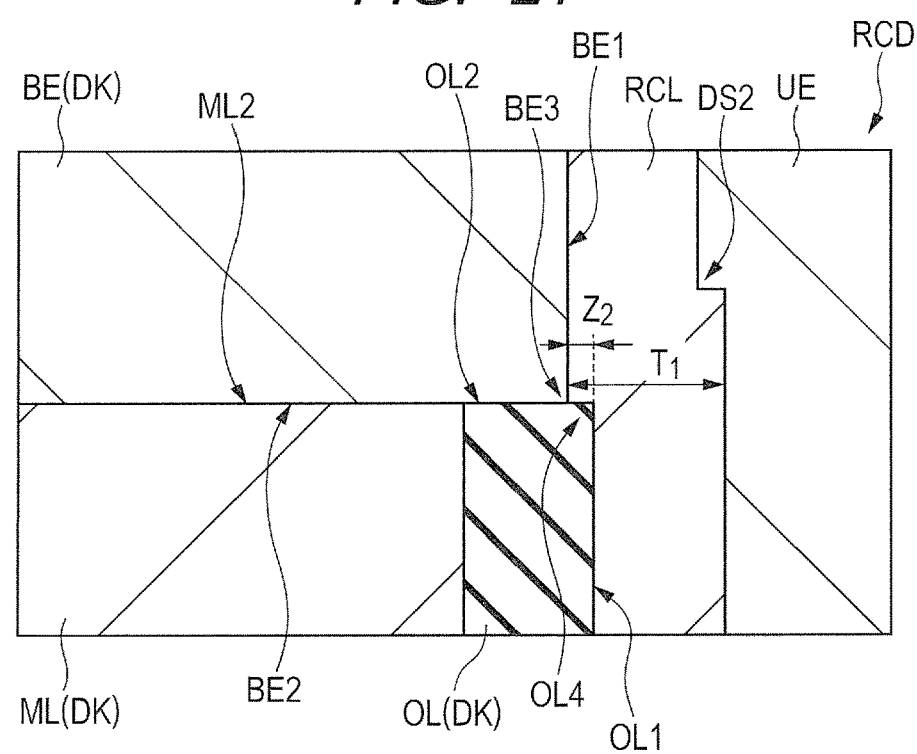
FIG. 21 is a cross-sectional view schematically showing a resistance change element in a third modification.

FIG. 21 is a cross-sectional view schematically showing the resistance change element RCD in a third modification, which is equivalent to FIG. 3 described above.

In the case in the third modification shown in FIG. 21 also, the surface BE1 (surface BE1 in contact with the resistance change layer RCL) of the electrode BE is misaligned with the surface OL1 (surface OL1 in contact with the resistance change layer RCL) of the oxide layer OL. However, in the case in the third modification shown in FIG. 21, the surface OL1 of the oxide layer OL projects from the surface BE1 of the electrode BE in a direction approaching the electrode UE. Consequently, between the surface BE1 of the electrode BE and the surface OL1 of the oxide layer OL, a step is formed. The step is formed of a portion of the surface OL2 of the oxide layer OL. The corner portion OL4 of the oxide layer OL projects from the corner portion BE3 of the electrode BE in the direction approaching the electrode UE. The distance (shortest distance) from the corner portion BE3 of the electrode BE to the electrode UE via the resistance change layer RCL is larger than the distance (shortest distance) from the corner portion OL4 of the oxide layer OL to the electrode UE via the resistance change layer RCL.

An amount of misalignment $Z_2$ between the surface BE1 of the electrode BE and the surface OL1 of the oxide layer OL is shown in FIG. 21. The amount of misalignment $Z_2$ can also be regarded as an amount of misalignment between the corner portion BE3 of the electrode BE and the corner portion OL4 of the oxide layer OL. Note that the amount of misalignment $Z_2$ corresponds to an amount of misalignment when viewed in a direction generally parallel with the thickness direction of the resistance change layer RCL between the electrodes BE and UE. Since the conductive path FLM may be formed in a shortest path extending from the corner portion BE3 of the electrode BE to the electrode UE via the resistance change layer RCL, the amount of misalignment $Z_2$ can also be regarded as an amount of misalignment when viewed in a direction along the conductive path FLM.

In the case in the third modification shown in FIG. 21, the oxide layer OL is adjacent to the starting point (corner portion BE3 of the electrode BE) of the conductive path FLM which is located at the electrode BE. Accordingly, in the same manner as in the case shown in FIG. 3 described above, the effect resulting from the provision of the oxide layer OL can easily be obtained. However, in the case in the third modification shown in FIG. 21, an increase in the amount of misalignment $Z_2$ raises the following concern.

That is, when the amount of misalignment $Z_2$ increases, on the surface of the electrode UE which is in contact with the resistance change layer RCL, a stepped portion (corner portion) DS2 is likely to be formed at a position opposed to the surface BE1 of the electrode BE. When the stepped portion DS2 is large, an electric field is concentrated on the stepped portion DS2 so that the stepped portion DS2 serves as the starting point of the conductive path FLM which is located at the electrode UE. Consequently, the starting point of the conductive path FLM which is located at the electrode BE may undesirably be misaligned from the corner portion BE3 of the electrode BE. To enhance the effect resulting from the provision of the oxide layer OL, it is desirable that the starting point of the conductive path FLM which is located at the electrode BE is close to the oxide layer OL. Therefore, it is desirable that the corner portion BE3 of the electrode BE serves as the starting point of the conductive path FLM which is located at the electrode BE.

Accordingly, it is desirable to prevent the stepped portion DS2 from being formed at a position opposed to the surface BE1 of the electrode BE on the surface of the electrode UE which is in contact with the resistance change layer RCL or reduce the size of the stepped portion DS2 even when the stepped portion DS2 is formed. To achieve this, it is effective to reduce the amount of misalignment $Z_2$. From this viewpoint, the amount of misalignment $Z_2$ between the surface BE1 of the electrode BE and the surface OL1 of the oxide layer OL is preferably not more than 20% of the thickness $T_1$ of the resistance change layer RCL between the corner portion BE3 of the electrode BE and the electrode UE. That is, it is preferable to satisfy $Z_2 \leq T_1 \times 0.2$. This reduces the likelihood of the stepped portion DS2 being formed at the position opposed to the surface BE1 of the electrode BE on the surface of the electrode UE which is in contact with the resistance change layer RCL. As a result, it is possible to more reliably prevent the starting point of the conductive path FLM which is located at the electrode BE from being misaligned with the corner portion BE3 of the electrode BE.

In the case in the second modification shown in FIG. 20 described above, when the amount of misalignment $Z_2$ increases, on the surface of the electrode UE which is in contact with the resistance change layer RCL, a stepped portion (corner portion) DS1 may be formed at a position opposed to the surface OL1 of the oxide layer OL. However, even when the stepped portion DS1 is formed at the position opposed to the surface OL1 of the oxide layer OL and an electric field is concentrated on the stepped portion DS1, the starting point of the conductive path FLM which is located at the electrode BE is kept from being misaligned with the corner portion BE3 of the electrode BE. That is, the formation of the stepped portion DS2 at the position opposed to the surface BE1 of the electrode BE on the electrode UE may cause the misalignment of the starting point of the conductive path FLM which is located at the electrode BE with the corner portion BE3 of the electrode BE. However, the formation of the stepped portion DS1 at the position opposed to the surface OL1 of the oxide layer OL on the electrode UE does not cause the misalignment of the starting point of the conductive path FLM which is located at the electrode BE with the corner portion BE3 of the electrode BE. Accordingly, to more reliably prevent the misalignment of the starting point of the conductive path FLM which is located at the electrode BE with the corner portion BE3 of the electrode BE, the case shown in FIG. 3 described above, the case in the first modification shown in FIG. 19, and the case in the second modification shown in FIG. 20 are advantageous over the case in the third modification shown in FIG. 21.

Note that, in the case shown in FIG. 3 described above, the corner portion BE3 of the electrode BE is in contact with each of the resistance change layer RCL and the oxide layer OL, but is not in contact with the metal material layer ML. In other words, the corner portion BE3 of the electrode BE is surrounded by the resistance change layer RCL and the oxide layer OL. Accordingly, when a voltage is applied between the electrodes BE and UE, an electric field is concentrated on the corner portion BE3 of the electrode BE.

In the case in the second modification shown in FIG. 20 described above, the corner portion BE3 of the electrode BE is in contact with the resistance change layer RCL, but is not in contact with the metal material layer ML. In other words, the corner portion BE3 of the electrode BE is surrounded by the resistance change layer RCL. Accordingly, in the case in the second modification shown FIG. 20 also, when a voltage is applied between the electrodes BE and UE, an electric field is concentrated on the corner portion BE3 of the electrode BE.

In the case in the third modification shown in FIG. 21, the corner portion BE3 of the electrode BE is in contact with each of the resistance change layer RCL and the oxide layer OL, but is not in contact with the metal material layer ML. In other words, the corner portion BE3 of the electrode BE is surrounded by the resistance change layer RCL and the oxide layer OL. Accordingly, in the case in the third modification shown in FIG. 21 also, when a voltage is applied between the electrodes BE and UE, an electric field is concentrated on the corner portion BE3 of the electrode BE.

Figure 22:
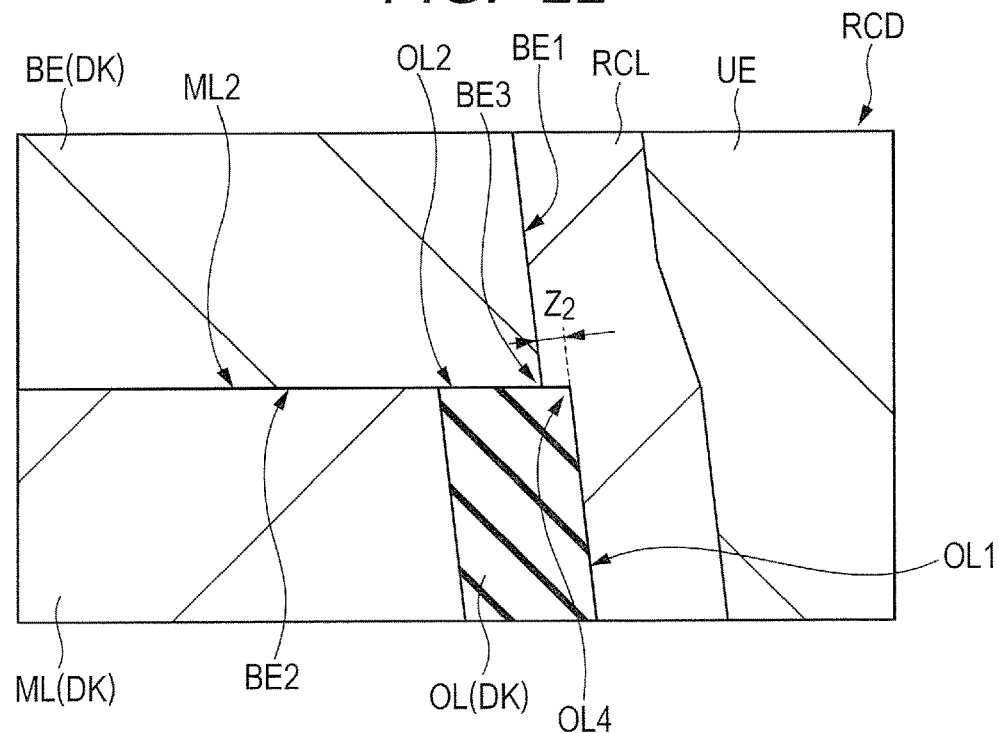
FIG. 22 is a cross-sectional view schematically showing a resistance change element in a fourth modification.

FIG. 22 is a cross-sectional view schematically showing the resistance change element RCD in a fourth modification, which is equivalent to FIG. 3 described above.

The fourth modification shown in FIG. 22 corresponds to the case where, in the third modification shown in FIG. 21, each of the surface BE1 of the electrode BE and the surface OL1 of the oxide layer OL is inclined at a predetermined angle from a surface perpendicular to the surface BE2 of the electrode BE. Accordingly, in the case in the fourth modification shown in FIG. 22, the angle formed between the surfaces BE1 and BE2 of the electrode BE, i.e., the angle of the corner portion BE3 is less than 90°. Since the angle of the corner portion BE3 of the electrode BE is less than 90°, the angle formed between the surfaces OL1 and OL2 of the oxide layer OL, i.e., the angle of the corner portion OL4 is larger than 90°.

When the fourth modification shown in FIG. 22 and the third modification shown in FIG. 21 are compared to each other on the assumption that the amount of misalignment $Z_2$ is the same in each of the two modifications, the foregoing stepped portion DS2 in the electrode UE is less likely to be formed in the fourth modification shown in FIG. 22. This is because, as long as the amount of misalignment $Z_2$ is the same, the slope of the surface of the electrode UE which is in contact with the resistance change layer RCL is gentler in the fourth modification shown in FIG. 22 than in the third modification shown in FIG. 21.

Accordingly, when the angle formed between the surfaces BE1 and BE2 of the electrode BE, i.e., the angle of the corner portion BE3 is set to be less than 90°, not only the effect described with reference to the first modification shown in FIG. 19, but also the following effect can be achieved. That is, when the surface OL1 of the oxide layer OL projects from the surface BE1 of the electrode BE in a direction approaching the electrode UE, on the surface of the electrode UE which is in contact with the resistance change layer RCL, the stepped portion DS2 is less likely to be formed at a position opposed to the surface BE1 of the electrode BE. As a result, the effect of being able to more reliably prevent the misalignment of the starting point of the conductive path FLM which is located at the electrode BE with the corner portion BE3 of the electrode BE can also be obtained. From this viewpoint, in the case in the fourth modification shown in FIG. 22, the angle formed between the surfaces BE1 and BE2 of the electrode BE, i.e., the angle of the corner portion BE3 is set to be less than 90°. More preferably, the angle of the corner portion BE3 is less than 80°.

Embodiment 2

Figure 23:
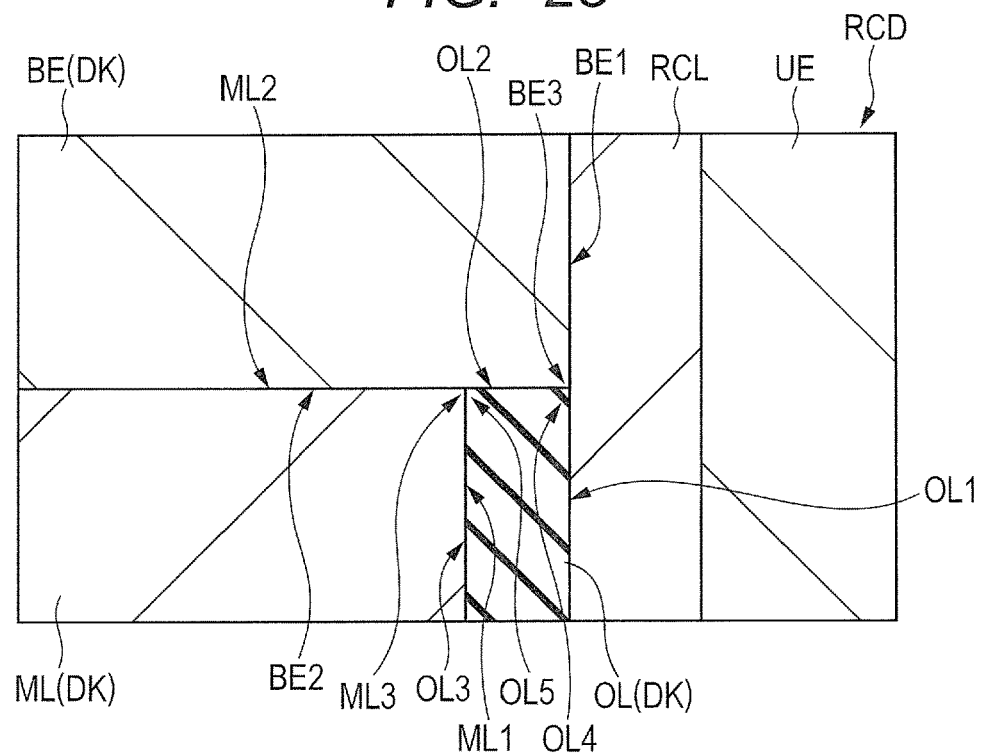
FIG. 23 is a cross-sectional view schematically showing a resistance change element included in a semiconductor device in another embodiment.
Figure 24:
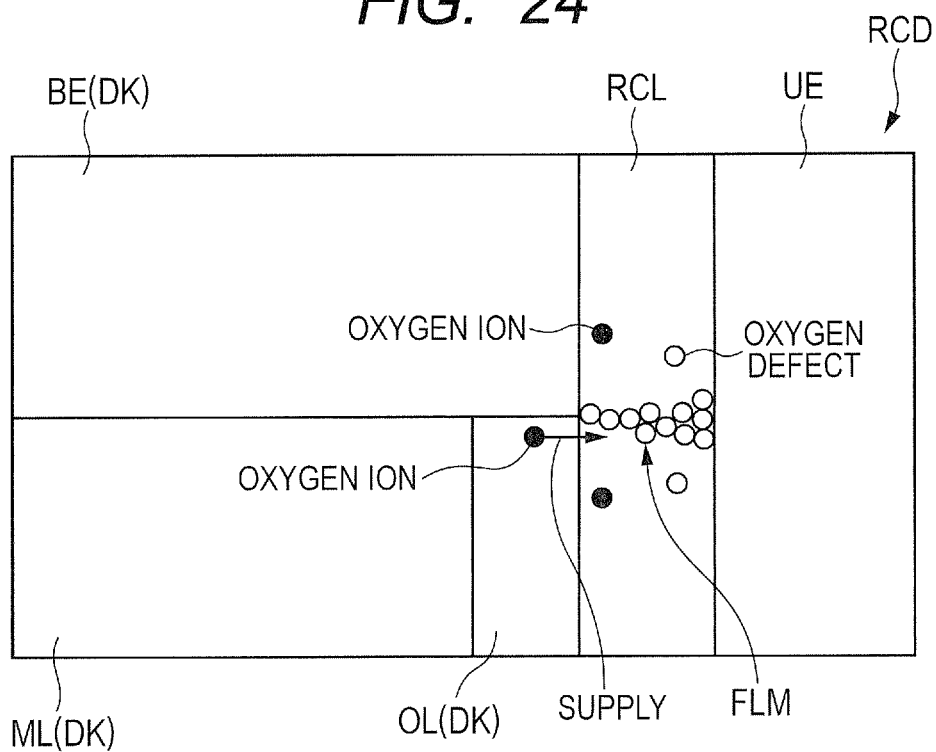
FIG. 24 is a cross-sectional view schematically showing the resistance change element included in the semiconductor device in the other embodiment.

Referring to FIGS. 23 and 24, a description will be given of a structure of the resistance change element RCD in Embodiment 2. FIGS. 23 and 24 are cross-sectional views schematically showing the resistance change element RCD included in a semiconductor device in Embodiment 2, which correspond to FIGS. 3 and 4 described above in Embodiment 1 described above. Note that FIG. 24 shows the same cross-sectional region as shown in FIG. 23 and shows the state (low-resistance state) where the conductive path FLM made of a chain of oxygen defects is formed in the resistance change layer RCL. In the same manner as in FIG. 4 described above, in FIG. 24, the hatching shown in FIG. 23 is omitted for easy recognition of oxygen defects and oxygen ions. Note that, in the same manner as in FIG. 4 described above, in FIG. 24, the oxygen defects in the resistance change layer RCL are schematically shown by blank circles and the oxygen ions in the resistance change layer RCL are schematically shown by solid circles.

The structure of the resistance change element RCD in Embodiment 2 is basically the same as the structure of the resistance change element RCD in Embodiment 1 described above. Accordingly, a repeated description thereof is omitted herein and a description will be given of a point in which the resistance change element RCD in Embodiment 2 is different from the resistance change element RCD in Embodiment 1 described above.

The resistance change element RCD in Embodiment 2 is different from the resistance change element RCD in Embodiment 1 described above in the materials of the individual members included in the resistance change element RCD.

In the resistance change element RCD in Embodiment 2, the electrode BE is made of a conductive material (metal or conductive metal compound). Specifically, in the resistance change element RCD in Embodiment 2, the electrode BE is made of titanium nitride (TiN), tantalum nitride (TaN), tungsten (W), or a compound thereof (a compound of titanium (Ti), tantalum (Ta), and nitrogen (N), a compound of titanium (Ti), tungsten (W), and nitrogen (N), or a compound of tantalum (Ta), tungsten (W), and nitrogen (N)).

In the resistance change element RCD in Embodiment 2, the resistance change layer RCL is made of a metal oxide (oxidized metal). Specifically, the resistance change layer RCL is made of an oxide of a transition metal. For example, tantalum oxide ($TaO_x$) or hafnium oxide ($HfO_x$) can be used appropriately as the material of the resistance change layer RCL. It is particularly preferable to use tantalum oxide (TaO$_x$) as the material of the resistance change layer RCL.

In the resistance change element RCD in Embodiment 2, the metal material layer ML is made of a metal or a conductive metal compound. For example, titanium (Ti), aluminum (Al), or an alloy of titanium (Ti) and aluminum (Al) can be used appropriately as the material of the metal material layer ML. The oxide layer OL is made of an oxide of the material forming the metal material layer ML. This is because the oxide layer OL is formed through the oxidation of a portion of the metal material layer ML. For example, when the metal material layer ML is made of titanium (Ti), the oxide layer OL is made of titanium oxide (TiO$_x$, which is typically TiO$_2$). When the metal material layer ML is made of aluminum (Al), the oxide layer OL is made of aluminum oxide (AlO$_x$, which is typically Al$_2$O$_3$). When the metal oxide layer ML is made of an alloy of titanium (Ti) and aluminum (Al), the oxide layer OL is made of aluminum titanium oxide (Al$_x$Ti$_y$O$_z$).

In the resistance change element RCD in Embodiment 2 also, the electrode UE can be the same as in the resistance change element RCD in Embodiment 1 described above. That is, in Embodiment 2 also, the electrode UE is made of a conductive material (metal or conductive metal compound), though the material thereof is not particularly limited. For example, the electrode UE is made of a multi-layer film including a tantalum (Ta) layer and a tungsten (W) layer.

In Embodiment 1 described above, the oxide layer OL functions to take in oxygen ions from the resistance change layer RCL. By contrast, in Embodiment 2, the oxide layer OL functions to supply oxygen ions to the resistance change layer RCL. Accordingly, in Embodiment 2, the free energy of oxide formation of the oxide forming the oxide layer OL is lower than the free energy of oxide formation of the oxide forming the resistance change layer RCL. That is, the magnitude relationship between the respective free energies of oxide formation of the oxide forming the oxide layer OL and the oxide forming the resistance change layer RCL in Embodiment 2 is reverse to that in Embodiment 1.

The configuration of the resistance change element RCD in Embodiment 2 is otherwise the same as the structure of the resistance change element RCD in Embodiment 1 described above so that a repeated description thereof is omitted herein.

The overall structure (structure shown in FIG. 5) of the semiconductor device in Embodiment 2 and the manufacturing process (process shown in FIGS. 6 to 18) thereof are basically the same as in Embodiment 1 described above. However, in the case in Embodiment 2, in the manufacturing process shown in FIGS. 6 to 18 described above, as the material of the foregoing metal material film MLF, the material described as the material of the metal material layer ML in Embodiment 2 is used. As the material of the foregoing electrode film BEF, the material described as the material of the electrode BE in Embodiment 2 is used. As the material of the foregoing resistance change film RCLF, the material described as the material of the resistance change layer RCL in Embodiment 2 is used.

Next, a description will be given of the characteristic features and effects of the resistance change element RCD in Embodiment 2 in contrast to those in the case in Embodiment 1 described above.

In the case in Embodiment 1 described above, as the material of the electrode BE, a metal or a metal compound which is unlikely to be oxidized is used. Specifically, in the case in Embodiment 1 described above, the electrode BE is made of ruthenium, ruthenium oxide, iridium, iridium oxide, platinum, gold, or copper. When such a material is used as the material of the electrode BE, oxygen ions in the resistance change layer RCL are scarcely taken in by the electrode BE. Consequently, when the switching operation is repeated and the number of times the switching operation is performed increases, a phenomenon may occur in which the oxygen ions are gradually stored in the region of the resistance change layer RCL which is in the vicinity of the electrode BE and the number of the stored oxygen ions increases. Accordingly, in the case in Embodiment 1 described above, to reduce the number of the oxygen ions stored in the region of the resistance change layer RCL which is in the vicinity of the electrode BE, the oxide layer OL is provided with the function of taking in oxygen ions from the resistance change layer RCL.

By contrast, in the case in Embodiment 2, as the material of the electrode BE, a material which may take in oxygen ions from the resistance change layer RCL is used. Specifically, in the case in Embodiment 2, the electrode BE is made of titanium nitride, tantalum nitride, tungsten, or a compound thereof. When such a material is used as the material of the electrode BE, a certain number of oxygen ions may be taken in (may be absorbed) from the resistance change layer RCL by the electrode BE.

During an OFF operation, a voltage higher than that applied to the electrode UE is applied to the electrode BE. At this time, by Joule heat resulting from a current flowing in the conductive path FLM, oxygen is diffused to react with oxygen defects in the conductive path FLM and cause the disconnection of the conductive path FLM. This shifts the resistance change element RCD from the low-resistance state to the high-resistance state. When the application of the high voltage (application of the OFF voltage) to the electrode BE is continued thereafter, oxygen ions are attracted from the resistance change layer RCL toward the electrode BE to which the high voltage is applied. In the case in Embodiment 2, as described above, oxygen ions can be taken in from the resistance change layer RCL by the electrode BE. As a result, even when the switching operation is repeated and the number of times the switching operation is performed increases, since the electrode BE takes in the oxygen ions, the storage of oxygen ions in the region of the resistance change layer RCL which is in the vicinity of the electrode BE is accordingly suppressed. As a result, in the case in Embodiment 2, unless the oxide layer OL is provided, the number of the oxygen ions may be insufficient in the region of the resistance change layer RCL which is in the vicinity of the electrode BE and sufficient oxygen ions required for the OFF operation cannot be obtained. Even when the OFF operation is performed to disconnect the conductive path FLM, the conductive path FLM may not be able to be disconnected successfully. That is, the resistance change element RCD is fixed to the low-resistance state and the OFF operation (a shift from the low-resistance state to the high-resistance state) may not be able to be performed successfully. This degrades the reliability of the semiconductor device and leads to, e.g., a limit to the number of times the resistance change element RCD can be rewritten.

Accordingly, in the case in Embodiment 2, the oxide layer OL is provided with the function of supplying (releasing) oxygen ions to the resistance change layer RCL. That is, in the case in Embodiment 2, the free energy of oxide formation of the oxide forming the oxide layer OL is lower than the free energy of oxide formation of the oxide forming the resistance change layer RCD. This allows the oxide layer OL to function to supply oxygen (oxygen ions) into the resistance change layer RCL during the switching operation.

Accordingly, even when oxygen ions are taken in from the resistance change layer RCL by the electrode BE as the switching operation is repeated and the number of times the switching operation is performed increases, by supplying oxygen ions from the oxide layer OL to the resistance change layer RCL, it is possible to ensure a certain number of oxygen ions in the vicinity of the electrode BE. That is, the oxide layer OL has the function of adjusting the number of the oxygen ions in the resistance change layer RCL and can increase the number of the oxygen ions in the vicinity of the electrode BE. Consequently, when the switching operation is repeated and the number of times the switching operation is performed increases, it is possible to prevent the number of the oxygen ions in the resistance change layer RCL from becoming insufficient and obtain the oxygen ions required for the OFF operation. As a result, when the OFF operation is performed, it is possible to cause the oxygen ions to react with oxygen defects in the conductive path FLM and reliably disconnect the conductive path FLM. That is, even when the switching operation is repeated and the number of times the switching operation is performed increases, the OFF operation (a shift from the low-resistance state to the high-resistance state) can reliably be performed. Therefore, it is possible to improve the reliability of the semiconductor device. For example, the number of times the resistance change element RCD can be rewritten can be increased.

In Embodiment 2, the electrode BE is made of titanium nitride, tantalum nitride, tungsten, or a compound thereof. As the material of the resistance change layer RCL, tantalum oxide or hafnium oxide can be used appropriately. As the material of the metal material layer ML, titanium, aluminum, or an alloy of titanium and aluminum can be used appropriately. The oxide layer OL is made of an oxide of the material forming the metal material layer ML. When such a material is selected and the switching operation is repeated, a certain number of oxygen ions are taken in from the resistance change layer RCL by the electrode BE. However, since the oxide layer OL supplies oxygen ions to the resistance change layer RCL, even when the number of times the switching operation is repeated increases, the switching operation (especially the OFF operation) can reliably be performed. Therefore, it is possible to reliably obtain the effect of improving the reliability of the semiconductor device. As a case which is particularly preferable in terms of the combination of the materials, a case where the electrode BE is made of titanium nitride, the resistance change layer RCL is made of tantalum oxide, the metal material layer ML is made of titanium, and the oxide layer OL is made of titanium oxide can be shown.

In Embodiment 2, the oxide layer OL acts to supply oxygen ions into the resistance change layer RCL and is likely to supply oxygen ions into the region of the resistance change layer RCL which is relatively close to the oxide layer OL. For the oxygen ions supplied from the oxide OL to serve to disconnect the filament during the OFF operation, it is particularly effective to supply oxygen ions from the oxide layer OL to a place close to the starting point (corner portion BE3 of the electrode BE) of the conductive path FLM which is located at the electrode BE. Accordingly, it is desirable that the oxide layer OL is disposed close to the starting point of the conductive path FLM which is located at the electrode BE. This allows oxygen ions to be supplied from the oxide layer OL to a place close to the starting point of the conductive path FLM which is located at the electrode BE. When the OFF operation is performed, it is possible to cause the oxygen ions to react with oxygen defects in the conductive path FLM and reliably disconnect the conductive path FLM.

In Embodiment 2, the metal material layer ML and the oxide layer OL are disposed adjacent to the electrode BE (surface BE2) and the resistance change layer RCL is disposed continuously between the electrode UE and the electrode BE (surface BE1) and between the electrode UE and the oxide layer OL (surface OL1). Accordingly, the oxide layer OL is proximate to the corner portion BE3 of the electrode BE. Consequently, the oxide layer OL is disposed close to the corner portion BE3 of the electrode BE serving as the starting point of the conductive path FLM which is located at the electrode BE. This allows oxygen ions to be supplied from the oxide layer OL to a place close to the starting point of the conductive path FLM which is located at the electrode BE. As a result, even when the number of times the switching operation is repeated increases, the switching operation (especially the OFF operation) can more reliably be performed. Therefore, it is possible to efficiently improve the reliability of the semiconductor device.

The other characteristic features and effects of the resistance change element RCD in Embodiment 2 are substantially the same as in Embodiment 1 described above.

Thus, in Embodiment 1 described above and Embodiment 2, the oxide layer OL is provided, and the function of the oxide layer OL is selectively used in accordance with a material selected for the electrode BE. In the case in Embodiment 1 described above, the electrode BE is made of ruthenium, ruthenium oxide, iridium, iridium oxide, platinum, gold, or copper. In this case, the electrode BE is less likely to take in oxygen ions from the resistance change layer RCL. Consequently, when the switching operation is repeated, the number of the oxygen ions stored in the region of the resistance change layer RCL which is in the vicinity of the electrode BE may be excessive and therefore the oxide layer OL having the function of taking in oxygen ions from the resistance change layer RCL is provided. On the other hand, in the case in Embodiment 2, the electrode BE is made of titanium nitride, tantalum nitride, tungsten, or a compound thereof. In this case, the electrode BE is more likely to take in oxygen ions from the resistance change layer RCL. Consequently, when the switching operation is repeated, the number of the oxygen ions stored in the region of the resistance change layer RCL which is in the vicinity of the electrode BE may be insufficient and therefore the oxide layer OL having the function of supplying oxygen ions to the resistance change layer RCL is provided. To allow the oxide layer OL to obtain such a function, in Embodiment 1 described above, the free energy of oxide formation of the oxide forming the oxide layer OL is higher than the free energy of oxide formation of the oxide forming the resistance change layer RCL. On the other hand, in Embodiment 2, the free energy of oxide formation of the oxide forming the oxide layer OL is lower than the free energy of oxide formation of the oxide forming the resistance change layer RCL. This can improve the reliability of the semiconductor device in each of Embodiment 1 described above and Embodiment 2 and increase, e.g., the number of times rewriting can be performed to the resistance change element RCD.

Note that each of the modifications described above in Embodiment 1 is also applicable to Embodiment 2.

Embodiment 3

In Embodiment 3, a description will be given of the manufacturing process of a modification of the semiconductor device including the resistance change element RCD with reference to FIGS. 25 to 33. FIGS. 25 to 33 are main-portion cross-sectional views of the modification of the semiconductor device in Embodiment 3 during the manufacturing process thereof. Note that the manufacturing process described in Embodiment 3 is also applicable to the case where the semiconductor device in either Embodiment 1 described above or Embodiment 2 is manufactured.

In Embodiment 3 also, the manufacturing process is the same as the manufacturing process in Embodiment 1 described above until the plugs P1 are formed and the structure shown in FIGS. 6 and 7 described above is obtained. Accordingly, a repeated description thereof is omitted herein. Note that, in FIGS. 25 to 33 also, in the same manner as in FIGS. 7 to 18 described above, the illustration of the structure located below the height position shown by the dotted line TS in FIG. 6 is omitted.

Figure 25:
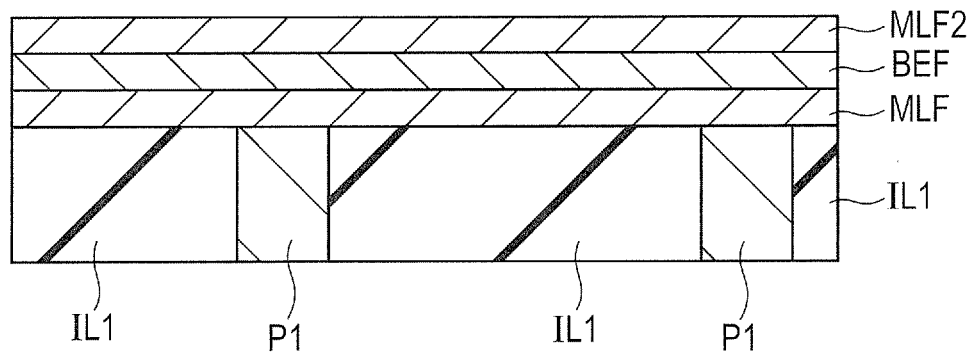
FIG. 25 is a main-portion cross-sectional view of a semiconductor device in a modification during the manufacturing process thereof.

After the plugs P1 are formed and the structure shown in FIG. 7 described above (i.e., the structure shown in FIG. 6 described above) is obtained in the same manner as in Embodiment 1 described above, the respective top surfaces of the plugs P1 and the interlayer insulating film IL1 are etched using an argon (Ar) plasma. This can remove an oxide film from the top surface of each of the plugs P1 and establish an excellent coupling state between the plug P1 and the resistance change element RCD. Then, as shown in FIG. 25, over the interlayer insulating film IL1 in which the plugs P1 are embedded, the metal material film MLF is formed, and then the electrode film BEF is formed over the metal material film MLF. The process up to this stage is the same as in Embodiment 1 described above. Then, in Embodiment 3, as shown in FIG. 25, the metal material film MLF2 is formed over the electrode film BEF. The metal material film MLF2 is made of the same material as that of the metal material film MLF. As a result, over the interlayer insulating film IL1 in which the plugs P1 are embedded, a multi-layer film including the metal material film MLF, the electrode film BEF over the metal material film MLF, and the metal material film MLF2 over the electrode film BEF is formed. The metal material film MLF, the electrode film BEF, and the metal material film MLF2 can be formed by, e.g., a sputtering method or a CVD method. At this time, it is preferable that, after the metal material film MLF is formed, the electrode film BEF and the metal material film MLF2 are deposited continuously, while the metal material film MLF is kept from contact with ambient air and a vacuum state is maintained.

Figure 26:
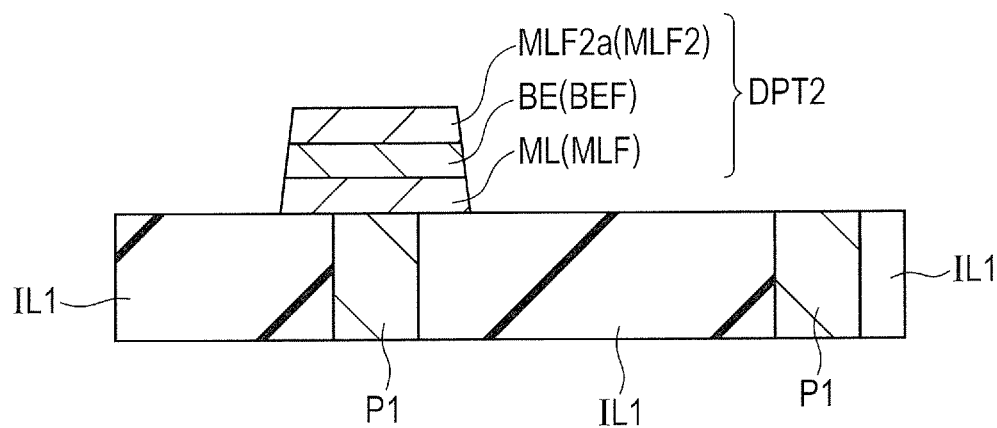
FIG. 26 is a main-portion cross-sectional view of the semiconductor device during the manufacturing process thereof, which is subsequent to FIG. 25.

Next, as shown in FIG. 26, the multi-layer film including the metal material film MLF, the electrode film BEF, and the metal material film MLF2 is patterned to form the electrode pattern DPT2.

The patterning step can be performed as follows. That is, after a photoresist pattern is formed over the metal material film MLF2 using a photolithographic technique, using the photoresist pattern as an etching mask, the metal material film MLF2, the electrode film BEF, and the metal material film MLF are patterned by dry etching to be able to form the electrode pattern DPT2. Alternatively, after an insulating film (a silicon dioxide film, a silicon nitride film, or a multi-layer film thereof) for a hard mask is formed over the metal material film MLF2, a photoresist pattern is formed over the insulating film using a photolithographic technique. Using the photoresist pattern as an etching mask, the insulating film for the hard mask is dry-etched to form the hard mask made of the insulating film. Then, after the photoresist pattern is removed, using the hard mask made of the insulating film as an etching mask, the metal material film MLF2, the electrode film BEF, and the metal material film MLF are patterned by dry etching to be able to form the electrode pattern DPT2.

The electrode pattern DPT2 includes the metal material layer ML, the electrode BE over the metal material layer ML, and a metal material layer MLF2a over the electrode BE. Note that the metal material layer ML is made of the patterned metal material film MLF, the electrode BE is made of the patterned electrode film BEF, and the metal material layer MLF2a is made of the patterned metal material film MLF2. At this process stage, the foregoing oxide layer OL has not been formed yet so that, in the electrode pattern DPT2, the two-dimensional shape of the metal material layer ML is substantially the same as the two-dimensional shape of the electrode BE and the two-dimensional shape of the metal material layer MLF2a. However, the side surfaces of the electrode pattern DPT2 may also be tapered. When the side surfaces of the electrode pattern DPT2 are tapered, the angle formed between each of the side surfaces of the electrode pattern DPT2 and the lower surface of the electrode pattern DPT2 is smaller than 90°. In plan view, the electrode pattern DPT2 overlaps the plug P1. More preferably, the electrode pattern DPT2 includes the plug P1. The plug P1 disposed under the electrode pattern DPT2 is in contact with and electrically coupled to the metal material layer ML of the electrode pattern DPT2.

Figure 27:
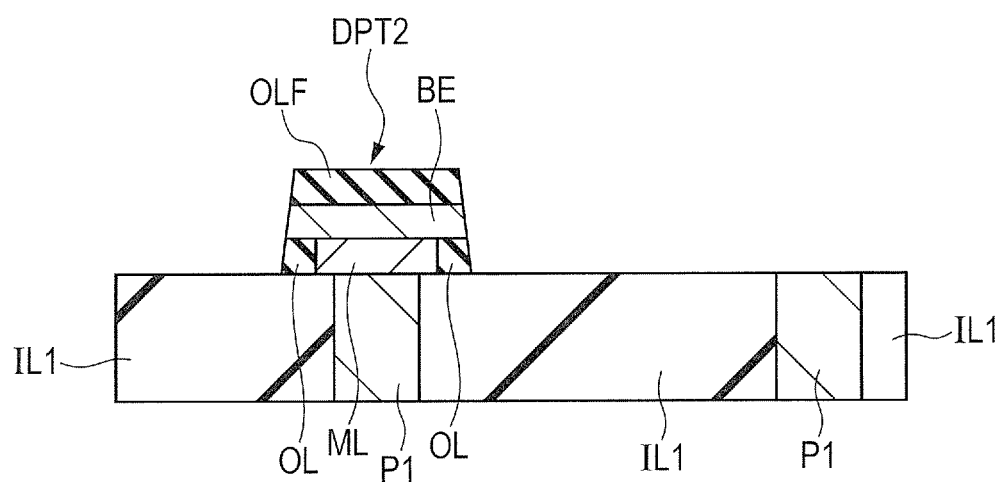
FIG. 27 is a main-portion cross-sectional view of the semiconductor device during the manufacturing process thereof, which is subsequent to FIG. 26.
Figure 28:
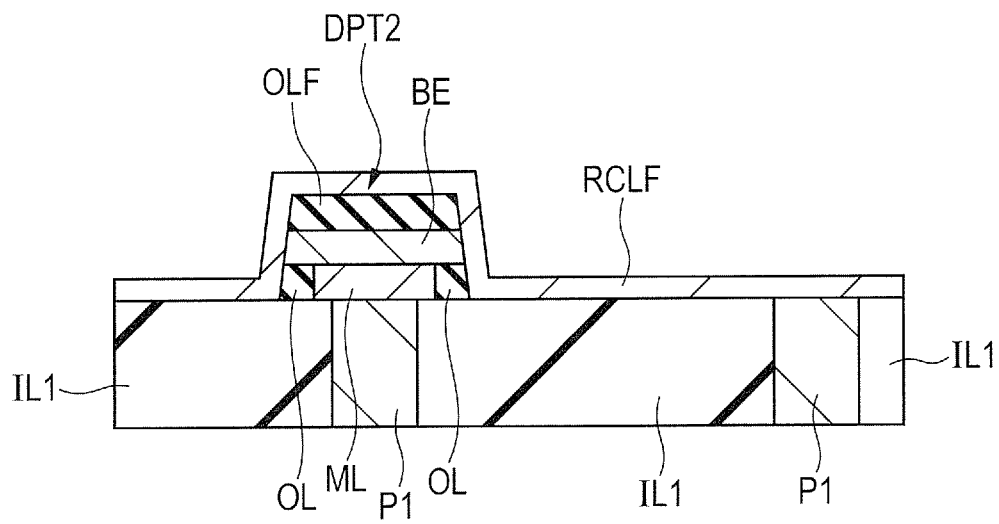
FIG. 28 is a main-portion cross-sectional view of the semiconductor device during the manufacturing process thereof, which is subsequent to FIG. 27.

Next, plasma treatment (oxygen plasma treatment) is performed in an oxygen atmosphere. During the plasma treatment, due to the oxygen affinity difference (difference in Gibbs free energy of oxidation) between each of the metal material layers ML and MLF2a and the electrode BE, the respective exposed surfaces of the metal material layers ML and MLF2a are oxidized, while the exposed surface of the electrode BE is scarcely oxidized. That is, the Gibbs free energy of oxidation is lower in the material forming the metal material layers ML and MLF2a than in the material forming the electrode BE, and each of the metal material layers ML and MLF2a has an oxygen affinity higher than that of the electrode BE. Accordingly, the metal material layers ML and MLF2a are more likely to be oxidized than the electrode BE. Consequently, the respective exposed surfaces of the metal material layers ML and MLF2a are oxidized, while the exposed surface of the electrode BE, which is less likely to be oxidized, is scarcely oxidized. As a result, when the plasma treatment is performed, as shown in FIG. 27, each of the exposed side surfaces of the metal material layer ML forming the electrode pattern DPT2 is oxidized to form the oxide layer OL. On the other hand, the side and upper surfaces of the metal material layer MLF2a forming the electrode pattern DPT2 are oxidized to form an oxide layer OLF. Over each of the side surfaces of the electrode pattern DPT2, the corner portion (projecting portion) BE3 of the electrode BE adjacent to the oxide layer OL is formed. The corner portion BE3 of the electrode BE is formed between the lower surface and each of the side surfaces of the electrode BE included in the electrode pattern DPT2.

Note that, at the process stage where the electrode pattern DPT2 is formed, the metal material layer ML included in the electrode pattern DPT2 has the upper surface covered with the electrode BE and the lower surface covered with each of the plug P1 and the interlayer insulating film IL, while having the exposed side surfaces. Accordingly, when plasma treatment is performed, each of the side surfaces of the metal material layer ML is selectively oxidized to form the oxide layer OL, while the upper and lower surfaces of the metal material layer ML are not oxidized. The oxide layer OL is formed in each of the side surfaces of the metal material layer ML and adjacent to the metal material layer ML in a horizontal direction.

At the process stage where the electrode pattern DPT2 is formed, the metal material layer MLF2a included in the electrode pattern DPT2 has the lower surface covered with the electrode BE, while having the exposed upper and side surfaces. Accordingly, when the plasma treatment is performed, the upper and side surfaces of the metal material layer MLF2a are oxidized to form the oxide layer OLF. The oxide layer OLF is formed in the upper and side surfaces of the metal material layer MLF2a. The portion of the metal material layer MLF2a which has not been oxidized may also remain inside the oxide layer OLF (i.e., between the oxide layer OLF and the electrode BE). However, there may also be a case where the entire metal material layer MLF2a is oxidized to provide the oxide layer OLF.

The oxide layer OL is formed through the oxidation of a portion (region in the vicinity of each of the side surfaces) of the metal material layer ML included in the electrode pattern DPT2. The oxide layer OLF is formed through the oxidation of a part or the whole of the metal material layer MLF2a included in the electrode pattern DPT2. Accordingly, the oxide layer OL is made of an oxide of the material forming the metal material layer ML, while the oxide layer OLF is made of an oxide of the material forming the metal material layer MLF2a. For example, when the metal material films MLF and MLF2 are made of tantalum nitride (TaN), the metal material layers ML and MLF2a are made of tantalum nitride (TaN), while the oxide layers OL and OLF are made of tantalum oxynitride (TaON) resulting from the oxidation of tantalum nitride (TaN).

Since the electrode BE is formed of a material less likely to be oxidized than the metal material layers ML and MLF2a, even when the plasma treatment is performed, the electrode BE is kept from being oxidized.

When the plasma treatment is performed, the electrode pattern DPT2 includes the metal material layer ML, the oxide layer OL adjacent to the metal material layer ML, the electrode BE over each of the metal material layer ML and the oxide layer OL, and the oxide layer OLF over the electrode BE. However, there may be cases where, between the electrode BE and the oxide layer OLF, a portion of the metal material layer MLF2a remains without being oxidized and where a portion of the metal material layer MLF2a does not remain. Note that, when a portion of the metal material layer MLF2a is not oxidized and remains between the electrode BE and the oxide layer OLF, the remaining portion (unoxidized portion) of the metal material layer MLF2a is surrounded by the oxide layer OLF and the electrode BE and unexposed.

Figure 29:
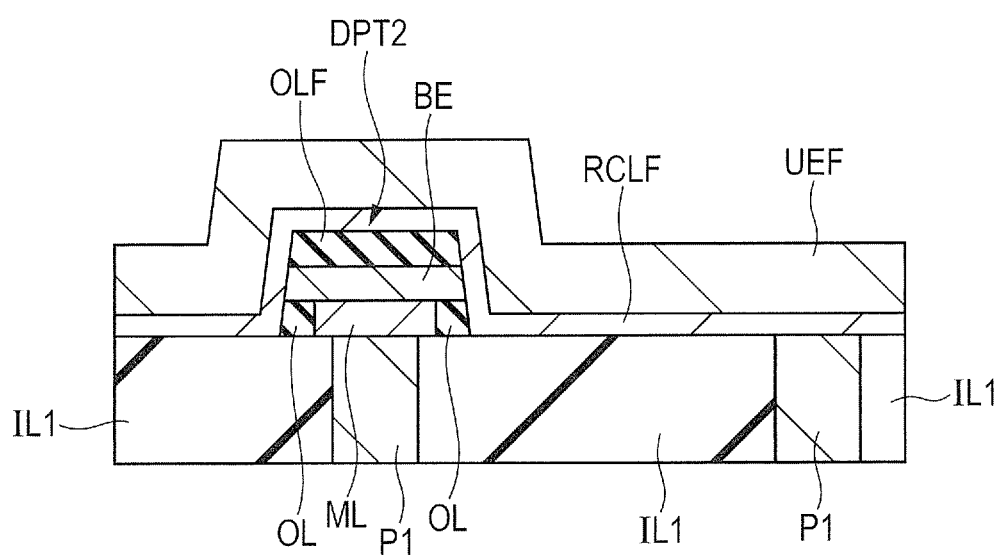
FIG. 29 is a main-portion cross-sectional view of the semiconductor device during the manufacturing process thereof, which is subsequent to FIG. 28.

Next, as shown in FIG. 29, over the interlayer insulating film IL1, the resistance change film RCLF is formed so as to cover the electrode pattern DPT2. The foregoing insulating film IL2 need not be formed in Embodiment 3. The step of forming the resistance change film RCLF is basically the same as in Embodiment 1 described above so that a repeated description thereof is omitted herein.

Next, over the resistance change film RCLF, the electrode film UEF is formed. The step of forming the electrode film UEF is basically the same as in Embodiment 1 described above so that a repeated description thereof is omitted herein.

Figure 30:
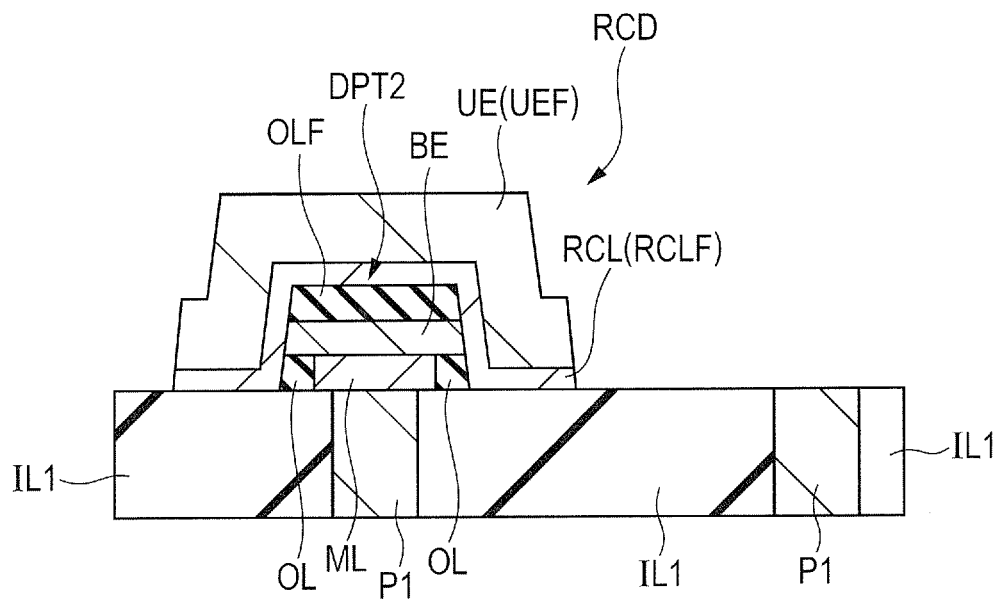
FIG. 30 is a main-portion cross-sectional view of the semiconductor device during the manufacturing process thereof, which is subsequent to FIG. 29.

Next, over the electrode film UEF, using a photolithographic technique, a photoresist pattern (not shown) is formed. Then, using the photoresist pattern as an etching mask, the electrode film UEF and the resistance change film RCLF are etched (by dry etching). As a result, as shown in FIG. 30, the multi-layer film including the electrode film UEF and the resistance change film RCLF is patterned to form the resistance change layer RCL made of the patterned resistance change film RCLF and the electrode UE made of the patterned electrode film UEF. Thus, the electrode film UEF and the resistance change film RCLF are formed by simultaneous processing. The two-dimensional shape of the resistance change layer RCL made of the patterned resistance change film RCLF is substantially the same as the two-dimensional shape of the electrode UE made of the patterned electrode film UEF. However, the respective side surfaces of the electrode UE and the resistance change layer RCL may also be tapered. The side surfaces of the electrode pattern DPT2 are opposed to the electrode UE via the resistance change layer RCL.

In this manner, the resistance change element RCD is formed.

Figure 31:
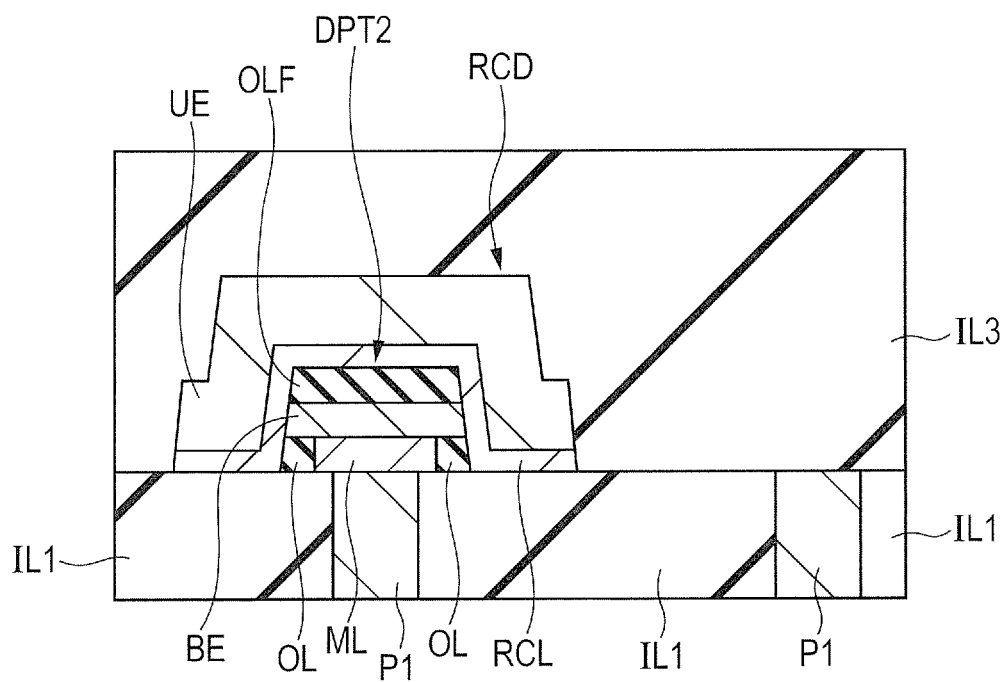
FIG. 31 is a main-portion cross-sectional view of the semiconductor device during the manufacturing process thereof, which is subsequent to FIG. 30.
Figure 32:
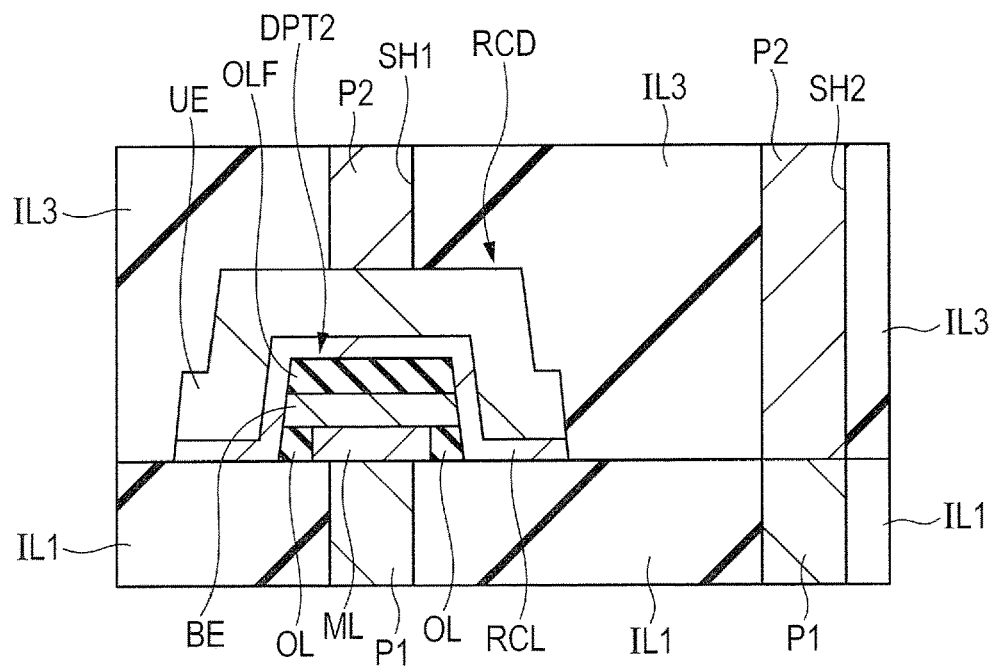
FIG. 32 is a main-portion cross-sectional view of the semiconductor device during the manufacturing process thereof, which is subsequent to FIG. 31.
Figure 33:
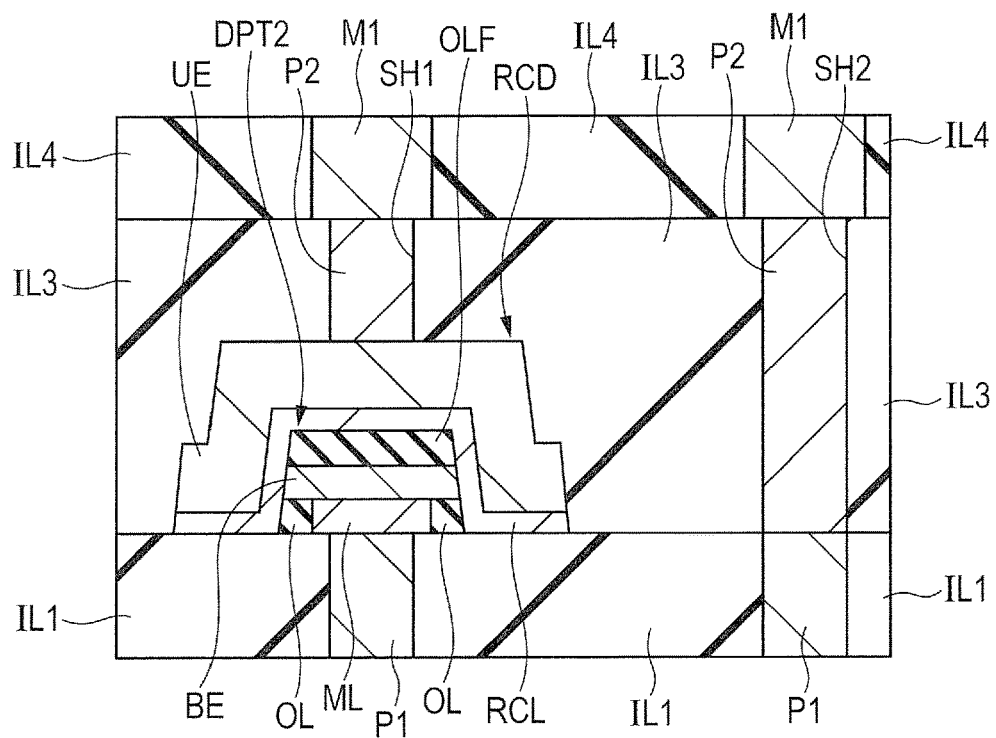
FIG. 33 is a main-portion cross-sectional view of the semiconductor device during the manufacturing process thereof, which is subsequent to FIG. 32.

The subsequent process in Embodiment 3 is the same as in Embodiment 1 described above. That is, as shown in FIG. 31, over the insulating film IL1, an insulating film (interlayer insulating film) IL3 is formed so as to cover the resistance change element RCD. Then, as necessary, the upper surface of the insulating film IL3 is planarized using a CMP method or the like. Then, as shown in FIG. 32, the through holes SH1 and SH2 are formed in the insulating film IL3, and then the conductive plugs P2 are formed in the through holes SH. Then, as shown in FIG. 33, over the insulating film IL3 in which the plugs P2 are embedded, the insulating film IL4 is formed. Then, after wire trenches are formed in the insulating film IL4, the wires M1 are formed in the wire trenches. Subsequently, wires in the second and subsequent layers are formed.

In this manner, the semiconductor device including the resistance change element RCD can be manufactured.

The electrode UE of the resistance change element RCD is electrically coupled to the wires M1 via the plugs P2 disposed over the electrode UE. The metal material layer ML of the resistance change element RCD is electrically coupled to one of the source/drain regions SD of the cell transistor CT (see FIG. described above) via the plug P1 disposed under the metal material layer ML. Since the metal material layer ML and the electrode BE are in contact with and electrically coupled to each other, the electrode BE of the resistance change element RCD is electrically coupled to one of the source/drain regions SD of the cell transistor CT via the metal material layer ML and the plug P1.

In the resistance change element RCD shown in FIG. 33, over the interlayer insulating film IL1 in which the plugs P1 are embedded, the electrode pattern DPT2 is formed which is the multi-layer body including the metal material layer ML, the oxide layer OL adjacent to the metal material layer ML, the electrode BE located over each of the metal material layer ML and the oxide layer OL, and the oxide layer OLF over the electrode BE. Over the interlayer insulating film IL1, the multi-layer body including the resistance change layer RCL and the electrode UE over the resistance change layer RCL is formed so as to cover the electrode pattern DPT2. Accordingly, the upper and side surfaces of the oxide layer OLF, the side surfaces of the electrode BE, and the side surfaces of the oxide layer OL are in contact with the resistance change layer RCL to be opposed to the electrode UE via the resistance change layer RCL. Since the oxide layer OL is interposed between the metal material layer ML and the resistance change layer RCL, the metal material layer ML is not in contact with the resistance change layer RCL. The oxide layers OL and OLF, which are not conductive and have insulating properties, do not function as the electrodes of the resistance change element RCD. In the electrode pattern DPT2, the conductor in contact with the resistance change layer RCL is the electrode BE (side surfaces thereof). The electrode BE functions as one of the electrodes of the resistance change element RCD, while the electrode UE functions as the other electrode of the resistance change element RCD. In the resistance change layer RCL, the foregoing conductive path FLM made of a chain of oxygen defects is formed between the corner portion (BE3) formed by the lower and side surfaces of the electrode BE and the electrode UE opposed to the corner portion (BE3) via the resistance change layer RCL.

The surface BE1 of the electrode BE shown in FIGS. 3 and 23 described above is the side surface of the electrode BE in FIG. 33. The surface BE2 of the electrode BE shown in FIGS. 3 and 23 described above is the lower surface of the electrode BE in FIG. 33. The surface OL1 of the oxide layer OL shown in FIGS. 3 and 23 described above is the side surface (side surface in contact with the resistance change layer RCL) of the oxide layer OL in FIG. 33. The surface ML2 of the metal material layer ML shown in FIGS. 3 and 23 described above is the upper surface of the metal material layer ML in FIG. 33.

Embodiment 4

In Embodiment 4, a description will be given of a case where the resistance change element RCD is applied to a three-dimensional structure.

Figure 34:
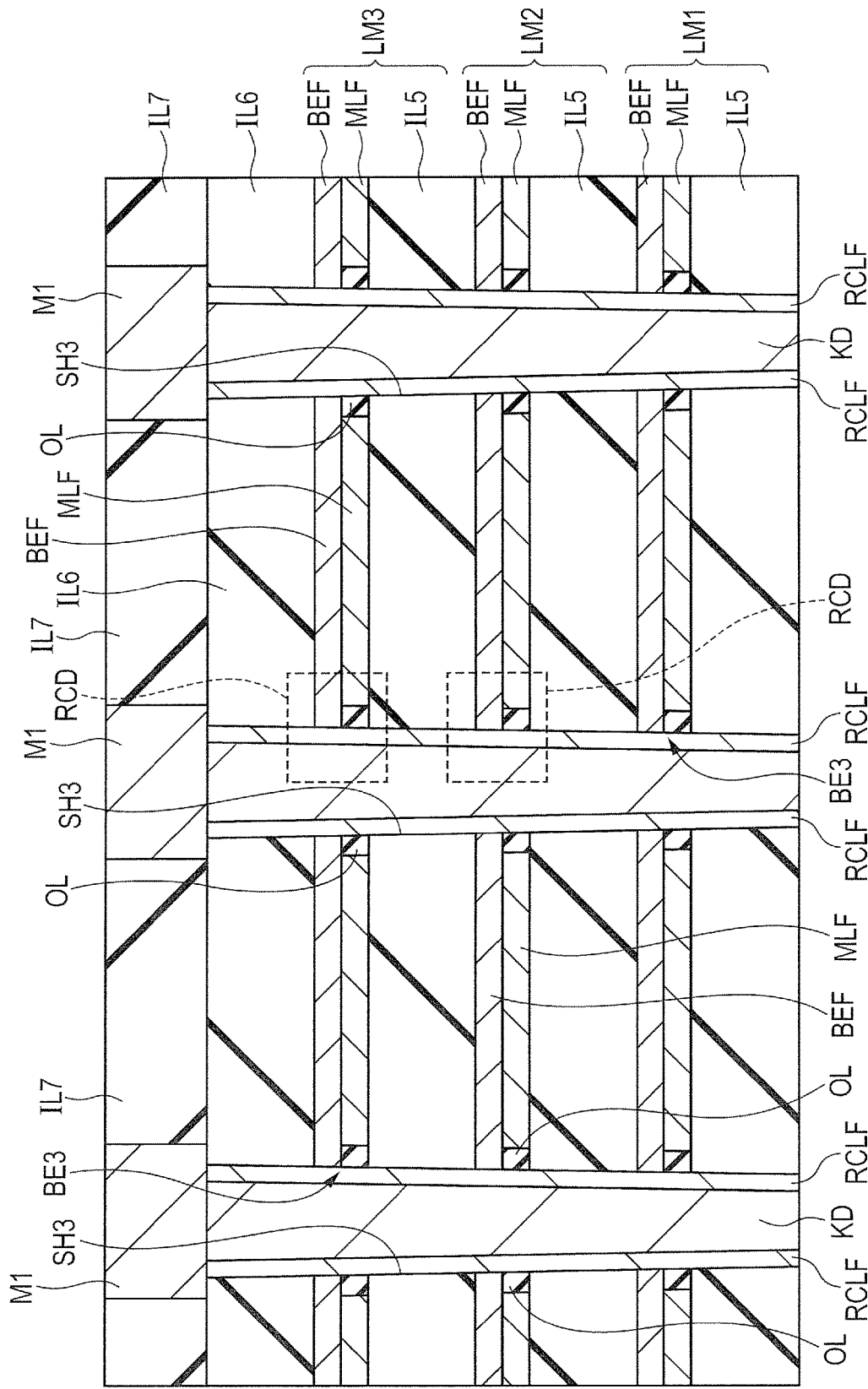
FIG. 34 is a main-portion cross-sectional view showing a semiconductor device in still another embodiment.
Figure 35:
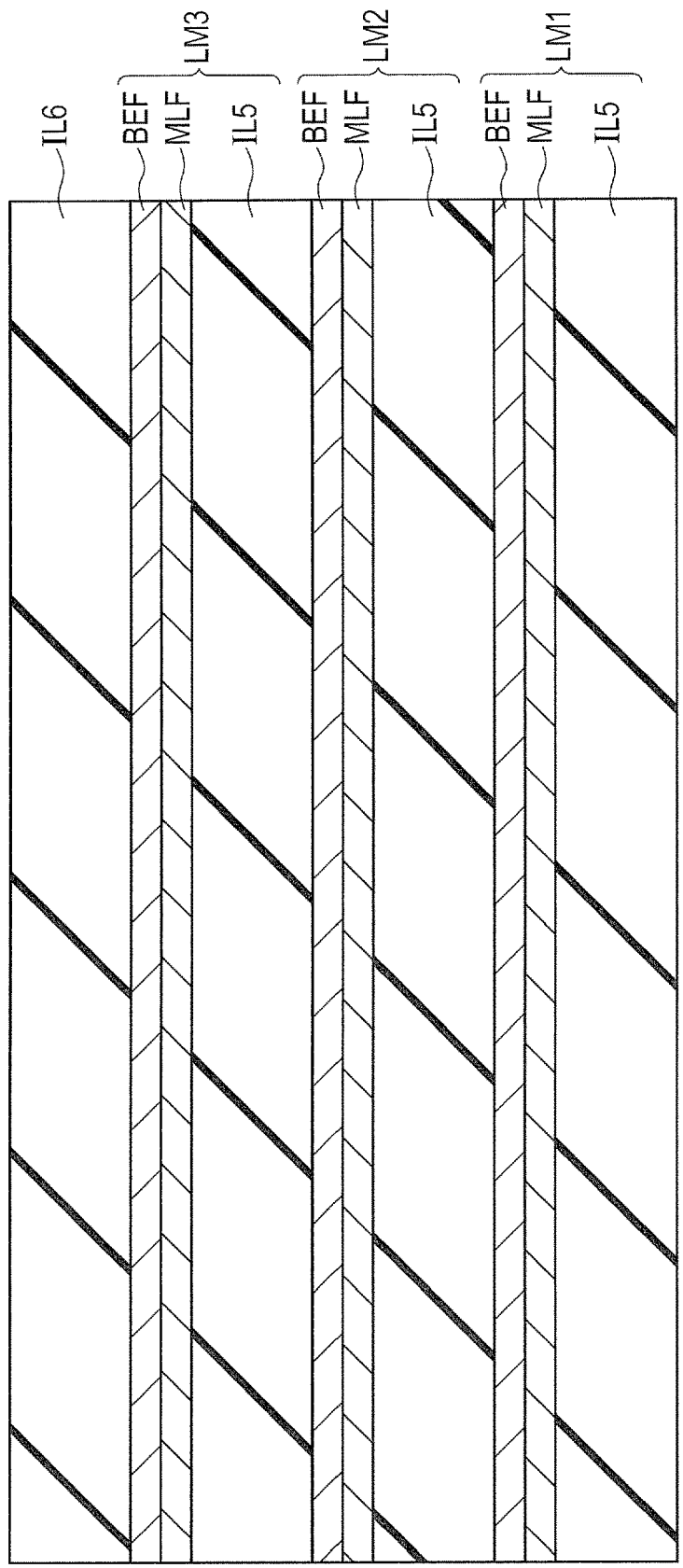
FIG. 35 is a main-portion cross-sectional view of the semiconductor device in the still other embodiment during the manufacturing process thereof.

FIG. 34 is a main-portion cross-sectional view showing a semiconductor device in Embodiment 4. The structure shown in FIG. 34 is formed over a semiconductor substrate but, in FIG. 34, the illustration of the semiconductor substrate is omitted.

In the semiconductor device shown in FIG. 34, the resistance change element RCD is formed at each of the points of intersection of the electrode film BEF and through electrodes KD. Each of the resistance change elements RCD is formed of the electrode film BEF, the resistance change film RCLF, the through electrode KD, the metal material film MLF, and the oxide layer OL. The electrode film BEF functions as one of the electrodes of the resistance change element RCD, while the through electrode KD functions as the other electrode of the resistance change element RCD. The resistance change elements RCD are three-dimensionally arranged in a lateral direction in FIG. 34, in a vertical direction in FIG. 34, and in a direction perpendicular to the paper sheet with FIG. 34.

Next, a description will be given of the manufacturing process of the semiconductor device in Embodiment 4 with reference to FIGS. 35 to 41. FIGS. 35 to 41 are main-portion cross-sectional views of the semiconductor device in Embodiment 4 during the manufacturing process thereof.

After a semiconductor element (not shown) such as a MISFET is formed as necessary in the main surface of the semiconductor substrate (not shown), a multi-layer film including an interlayer insulating film IL5, the metal material film MLF over the interlayer insulating film IL5, and the electrode film BEF over the metal material film MLF is formed over the main surface of the semiconductor substrate so as to cover the semiconductor element. The formation of the multi-layer film is repeated a plurality of times. Note that, in the case shown in FIG. 35, the multi-layer films each including the interlayer insulating film IL5, the metal material film MLF over the interlayer insulating film IL5, and the electrode film BEF over the metal material film MLF are formed in the total of three layers. However, the number of the layers in which the multi-layer films are formed is not limited to 3. Note that the interlayer insulating film IL5 is made of a silicon dioxide film, a silicon oxycarbide film, a silicon oxynitride film, or the like.

Note that the plurality of multi-layer films each including the interlayer insulating film IL5, the metal material film MLF over the interlayer insulating film IL5, and the electrode film BEF over the metal material film MLF are formed over the semiconductor substrate. It is assumed that the first-layer multi-layer film is referred to as a multi-layer film LM1, the second-layer multi-layer film is referred to as a multi-layer film LM2, and the third-layer multi-layer film is referred to as a multi-layer film LM3. Each of the multi-layer films LM1, LM2, and LM3 is the multi-layer film including the interlayer insulating film IL5, the metal material film MLF over the interlayer insulating film IL5, and the electrode film BEF over the metal material film MLF. Over the multi-layer film LM1, the multi-layer film LM2 is formed. Over the multi-layer film LM2, the multi-layer film LM3 is formed. After the multi-layer films LM1, LM2, and LM3 are formed, over the electrode film BEF of the multi-layer film LM, an interlayer insulating film IL6 is formed.

Figure 36:
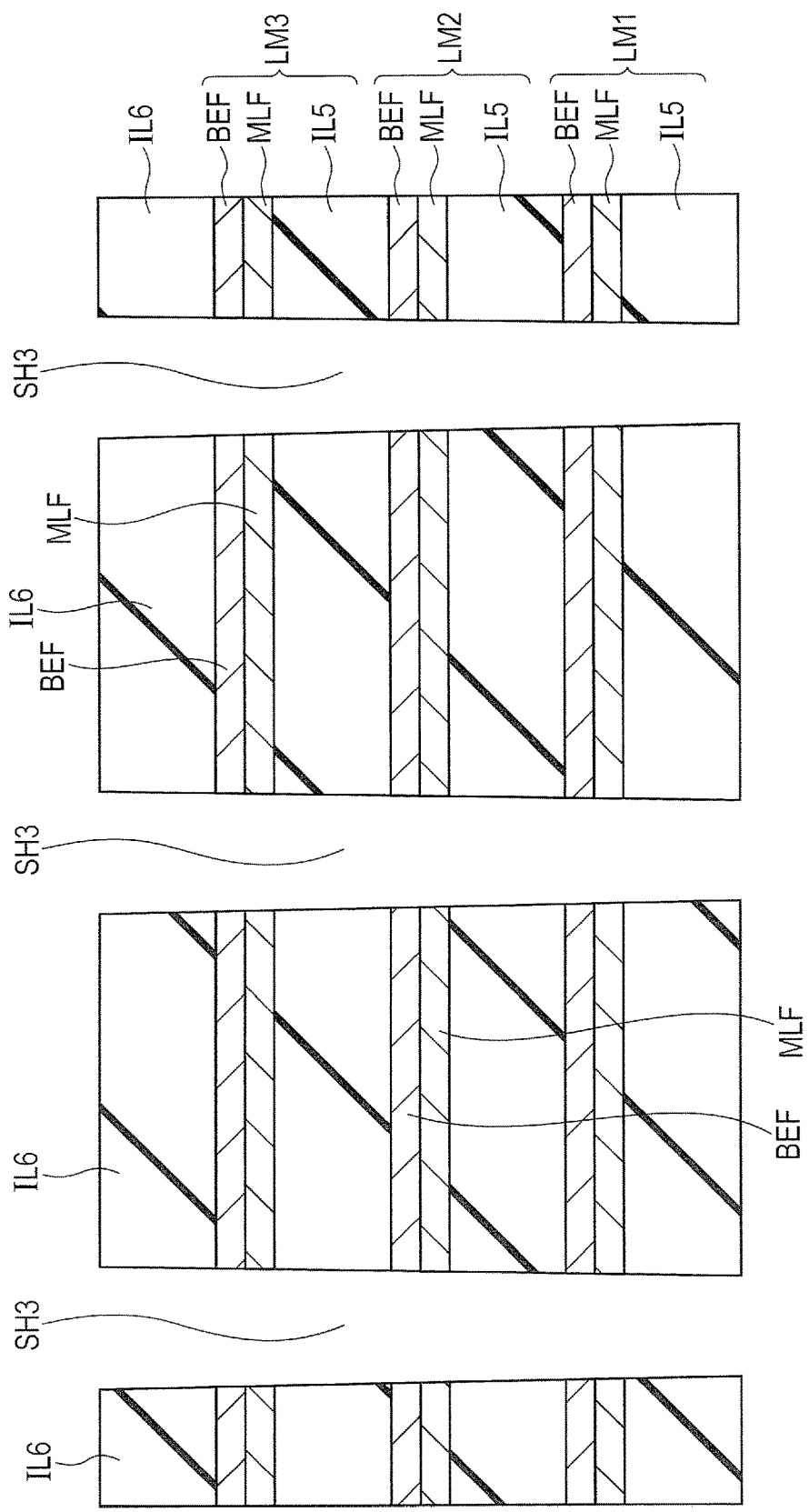
FIG. 36 is a main-portion cross-sectional view of the semiconductor device during the manufacturing process thereof, which is subsequent to FIG. 35.

Next, as shown in FIG. 36, using as a photoresist pattern (not shown) formed over the interlayer insulating film IL6 using a photolithographic technique as an etching mask, the interlayer insulating film IL6 and the multi-layer films LM3, LM2, and LM1 are dry-etched to be formed with the through holes (penetration holes) SH3. The through holes SH3 are formed so as to extend through the interlayer insulating film IL6 and the multi-layer films LM3, LM2, and LM1. The side surfaces of the through holes SH3 may also be tapered.

Figure 37:
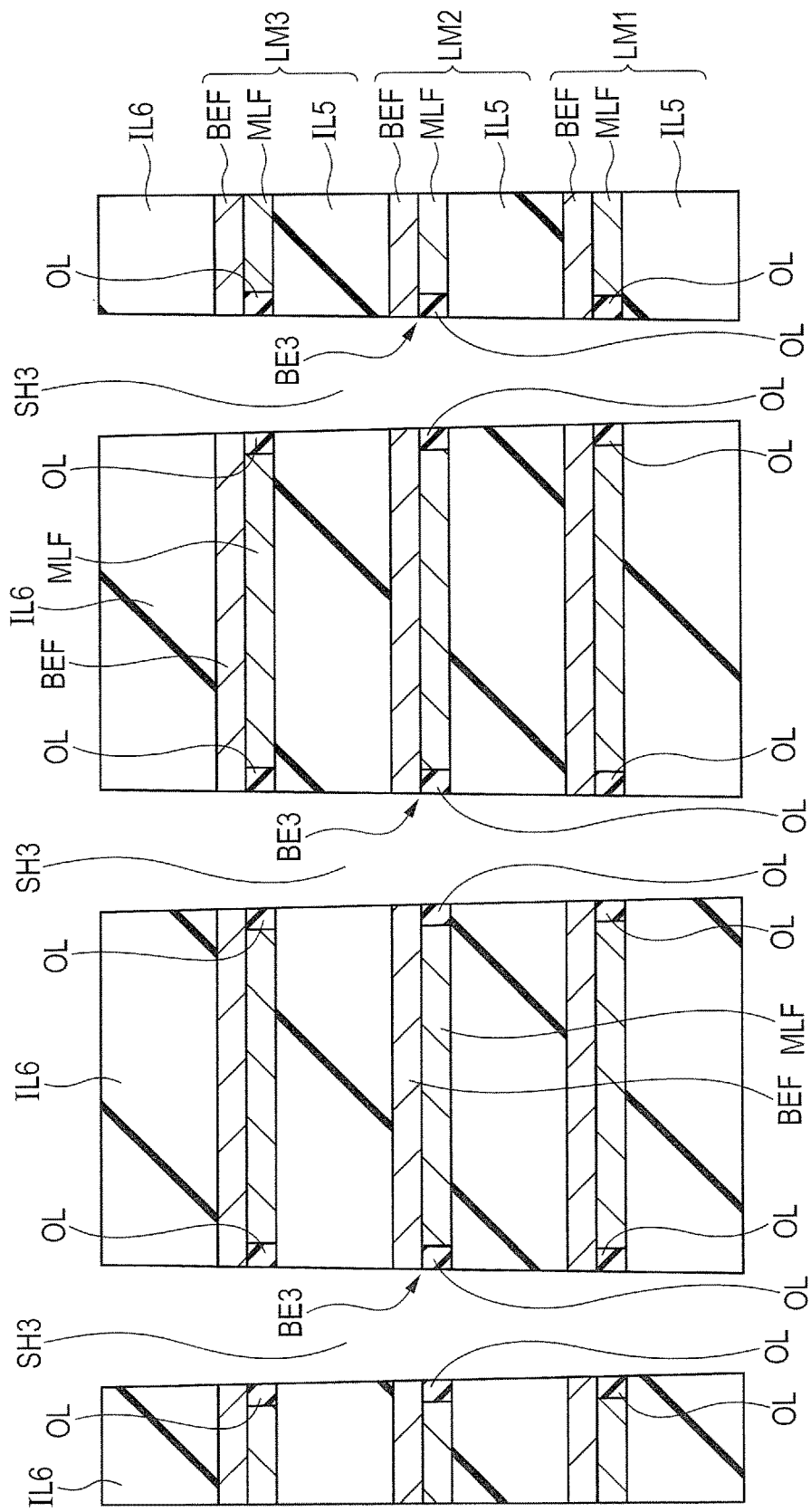
FIG. 37 is a main-portion cross-sectional view of the semiconductor device during the manufacturing process thereof, which is subsequent to FIG. 36.

Next, plasma treatment (oxygen plasma treatment) is performed in an oxygen atmosphere. During the plasma treatment, due to the oxygen affinity difference (difference in Gibbs free energy of oxidation) between the metal material film MLF and the electrode film BEF, the exposed surface of the metal material film MLF is oxidized, while the exposed surface of the electrode film BEF is scarcely oxidized. That is, the Gibbs free energy of oxidation is lower in the material forming the metal material film MLF than in the material forming the electrode film BEF, and the metal material film MLF has a higher oxygen affinity than the electrode film BEF. Accordingly, the metal material film MLF is more likely to be oxidized than the electrode film BEF. Consequently, the exposed surface of the metal material film MLF is oxidized, while the exposed surface of the electrode film BEF, which is less likely to be oxidized, is scarcely oxidized. As a result, when the plasma treatment is performed, as shown in FIG. 37, the side surfaces of the metal material film MLF of each of the multi-layer films LM1, LM2, and LM3 which are exposed at the side surfaces (inner walls) of the through holes SH3 are selectively oxidized to form the oxide layers OL. At each of the side surfaces of the multi-layer films LM1, LM2, and LM3 exposed from the through holes SH3, the corner portion (projecting portion) BE3 of the electrode film BEF adjacent to the oxide layer OL is formed. The corner portion BE3 of the electrode film BEF is formed by the lower surface and the side surface (side surface exposed from the through hole SH3) of the electrode film BEF.

Note that, at the process stage (corresponding to the process stage shown in FIG. 36) where the through holes SH3 are formed, the metal material film MLF of each of the multi-layer films LM1, LM2, and LM3 has the upper surface covered with the electrode film BEF, the lower surface covered with the interlayer insulating film IL5, and the side surfaces exposed at the side surfaces of the through holes SH3. Accordingly, when the plasma treatment is performed, as can also be seen from FIG. 37, the side surfaces (side surfaces exposed from the through holes SH3) of the metal material film MLF of each of the multi-layer films LM1, LM2, and LM3 are selectively oxidized to form the oxide layers OL, while the upper and lower surfaces of the metal material film MLF are not oxidized. The oxide layers OL are formed in the side surfaces of the metal material film MLF and adjacent to the metal material film MLF in a horizontal direction.

The oxide layers OL are formed through the oxidation of portions (regions in the vicinity of the side surfaces) of the metal material film MLF. Accordingly, the oxide layers OL are made of an oxide of the material forming the metal material film MLF. When the plasma treatment is performed, each of the multi-layer films LM1, LM2, and LM3 includes the interlayer insulating film IL5, the metal material film MLF over the interlayer insulating film IL5, the oxide layer OL adjacent to the metal material film MLF, and the electrode film BEF over each of the metal material film MLF and the oxide layer OL.

Figure 38:
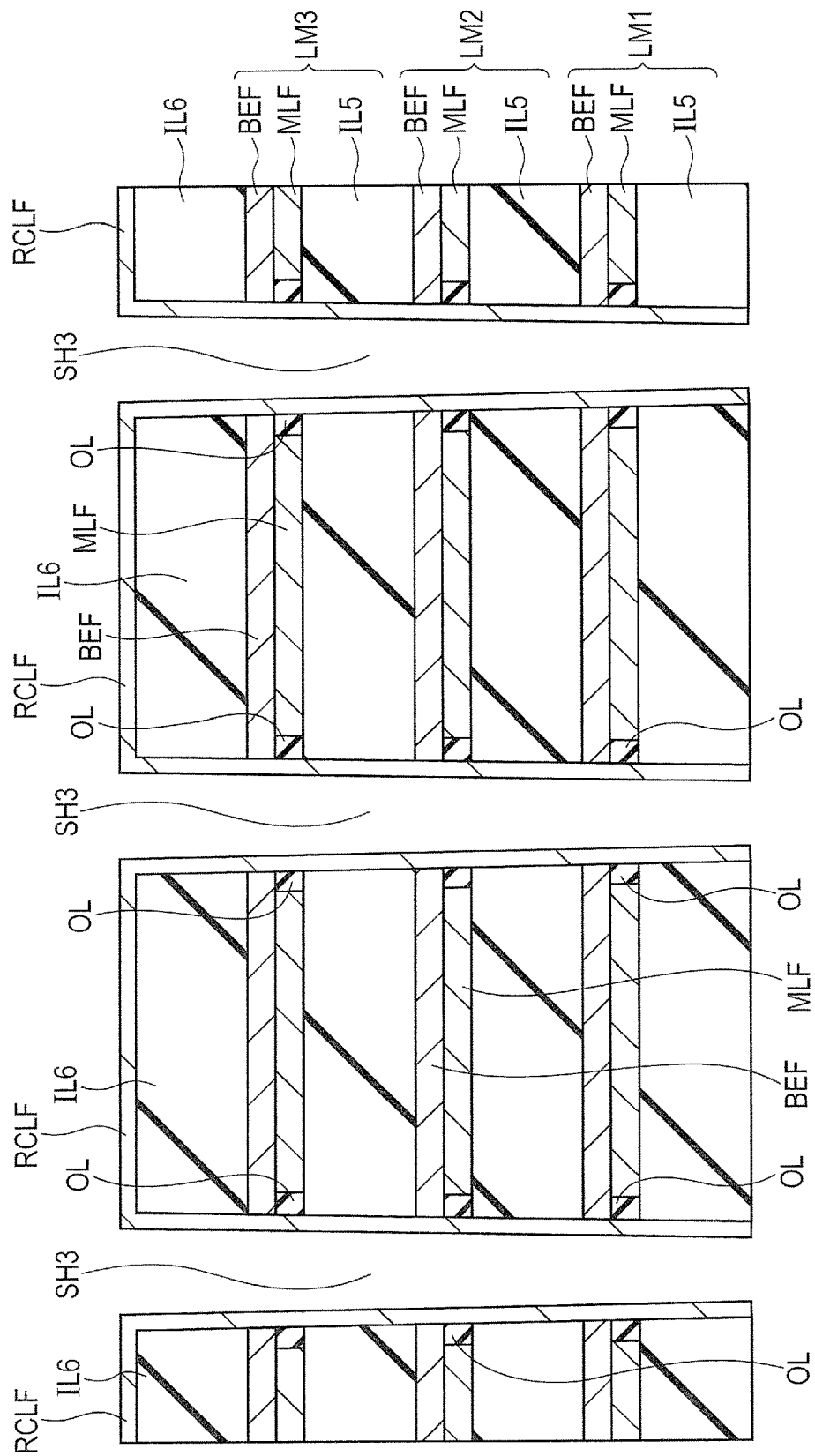
FIG. 38 is a main-portion cross-sectional view of the semiconductor device during the manufacturing process thereof, which is subsequent to FIG. 37.

Next, as shown in FIG. 38, over the interlayer insulating film IL6 including the side surfaces of the through holes SH3, the resistance change film RCLF is formed. Since each of the through holes SH3 has a high aspect ratio, for the deposition of the resistance change film RCLF, a CVD method or an ALD (Atomic Layer Deposition) method is preferably used. The resistance change film RCLF can also be formed by depositing a metal oxide (such as tantalum oxide) using a reactive sputtering method. It may also be possible that, after a metal film is formed by a sputtering method or an electroless plating method, the metal film is subjected to plasma oxidation to thus form the resistance change film RCLF made of an oxide of a metal.

Note that, in Embodiment 4, the respective materials of the metal material film MLF, the electrode film BEF, and the resistance change film RCLF are as described above in Embodiment 1 or 2 described above. Accordingly, a description thereof is omitted herein.

Figure 39:
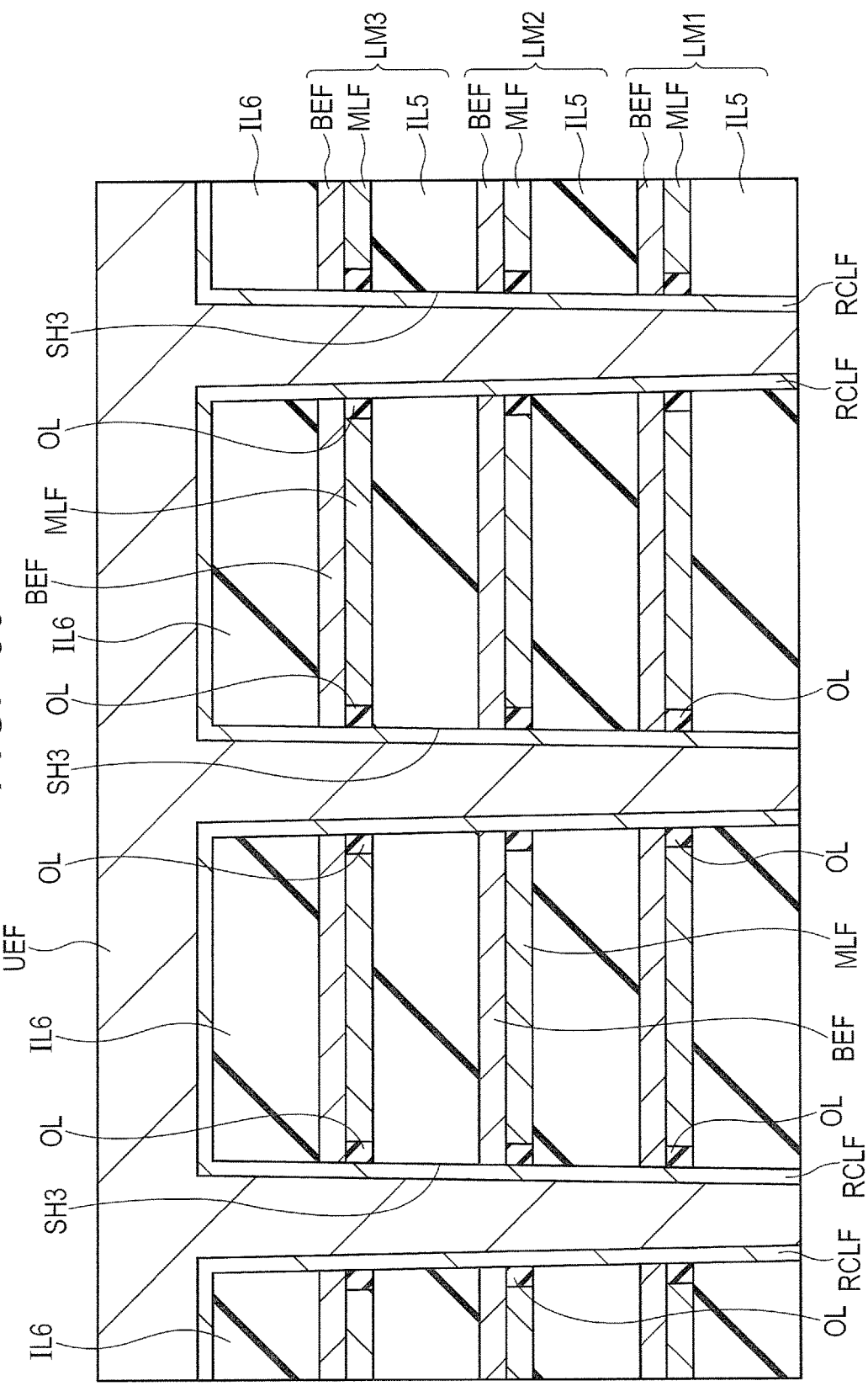
FIG. 39 is a main-portion cross-sectional view of the semiconductor device during the manufacturing process thereof, which is subsequent to FIG. 38.

Next, as shown in FIG. 39, over the resistance change film RCLF, the electrode film UEF is formed so as to be embedded in the through holes SH3. Note that a multi-layer film including an oxygen extraction layer, an oxidation prevention layer, and a main electrode layer is shown herein as the electrode film UEF.

For example, over a tantalum oxide film (resistance change film RCLF), a tantalum (Ta) film is deposited as the oxygen extraction layer by a sputtering method. The tantalum (Ta) film is formed so as to introduce oxygen defects into the tantalum oxide ($TaO_x$) film. Then, over the tantalum film (oxygen extraction layer), as the oxidation prevention layer, a tantalum nitride (TaN) film is formed by a sputtering method. Then, over the oxidation prevention layer (tantalum nitride film), as the main electrode layer, a tungsten (W) film is formed by a CVD method or the like. The tungsten film (main electrode layer) is embedded in the through holes SH3. Note that, when oxygen defects are introduced into the resistance change film RCLF during the formation of the resistance change film RCLF, it is also possible to omit the formation of the oxygen extraction layer and the oxidation prevention layer after the formation of the resistance change film RCLF and form the main electrode layer (tungsten film) over the resistance change film RCLF.

Figure 40:
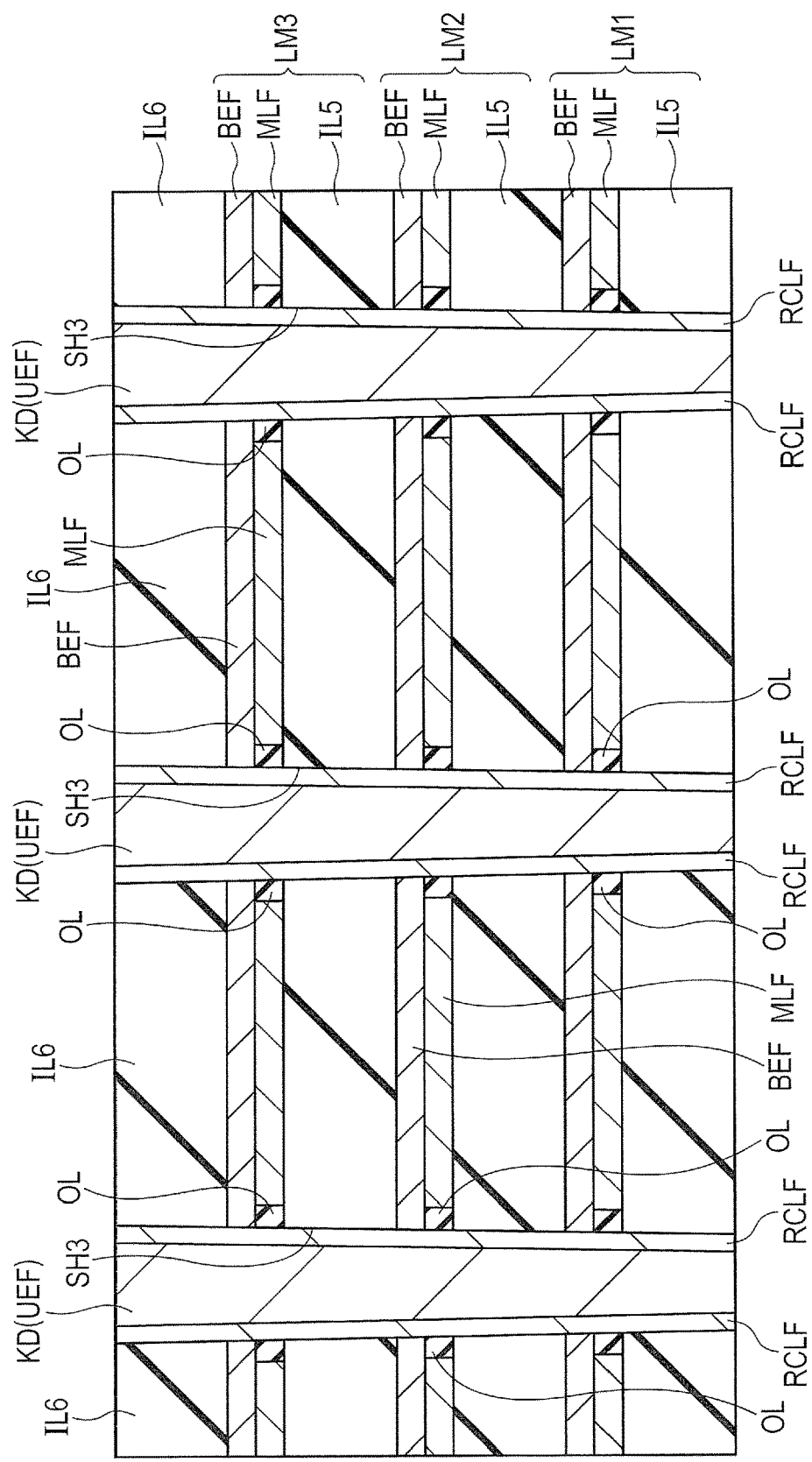
FIG. 40 is a main-portion cross-sectional view of the semiconductor device during the manufacturing process thereof, which is subsequent to FIG. 39.

Next, as shown in FIG. 40, the unneeded electrode film UEF and the unneeded resistance change film RCLF which are located outside the through holes SH3 are removed by a CMP method or the like. Thus, the through electrodes KD embedded in the through holes SH3 are formed. The through electrodes KD are made of the electrode film UEF remaining in the through holes SH3 and are embedded in the through holes SH3 via the resistance change film RCLF. Over the side surfaces (inner walls) of the through holes SH3, the resistance change film RCLF is formed. Accordingly, between the side surfaces of the through holes SH3 and the through electrodes KD, the resistance change film RCLF is interposed. The through electrodes KD extend in directions generally perpendicular to the main surface of the semiconductor substrate (i.e., directions generally perpendicular to the upper surface of the interlayer insulating film IL6).

Figure 41:
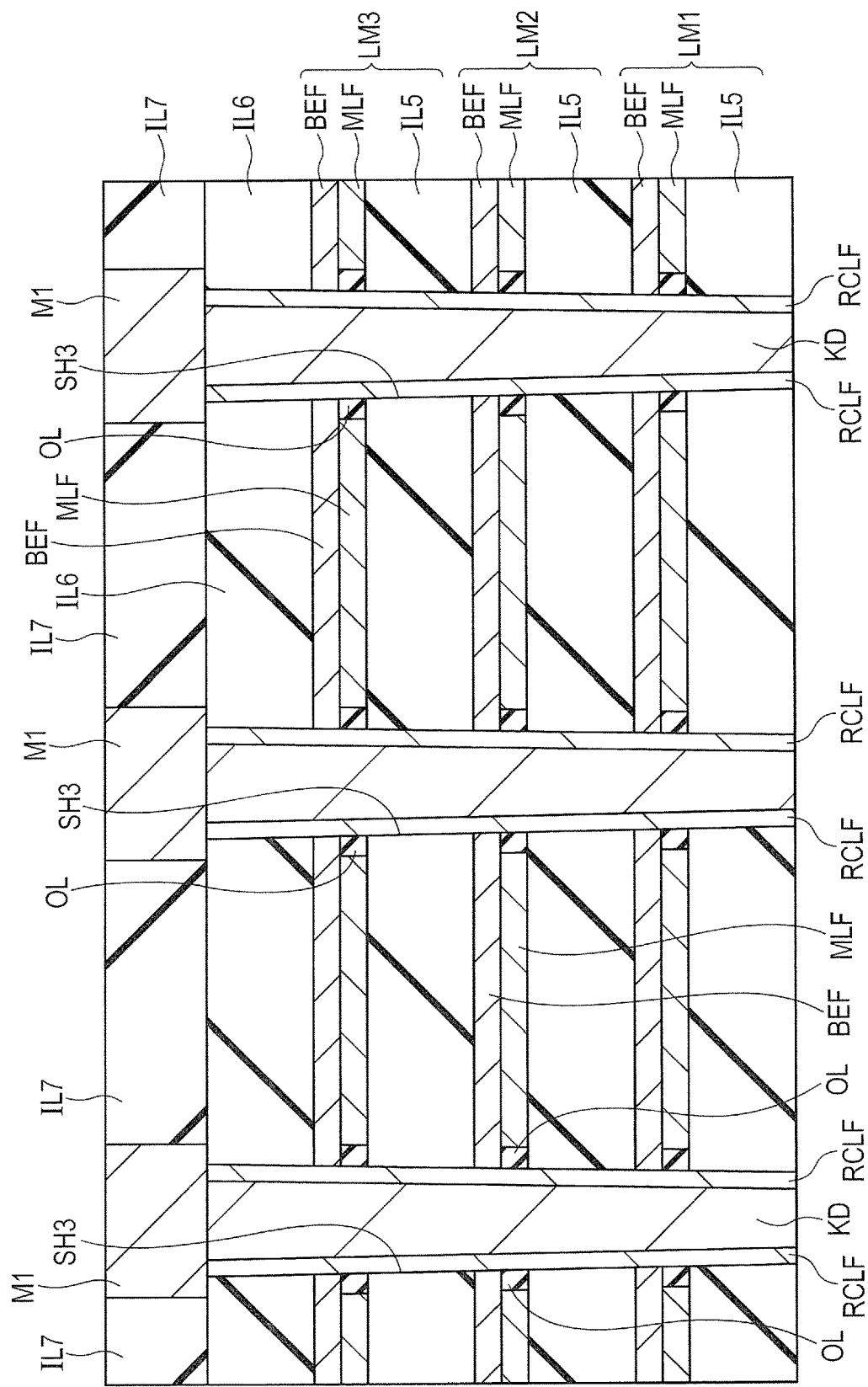
FIG. 41 is a main-portion cross-sectional view of the semiconductor device during the manufacturing process thereof, which is subsequent to FIG. 40.

Next, as shown in FIG. 41, over the interlayer insulating film IL6 in which the through electrodes KD are embedded, an insulating film IL7 is formed. After wire trenches are formed in the insulating film IL7, a conductive film is embedded in the wire trenches to be able to form the wires M1.

Then, using a dual damascene method or the like, wires in the second and subsequent layers are formed, but the illustration and description thereof is omitted herein. The wires M1 and the wires in the layers located thereabove are not limited to damascene wires and can also be formed by patterning conductive films for wires.

In the semiconductor device shown in FIGS. 34 and 41, in the multi-layer films each including the interlayer insulating film IL5, the metal material film MLF over the interlayer insulating film IL5, and the electrode film BEF over the metal material film MLF, the through holes SH3 are formed. Over the side surfaces of each of the through holes SH3, the resistance change film RCLF is formed. In each of the through holes SH3, the through electrode KD is embedded via the resistance change film RCLF. Consequently, the side surfaces of each of the electrode films BEF are exposed from the side surfaces of the through holes SH3 and in contact with the resistance change films MLF to be opposed to the through electrodes KD via the resistance change films RCLF. The upper surface of each of the electrode films BEF is covered with the interlayer insulating film, while the lower surface of each of the electrode films BEF is in contact with each of the metal material film MLF and the oxide layers OL. The lower surface of each of the metal material films MLF is in contact with the interlayer insulating film. Since the oxide layers OL are interposed between the metal material films MLF and the resistance change films RCLF, the metal material films MLF are not in contact with the resistance change films RCLF. The surfaces (side surfaces) of the electrode films BEF which are exposed from the through holes SH3 and the surfaces (side surfaces) of the oxide layers OL which are exposed from the through holes SH3 are in contact with the resistance change films RCLF to be opposed to the through electrodes KD via the resistance change films RCLF. Each of the oxide layers OL, which is not conductive and has an insulating property, does not function as the electrode of the resistance change element RCD. Each of the electrode films BEF functions as one of the electrodes of the resistance change element RCD, while each of the through electrodes KD functions as the other electrode of the resistance change element RCD. In the resistance change film RCLF, the foregoing conductive path FLM made of a chain of oxygen defects is formed between each of the corner portions (BE3) formed by the lower surfaces and the side surfaces (side surfaces exposed from the side surfaces of the through holes SH3) of the electrode films BEF and the through electrodes KD opposed to the corner portions (BE3) via the resistance change films RCLF.

The electrode UE shown in FIGS. 3, 4, 23, and 24 described above corresponds to each of the through electrodes KD shown in FIGS. 34 and 41. The electrode BE shown in FIGS. 3, 4, 23, and 24 described above corresponds to each of the electrode films BEF shown in FIGS. 34 and 41. The resistance change layer RCL shown in FIGS. 3, 4, 23, and 24 described above corresponds to each of the resistance change films RCLF shown in FIGS. 34 and 41. The oxide layer OL shown in FIGS. 3, 4, 23, and 24 described above also corresponds to each of the oxide layers OL shown in FIGS. 34 and 41.

The surface BE1 of the electrode BE shown in FIG. 3 and described above corresponds to each of the side surfaces (side surfaces exposed from the side surfaces of the through holes SH3) of the electrode films BEF shown in FIGS. 34 and 41. The surface BE2 of the electrode BE shown in FIGS. 3 and 23 described above corresponds to the lower surface of each of the electrode films BEF shown in FIGS. 34 and 41. The surface OL1 of the oxide layer OL shown in FIGS. 3 and 23 described above corresponds to each of the side surfaces (side surfaces exposed from the side surfaces of the through holes SH3) of the oxide layers OL shown in FIGS. 34 and 41. The surface ML2 of the metal material layer ML shown in FIGS. 3 and 23 described above corresponds to the upper surface of each of the metal material films MLF shown in FIGS. 34 and 41. The corner portion BE3 of the electrode BE shown in FIGS. 3 and 23 described above corresponds to each of the corner portions formed by the lower surfaces and the side surfaces (side surfaces exposed from the side surfaces of the through holes SH3) of the electrode films BEF shown in FIGS. 34 and 41.

The following is the summary of characteristic features common to the manufacturing process in Embodiment 1 described above (FIGS. 6 to 18 described above), the manufacturing process in Embodiment 3 described above (FIGS. 25 to 33), and the manufacturing process in Embodiment 4 (FIGS. 35 to 41). That is, each of the manufacturing processes of the semiconductor devices has Steps S1, S2, and S3 shown below.

Step S1 is the step of forming a multi-layer body including a metal material layer (ML or MLF) and a first electrode layer (BE or BEF) over the metal material layer.

Step S2 is the step of, after Step S1, oxidizing the side surfaces of the metal material layer (ML or MLF) included in the side surfaces of the multi-layer body formed in Step S1 to form an oxide layer (OL).

Step S3 is the step of forming, after Step S2, a second electrode layer (UE, UEF, or KD) opposed to each of the side surfaces of the multi-layer body via a resistance change layer (RCL or RCLF).

The multi-layer body formed herein in Step S1 corresponds to the foregoing electrode pattern DPT (FIG. 9) in the manufacturing process in Embodiment 1 described above, corresponds to the foregoing electrode pattern DPT2 (FIG. 26) in the manufacturing process in Embodiment 3 described above, and corresponds to each of the multi-layer bodies including the metal material films MLF and the electrode films BEF over the metal material films MLF in the manufacturing process in Embodiment 4. The metal material layer included in the multi-layer body formed in Step S1 corresponds to the foregoing metal material layer ML or metal material film MLF. The first electrode layer included in the multi-layer body formed in Step S1 corresponds to the foregoing electrode BE or electrode film BEF. Step S2 corresponds to the process step shown in FIG. 10 described above in the manufacturing process in Embodiment 1 described above, corresponds to the process step shown in FIG. 27 described above in the manufacturing process in Embodiment 3 described above, and corresponds to the process step shown in FIG. 37 described above in the manufacturing process in Embodiment 4 described above. The oxide layer formed in Step S2 corresponds to the foregoing oxide layer OL. The resistance change layer formed in Step S3 corresponds to the foregoing resistance change layer RCL or the resistance change film RCLF. The second electrode layer formed in Step S3 corresponds to the foregoing electrode UE, the electrode film UEF, or the through electrode KD.

Since each of the manufacturing processes of the semiconductor devices includes Steps S1, S2, and S3 described above, the oxide layer OL can be provided by self-alignment with the resistance change element RCD. In addition, by using materials as described above in Embodiment 1 or 2, the oxide layer OL is allowed to have the function of taking in oxygen ions from the resistance change layer (RCL or RCLF) or the function of supplying oxygen ions to the resistance change layer (RCL or RCLF) in accordance with the characteristics of the first electrode layer (BE or BEF). Thus, for the reason described above in Embodiment 1 or 2, it is possible to improve the reliability of the semiconductor device having the resistance change element RCD.

Embodiment 5

In Embodiment 5, a description will be given of an example of an application of a nonvolatile memory including the resistance change element RCD described above in each of Embodiments 1 to 4. Using FIG. 42, a description will be given herein of a micro controller unit (MCU) using a nonvolatile memory including the resistance change element RCD described above in each of Embodiments 1 to 4.

Figure 42:
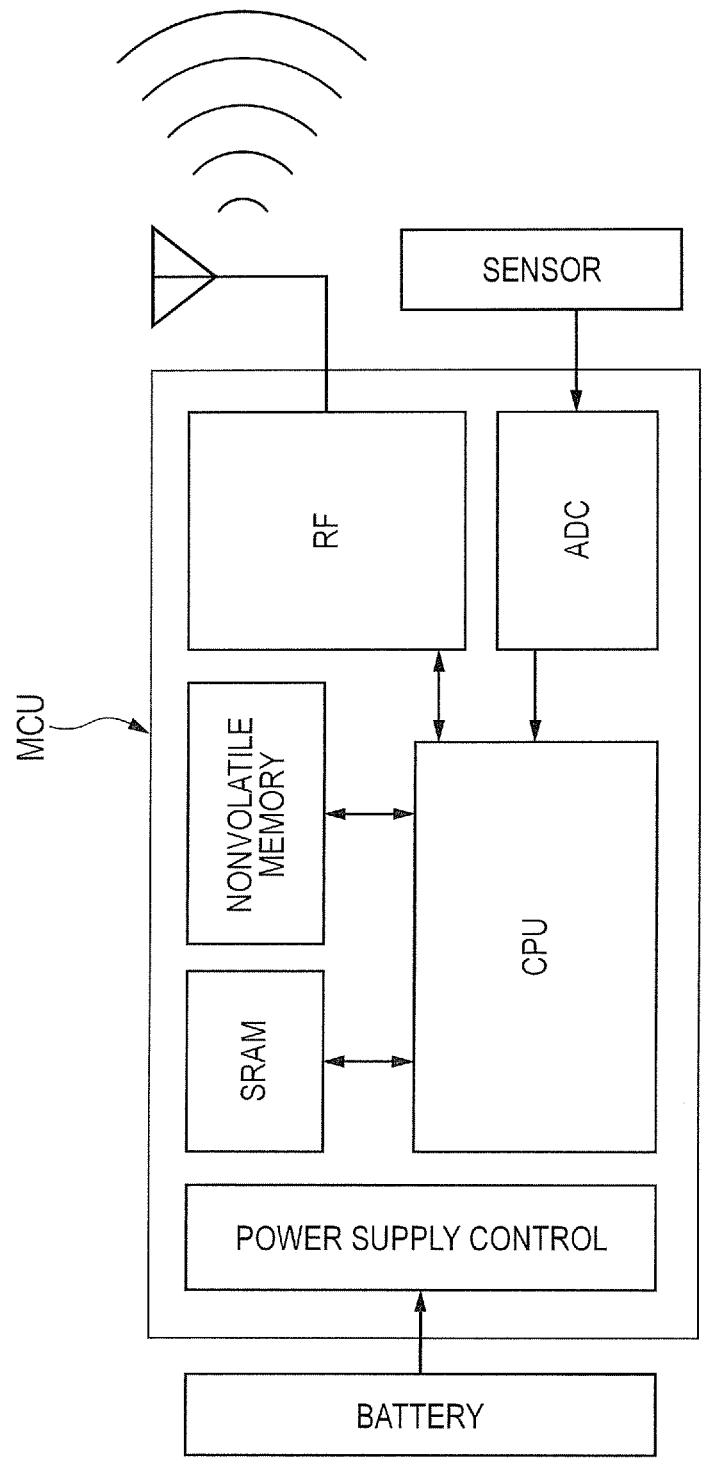
FIG. 42 is a block diagram of a wireless terminal included in a sensor network.

FIG. 42 is a block diagram of a wireless terminal included in a sensor network. In FIG. 42, a SRAM (Static Random Access Memory) is a nonvolatile semiconductor memory, CPU (Central Processing Unit) is a central arithmetic operation device, RF (Radio Frequency) is a wireless transmission/reception circuit, and ADC (Analog to Digital Converter) is an analog/digital converter.

With the advancement of an IoT (Internet of Things) in which devices are connected to each other via the Internet, a highly developed sensor network technique has been required. A wireless terminal included in the sensor network includes a sensor, a wireless wave, a MCU, and a power supply such as a battery. As objects to be sensed increase, an amount of processed data rapidly increases so that a high-speed data processing ability is required. On the other hand, requests for reductions in the size and weight of a wireless terminal lead to the need for button battery-powered driving so that there is a strong demand for lower power consumption. To the nonvolatile memory used in the MCU included in such a wireless terminal, a resistance random access memory using the resistance change element RCD described above in each of Embodiments 1 to 4 can be applied.

By using the MCU with the embedded resistance random access memory as a data memory for data logging in the sensor network, compared to the case where a MCU with an embedded Flash memory is used, lower-power rewriting and higher-speed reading are possible. This allows an improvement in data sampling rate and the long-time use of the MCU.

In the MCU with the embedded Flash memory, a bit-by-bit random access cannot be made. Accordingly, when data is rewritten, the procedure of simultaneously erasing the data on a block-by-block basis and then performing writing is necessary so that the rewriting requires time and care. However, in the MCU with the embedded resistance random access memory, a bit-by-bit random access can be made so that bit-by-bit rewriting is possible. For example, when a program code is rewritten by wireless communication (Over the Air), by using a resistance change element to which low-power rewriting can be performed through a random access procedure, it is possible to satisfy a rewriting demand that frequently arises.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

The following is provided as additional description of parts of the content of the description of the foregoing embodiments.

(Note 1)

A method of manufacturing a semiconductor device including a resistance change element, includes the steps of:

(a) forming a first insulating film over a semiconductor substrate;

(b) forming, over the first insulating film, a multi-layer body including a metal material layer and a first electrode layer over the metal material layer;

(c) oxidizing a side surface of the metal material layer which is included in a side surface of the multi-layer body to form an oxide layer; and (d) after the step (c), forming a second electrode layer opposed to the side surface of the multi-layer body via a resistance change layer.

In the method, the first electrode layer functions as one of electrodes of the resistance change element, while the second electrode layer functions as the other electrode of the resistance change element, between the second and first electrode layers and between the second electrode layer and the oxide layer, the resistance change layer is interposed, the resistance change layer is made of a metal oxide, the metal material layer is made of a metal or a metal compound, the oxide layer is made of an oxide of the material forming the metal material layer, the first electrode layer is made of titanium nitride, tantalum nitride, tungsten, or a compound thereof, and a free energy of oxide formation of the oxide forming the oxide layer is lower than a free energy of oxide formation of the oxide forming the resistance change layer.

(Note 2)

In the method of manufacturing the semiconductor device according to Note 1, in the step (c), the first electrode layer is not oxidized.

(Note 3)

In the method of manufacturing the semiconductor device according to Note 2, in the step (c), oxygen plasma treatment is used.

(Note 4)

In the method of manufacturing the semiconductor device according to Note 1, the resistance change layer is made of tantalum oxide or hafnium oxide.

(Note 5)

In the method of manufacturing the semiconductor device according to Note 4, the metal material layer is made of titanium, aluminum, or an alloy of titanium and aluminum.

(Note 6)

In the method of manufacturing the semiconductor device according to Note 1, the first electrode layer is made of titanium nitride, the resistance change layer is made of tantalum oxide, the metal material layer is made of titanium, and the oxide layer is made of titanium oxide.

What is claimed is:

1. A semiconductor device, comprising:
a resistance change element,
wherein the resistance change element includes:
first and second electrodes spaced apart from each other;
a metal material layer adjacent to the first electrode;
an oxide layer adjacent to each of the metal material layer and the first electrode; and
a resistance change layer disposed continuously between the second and first electrodes and between the second electrode and the oxide layer,
wherein the resistance change layer is made of a metal oxide,
wherein the metal material layer is made of a metal or a metal compound,
wherein the oxide layer is made of an oxide of the material forming the metal material layer,
wherein the first electrode is made of ruthenium, ruthenium oxide, iridium, iridium oxide, platinum, gold, or copper, and
wherein a free energy of oxide formation of the oxide forming the oxide layer is higher than a free energy of oxide formation of the oxide forming the resistance change layer.

2. The semiconductor device according to claim 1,
wherein the resistance change layer is made of tantalum oxide, hafnium oxide, or aluminum oxide.

3. The semiconductor device according to claim 2,
wherein the metal material layer is made of tantalum nitride, titanium nitride, tungsten, or a compound thereof.

4. The semiconductor device according to claim 1,
wherein the first electrode is made of ruthenium, the resistance change layer is made of tantalum oxide, the metal material layer is made of tantalum nitride, and the oxide layer is made of tantalum oxynitride.

5. The semiconductor device according to claim 1,
wherein the first electrode has a first surface in contact with the resistance change layer, a second surface in contact with each of the metal material layer and the oxide layer, and a first corner portion formed by the first and second surfaces, and
wherein, in the resistance change layer, between the first corner portion of the first electrode and the second electrode, a conductive path is formed.

6. The semiconductor device according to claim 5,
wherein an angle formed between the first and second surfaces is less than 90°.

7. The semiconductor device according to claim 5,
wherein the oxide layer has a third surface in contact with the resistance change layer, and
wherein an amount of misalignment between the first surface of the first electrode and the third surface of the oxide layer is not more than 20% of a thickness of the resistance change layer between the first corner portion of the first electrode and the second electrode.

* * * * *